(12) United States Patent
Tsukamoto et al.

(10) Patent No.: US 8,089,796 B2
(45) Date of Patent: Jan. 3, 2012

(54) INFORMATION RECORDING AND REPRODUCING DEVICE

(75) Inventors: Takayuki Tsukamoto, Kanagawa-ken (JP); Takeshi Yamaguchi, Kanagawa-ken (JP); Chikayoshi Kamata, Kanagawa-ken (JP); Tsukasa Nakai, Tokyo (JP); Takahiro Hirai, Kanagawa-ken (JP); Shinya Aoki, Kanagawa-ken (JP); Kohichi Kubo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/886,040

(22) Filed: Sep. 20, 2010

(65) Prior Publication Data

US 2011/0026294 A1 Feb. 3, 2011

Related U.S. Application Data

(63) Continuation of application No. PCT/JP2008/056494, filed on Apr. 1, 2008.

(51) Int. Cl.
*G11C 5/06* (2006.01)
(52) U.S. Cl. .......................................... 365/63; 365/171
(58) Field of Classification Search .................... 365/63, 365/171
See application file for complete search history.

(56) References Cited

U.S. PATENT DOCUMENTS

| | | | |
|---|---|---|---|
| 6,777,705 B2 | 8/2004 | Reinberg et al. | |
| 7,733,684 B2 | 6/2010 | Kubo et al. | |
| 2003/0123198 A1* | 7/2003 | Sugawara et al. | 360/314 |
| 2004/0058117 A1* | 3/2004 | Nishihara et al. | 428/64.2 |
| 2006/0113520 A1 | 6/2006 | Yamamoto et al. | |
| 2006/0163553 A1 | 7/2006 | Liang | |
| 2007/0052001 A1 | 3/2007 | Ahn et al. | |
| 2007/0063180 A1 | 3/2007 | Asano et al. | |
| 2007/0133358 A1 | 6/2007 | Kubo et al. | |
| 2010/0008209 A1 | 1/2010 | Tsukamoto et al. | |
| 2010/0202187 A1 | 8/2010 | Kubo et al. | |

FOREIGN PATENT DOCUMENTS

| | | |
|---|---|---|
| JP | 2006-156886 | 6/2006 |
| JP | 2006-190941 | 7/2006 |
| JP | 2007-53367 | 3/2007 |
| JP | 2007-73779 | 3/2007 |
| JP | 2007-273618 | 10/2007 |
| JP | 2007-287761 | 11/2007 |

* cited by examiner

*Primary Examiner* — Michael Tran
(74) *Attorney, Agent, or Firm* — Oblon, Spivak, McClelland, Maier & Neustadt, L.L.P.

(57) ABSTRACT

According to one embodiment, an information recording and reproducing device includes a first layer, a second layer and a recording layer. The recording layer is provided between the first and second layers and is capable of reversibly transitioning between a first state and a second state with a resistance higher than in the first state. One of the first and second layers includes a resistivity distribution layer perpendicular to a stacking direction of the first and second layers, and the recording layer. The resistivity distribution layer includes a low and a high resistivity portion. Resistivity of the high resistivity portion is higher than resistivity of the low resistivity portion. The low resistivity portion contains a transition element identical to a transition element contained in the high resistivity portion.

20 Claims, 37 Drawing Sheets

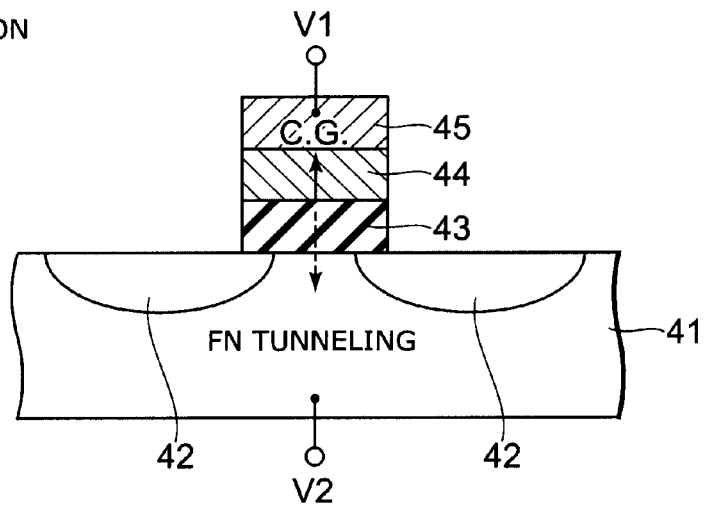
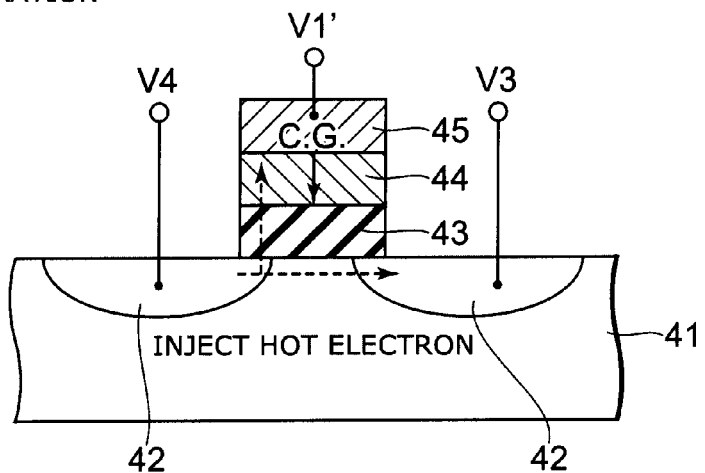
FIG. 36

INFORMATION RECORDING AND REPRODUCING DEVICE

CROSS-REFERENCE TO RELATED APPLICATIONS

This is a continuation application of International Application PCT/JP2008/056494, filed on Apr. 1, 2008. The entire contents of which are incorporated herein by reference.

FIELD

Embodiments described herein relate generally to an information recording and reproducing device.

BACKGROUND

In recent years, a small-sized portable device has become widespread globally, and at the same time, along with significant development of a high-speed information transmission network, demand for a small-sized large capacity non-volatile memory is increasing rapidly. Especially, a NAND type flash memory, and a small-sized HDD (hard disk drive) have experienced rapid evolution of recording density, and have developed a large market.

Under these circumstances, some concepts for new memory have been proposed to exceed the current limit of recording density significantly. For example, PRAM (phase change memory) uses a material capable of having two states of an amorphous state (OFF) and a crystalline state (ON) as a recording material, adopts an operational process in which data is recorded by associating these two states with binary data "0" and "1

For writing/erasing, an amorphous state is formed by applying high power pulses to the recording material and a crystalline state is formed by applying low power pulses to the recording material, for example.

Reading is performed by passing, through the recording material, a read current that is small enough not to cause the writing/erasing, and thereby measuring the electric resistance of the recording material. The resistance value of the recording material in an amorphous state is greater than the resistance value of the recording material in a crystalline state, and their ratio is, for example, approximately 103.

In these storage devices, an electrode layer (barrier layer) is provided in some cases in order to establish electrical connection to a recording layer, or to prevent diffusion of an element between the recording layer and interconnection or rectifying element. In this case, the electrode layer is usually provided at both ends of the recording layer in the direction of applied electric field. For example, the electrode layers are provided between the recording layer and the interconnection, and between the recording layer and the rectifying element, respectively. As a material of the electrode layers, for example, metal nitride is used, and these electrode layers are composed of the same material in general (for example, refer to JP-A 2007-287761 (Kokai)).

BRIEF DESCRIPTION OF THE DRAWINGS

FIG. 1 is a schematic cross-sectional view showing an example (a first specific example) of an information recording and reproducing device according to an;

FIG. 36 is a schematic cross-sectional view showing a memory cell of the flash memory;

DETAILED DESCRIPTION

Figure 1:
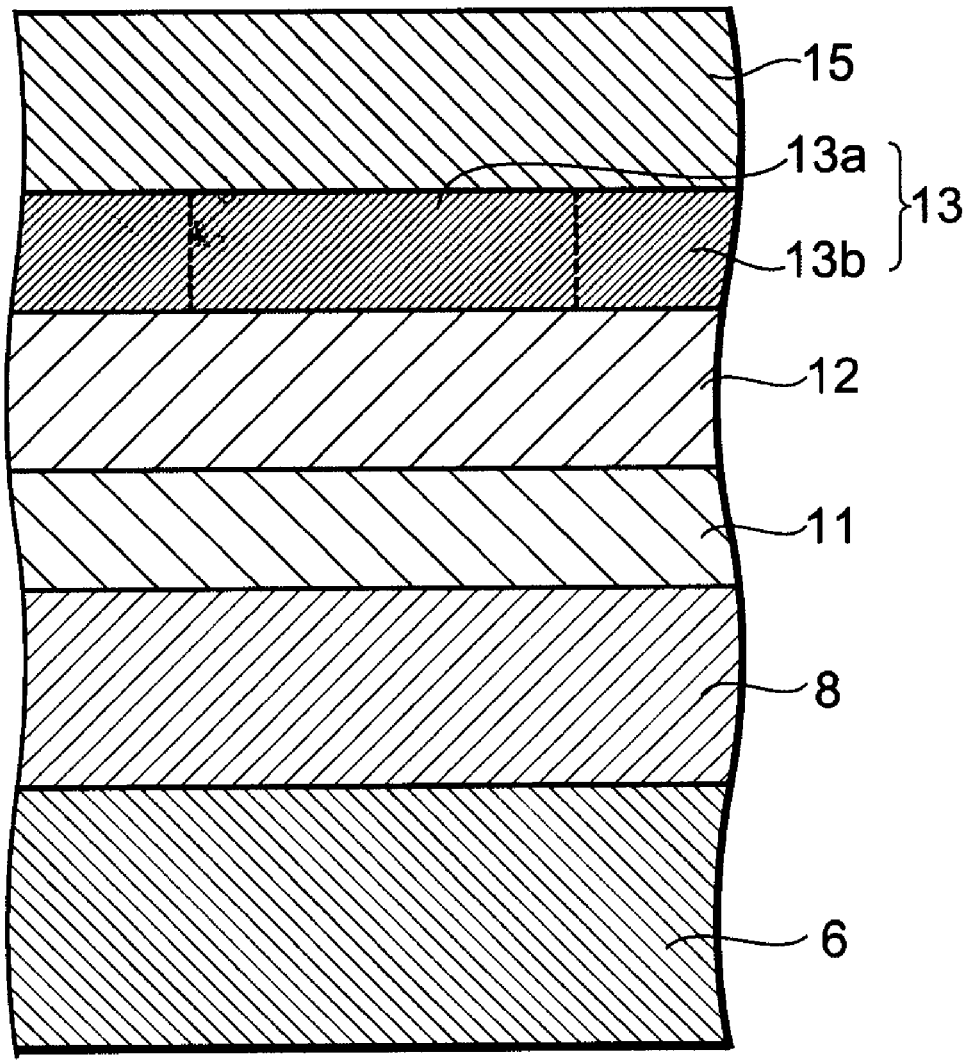

In general, according to one embodiment, an information recording and reproducing device includes a first layer, a second layer and a recording layer. The recording layer is provided between the first layer and the second layer. The recording layer is capable of reversibly transitioning between a first state and a second state with a resistance higher than a resistance in the first state by a current supplied to the first recording layer via the first layer and the second layer. One of the first layer and the second layer includes a resistivity distribution layer provided within a perpendicular plane perpendicular to a stacking direction of the first layer, the second layer, and the recording layer. The resistivity distribution layer includes a low resistivity portion and a high resistivity portion. A resistivity of the high resistivity portion is higher than a resistivity of the low resistivity portion. The low resistivity portion contains a transition element identical to a transition element contained in the high resistivity portion In the following, embodiments are described with reference to the drawings. In each drawing, similar components are labeled with the same reference numerals, and their detailed description is omitted.

FIG. 1 is a schematic cross-sectional view showing an example (a first specific example) of an information recording and reproducing device according to an embodiment.

The information recording and reproducing device of this specific example includes a first interconnection 6, a rectifying element 8 provided on the first interconnection 6, an electrode layer (a first layer) 11 provided on the rectifying element 8, a recording layer 12 provided on the main surface of the electrode layer 11, an electrode layer (a second layer) 13 provided on the main surface of the recording layer 12, and a second interconnection 15 provided on the electrode layer 13. Here, "main surface" means a face of each of the electrode layer 11, the recording layer 12, and electrode layer 13, which is perpendicular to the stacking direction (vertical direction in FIG. 1). The electrode layers 11 and 13 are provided to establish an electrical connection to the recording layer 12. The electrode layers 11 and 13 may, for example, also have a function as a barrier layer to suppress diffusion of an element between the recording layer 12 and its upper or lower component. In addition, a barrier layer may also be provided between the rectifying element 8 and the first interconnection 6. The recording layer 12 is a layer for recording information, the layer being capable of undergoing a reversible transition between a first state of low resistance and a second state of high resistance driven by, for example, current supplied via the electrode layer 11 and the electrode layer 13.

Now, according to the embodiment, either one of the electrode layers provided above and below the recording layer 12 has portions having different resistivities on its main surface. That is, either one of the electrode layers is a "resistivity distribution layer" that has a low resistivity portion with a relatively low resistivity, and a high resistivity portion with a relatively high resistivity within the main surface. Also, the low resistivity portion and high resistivity portion contain at least one type of the same transition element. The low resistivity portion contains the same transition element as the transition element contained in the high resistivity portion. The high resistivity portion contains the same transition element as the transition element contained in the low resistivity portion. That is, the low resistivity portion contains the same transition element as at least one of multiple transition elements contained in the high resistivity portion. The high resistivity portion contains the same transition element as at least one of multiple transition elements contained in the low resistivity portion. In the first specific example, the electrode layer 13 has portions that have different resistivities, i.e., a low resistivity portion 13a with a relatively low resistivity at an inner area within the main surface, and a high resistivity portion 13b with a relatively high resistivity at an outer area therewithin.

Material used for the low resistivity portion 13a in the electrode layer 13 includes, for example, TiN and HfN. Also, material used for the high resistivity portion 13b includes, for example, oxides of these, i.e., an oxynitride of Ti, and an oxynitride of Hf.

As described above, the low resistivity portion 13a and the high resistivity portion 13b contain at least one type of the same transition element. The ratio of the number of the transition elements in the low resistivity portion 13a and the high resistivity portion 13b to the total number of elements therein is preferably is 30% or more. For example, for $TiO_2$, $HfO_2$, and the like, the ratio of the number of the transition elements to the total number of elements is 33%, and for TiN, HfN, and the like, the ratio is 50%.

Material used for the electrode layer 11 includes, for example, nitrides of Ta, Al, Ti, Zr, Hf or V; carbides of Ta, Al, Ti, Zr, Hf or V; oxides of Ir or Ru; Ru; Au; Pd; and Pt. Among these, TaN, TaC, TiAlN, and TaAlN are preferable, and TaN and TaC are more preferable.

In order to efficiently heat the recording layer 12 at the time of erasing operation, a heater layer (not shown) made of a material, for example, having a resistivity approximately $10^{-5}$ Ωcm or more may be provided on the electrode layer 11 side of the recording layer 12 or the electrode layer 13 side of the recording layer 12.

For the rectifying element 8, any diode selected from, for example, a Zener diode, a pn junction diode, and a Schottky diode may be used. Alternatively, a non-ohmic element such as an MIM (Metal-Insulator-Metal) element may be used.

In the case where the information recording and reproducing device has a configuration of the crosspoint type cell array that is described later, the first interconnection 6 may be called a "word line" and the second interconnection 15 may be called a "bit line", or the other way around.

The film thickness of the electrode layer 13 and the electrode layer 11 is arbitrarily selectable, and may be, for example, 10 nm or less. Also, their cell width (the width in the main surface direction) is arbitrarily selectable, and may be, for example, 40 nm or less.

Next, the structure and characteristics of the electrode layer 13 are described with reference to FIG. 2.

Figure 2:
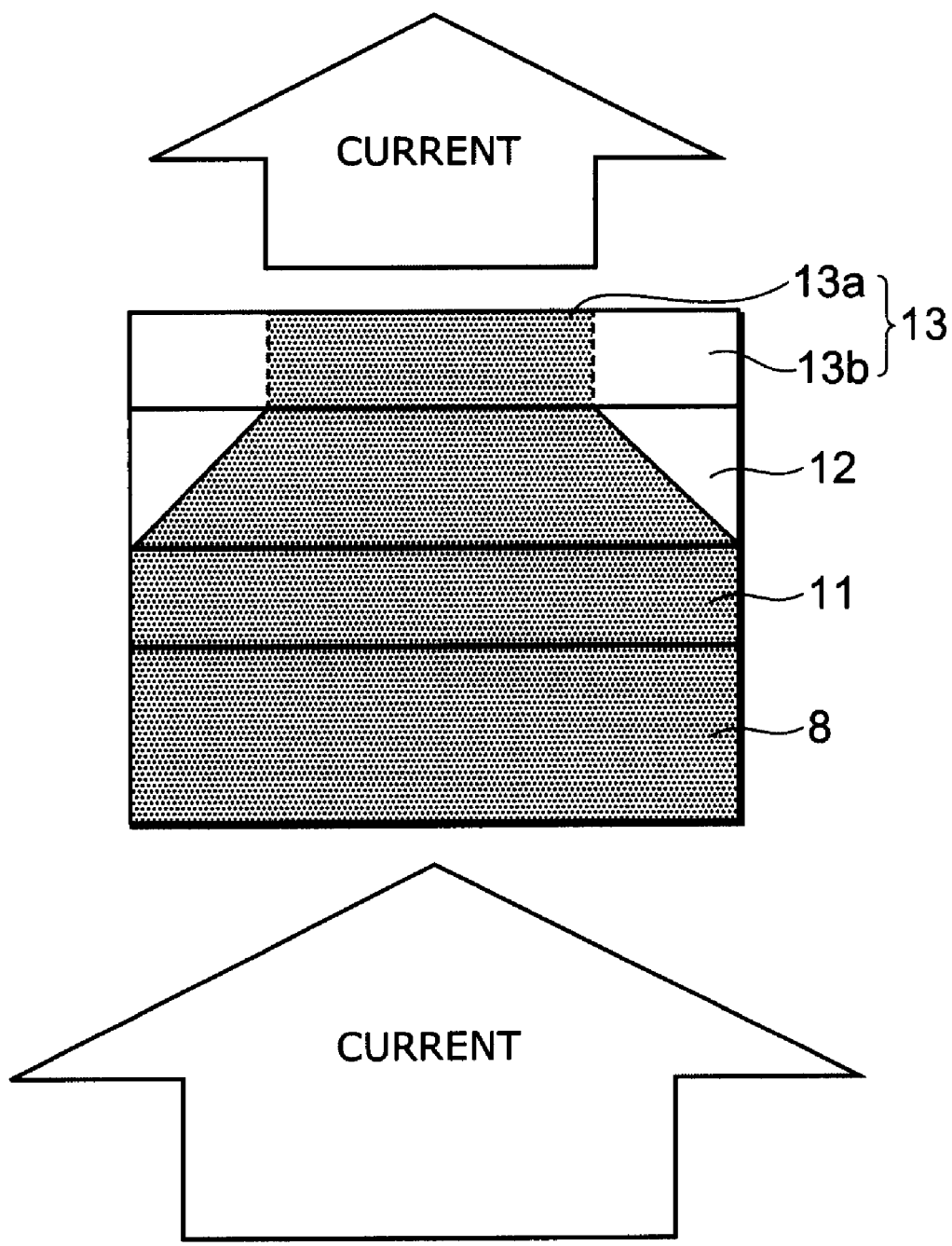
FIG. 2 is a schematic cross-sectional view of a recording device showing the characteristics of the first specific example.

FIG. 2 is a schematic cross-sectional view of a recording device showing the characteristics of the first specific example.

As described above, in this specific example, the electrode layer 13 has a low resistivity portion 13a with a relatively low resistivity at an inner area within the main surface, and a high resistivity portion 13b with a relatively high resistivity at an outer area therewithin.

On the other hand, the electrode layer 11 has a uniform resistivity within its main surface on the rectifying element 8 side, and the resistivity value is relatively low.

Such configuration of the electrode layer 13 and electrode layer 11 may be obtained, for example, by using an electrical conductor (for example, TiN, HfN, and the like) for the material of the electrode layer 13, the electrical conductor being relatively easily oxidized, and having a characteristics of increasing its resistivity when oxidized, using an electrical conductor relatively resistant to oxidizing (for example, TaN, TaC, TiAlN, TaAlN, and the like) for the material of the electrode layer 11, and by applying an oxidation treatment to the entire lateral surface of the device. Alternatively, for the material of both the electrode layers 11 and 13, an electrical conductor relatively easily oxidized, and having characteristics of increasing its resistivity when oxidized (for example, TiN, HfN, and the like) may be used, and an oxidation treatment may be applied to only the lateral surface of the electrode layer 13.

Alternatively, the above-mentioned configuration may be obtained by using material of the same composition for the electrode layer 13 and the electrode layer 11 to relatively increase crystallinity of the inner area of the main surface of the electrode layer 13, and relatively decrease crystallinity of the outer area thereof, as well as to relatively increase crystallinity in the main surface of the electrode layer 11 uniformly, and by applying an oxidation treatment to the entire lateral surface of the device. In addition, the process of differentiating crystallinity in this manner itself can increase the resistivity of only the outer area of the main surface of the electrode layer 13, whereby the above-mentioned configuration may be obtained.

By achieving the above-mentioned configuration, i.e., the configuration in which the electrode layer 13 has a low resistivity portion 13a at the inner area within the main surface, and a high resistivity portion 13b at the outer area therewithin, and the electrode layer 11 has a uniform resistivity within the main surface, the characteristics described below are obtained.

As shown in FIG. 2, since the high resistivity portion 13b in the electrode layer 13 has a relatively high resistivity, electric current does not flow easily in this portion. Accordingly, the electric current within the recording device is reduced, and the power consumption at the time of its operation and standby (at the time of non-operation) is reduced. Thus, the cell size is substantially decreased.

On the other hand, the recording layer 12 is in contact with the electrode layer 11, which has a uniform low resistivity within its main surface on the rectifying element 8 side. Thus, appropriate electric current can be secured for the lower portion of the recording layer 12 and the rectifying element 8. The forward resistance of the rectifying element may not necessarily be low; however, even in such case, increase of the driving voltage due to restricted current path flowing through the rectifying element 8 can be suppressed.

In this manner, according to the information recording and reproducing device of the embodiment, reduction of the power consumption is achieved by having portions with different resistivities in the main surface of either one of the electrode layer 11 and the electrode layer 13. In addition, when a configuration is made in which the electrode layer 13 in the opposite side from the rectifying element 8 has portions that have different resistivities in its main surface, and the electrode layer 11 in the same side of the rectifying element 8 has a uniform low resistivity in its main surface, increase of the driving voltage due to restricted current path flowing through the rectifying element 8 can be suppressed.

In the first specific example, the low resistivity portion 13a is provided at an inner area within the main surface of the electrode layer 13, and the high resistivity portion 13b is provided at an outer area within the main surface thereof; however, conversely, even if the high resistivity portion 13b is provided at the inner area and the low resistivity portion 13a is provided at the outer area, the power consumption can be reduced.

Next, other configurations of the embodiment are described with reference to FIG. 3.

Figure 3:
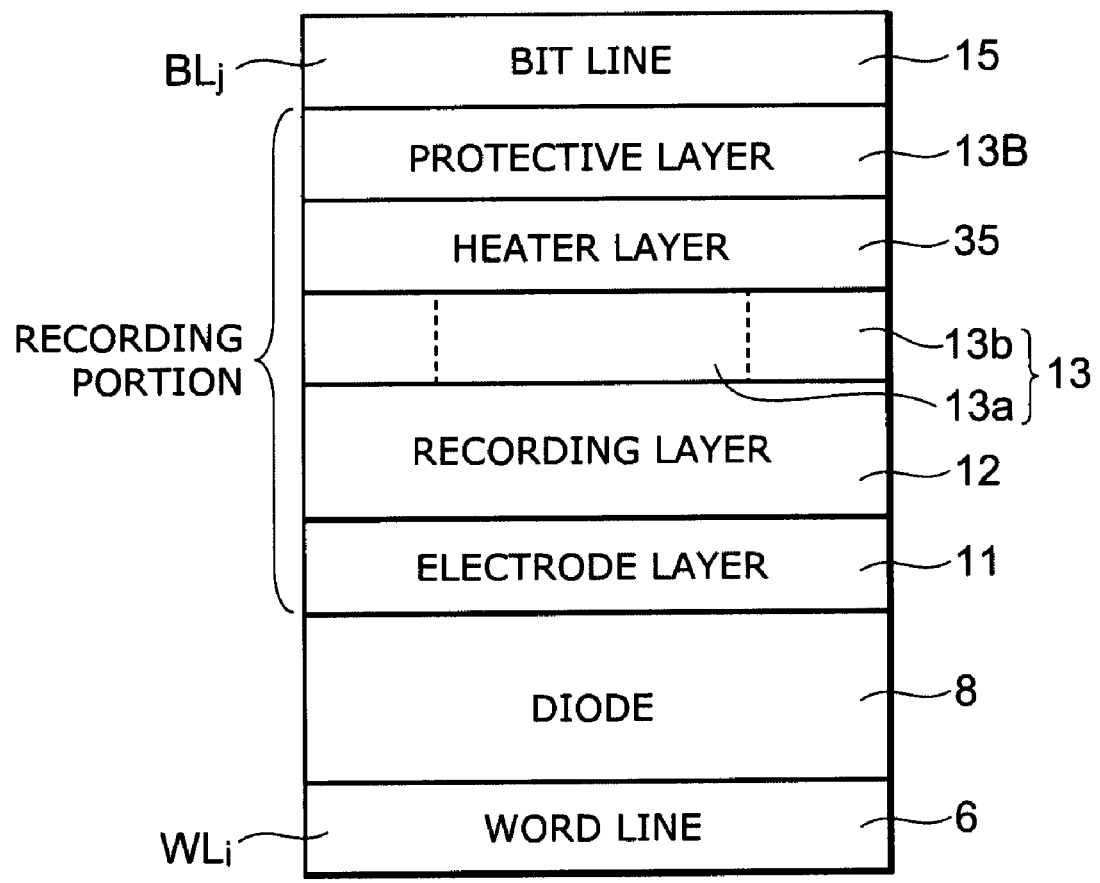
FIG. 3 is a schematic cross-sectional view showing an example of the information recording and reproducing device according to the embodiment.

FIG. 3 is a schematic cross-sectional view showing an example of the information recording and reproducing device according to the embodiment, and shows a configuration of the first specific example. In addition to the components shown in FIG. 1, a heater layer 35 and a protective layer 13B are provided between the electrode layer 13 and the bit line (the second interconnection). The electrode layer 13 has the low resistivity portion 13a at an inner area within the main surface, and the high resistivity portion 13b at an outer area therewithin.

Next, an example of configuration, structure, and an example of material that may be used for a recording portion are described with reference to FIGS. 4A and 4B, FIGS. 5A and 5B, FIGS. 6A and 6B, and FIGS. 7A to 7C.

Figure 4:
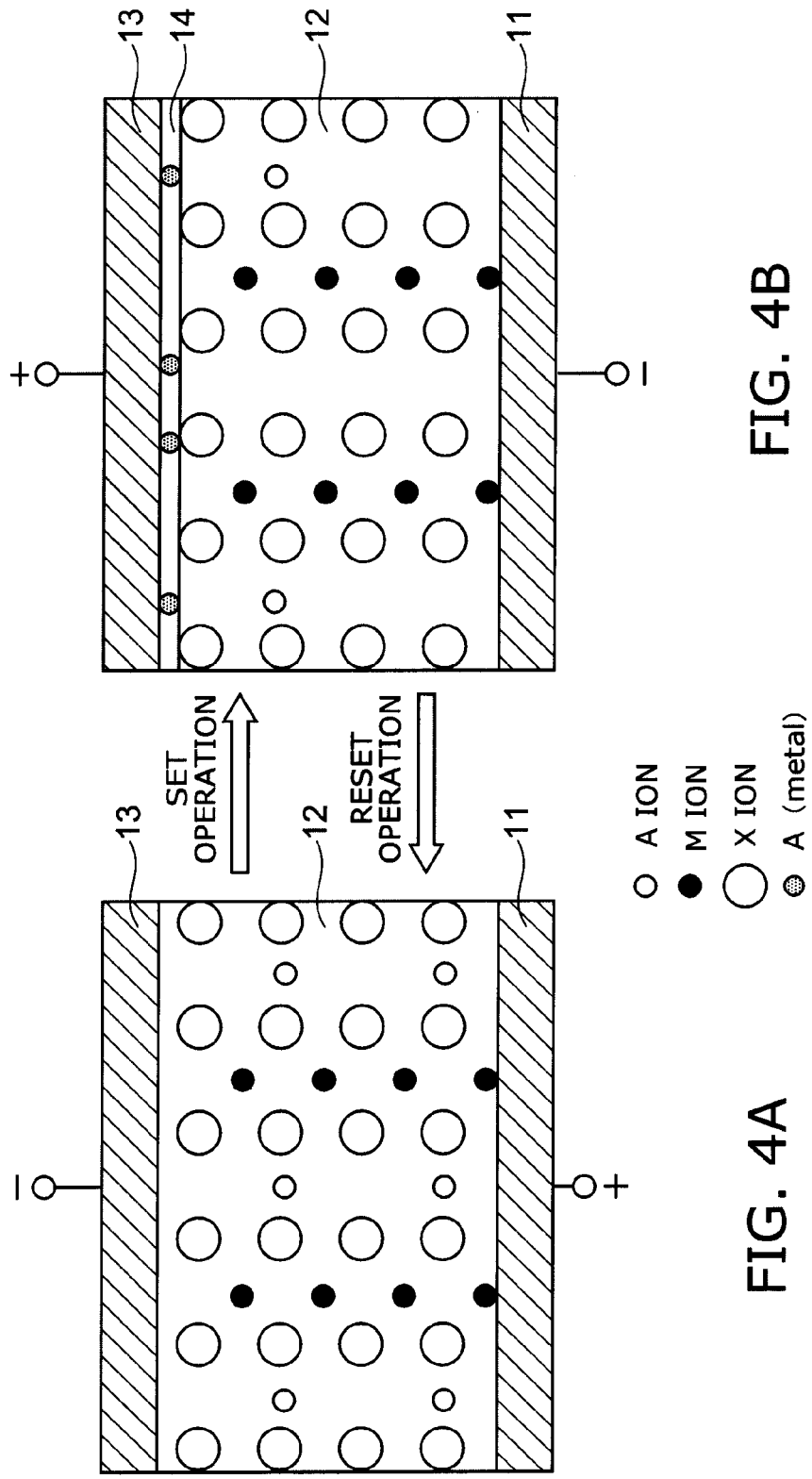
FIGS. 4A and 4B are conceptual diagrams for describing operations of recording and reproducing information in an example (a third specific example) of the recording portion.

FIGS. 4A and 4B are conceptual diagrams for describing operations of recording and reproducing information in an example (a third specific example) of the recording portion.

FIG. 4A is a cross-sectional view of the recording portion. The recording portion has a structure in which the recording layer 12 is sandwiched from both sides between the electrode layer 11 and the electrode layer 13. The electrode layers 11 and 13 are provided to establish electrical connection to the recording layer 12. The electrode layers 11 and 13 may, for example, also have a function as a barrier layer to suppress diffusion of an element between the recording layer 12 and its upper or lower component. A buffer layer (not shown) may be provided below the electrode layer 11. Here, the buffer layer is a layer that has a function to temporarily reset the crystallinity of the adjacent layer (the electrode layer 11 in this specific example), and to secure the adhesion between the adjacent layer and other layer (adhesion between the electrode layer 11 and the recording layer 12 in this specific example).

In the recording portion shown in FIGS. 4A and 4B, a small open circle denotes an A ion (for example, a diffusion ion), a small filled circle denotes an M ion (for example, a parent ion), a large open circle denotes an X ion (for example, an anion) in the recording layer 12 and a small shaded circle denotes an A ion in a metallic state.

The recording layer 12 contains an oxide of a transition metal, a polymer, or a solid electrolyte whose resistances may be changed by applying a voltage. For the recording layer 12, for example, a composite compound having at least two types of cation elements may be used. Alternatively, a compound having cation elements of the same element capable of having at least two valencies may be used for the recording layer 12. In this case, the recording layer 12 has a first compound in which at least either one of the cation elements is a transition element having a d-orbit incompletely filled with electrons, and the shortest distance between the adjacent cation elements is 0.32 nm or less. By using the recording layer 12 containing this composite compound, resistance change may be made with relatively small power consumption. Material for such recording layer 12 includes the following, for example.

For example, the material has the spinel structure expressed by $A_xM_yX_4$ ($0.1 \leq x \leq 2.2$, $1.5 \leq y \leq 2$) where A and M are elements different from each other, and at least either one of the elements is a transition element having a d-orbit incompletely filled with electrons. X includes at least any element selected from the group consisting of O (oxygen) and N (nitrogen). A and M have different valencies, and are each in a cationic state.

A is at least one type of element selected from the group of Na, K, Rb, Be, Mg, Ca, Sr, Ba, Al, Ga, Mn, Fe, Co, Ni, Cu, Zn, S, P, Se, Ge, Ag, Au, Cd, Sn, Sb, Pt, Pd, Hg, Tl, Pb, and Bi.

A is preferably at least one type of element selected from the group of Mg, Mn, Fe, Co, Ni, Zn, Cd, and Hg. This is because when these elements are used, the ionic radius for maintaining a crystal structure becomes optimal, and the ion mobility may also be sufficiently secured. Also, controlling the valency of the ion to be 2 becomes easy.

Also, A is more preferably at least one type of element selected from the group of Zn, Cd, and Hg. This is because when these elements are used, movement of the cations occurs more easily.

M is at least one type of element selected from the group of Al, Ga, Ti, Ge, Sn, V, Cr, Mn, Fe, Co, Ni, Nb, Ta, Mo, W, Re, Ru, and Rh.

Also, M is preferably at least one type of element selected from the group of Ti, Zr, Hf, V, Nb, Ta, Cr, Mo, W, Mn, Re, Fe, Co, Ni, Al, and Ga. This is because when these elements are used, controlling the electronic state in the crystal becomes easy.

Also, M is more preferably at least one type of a transition element selected from the group of Cr, Mo, W, Mn, and Re (referred to as "Group 1" for convenience). This is because when these elements are used, parent body structure is stably maintained, thus switching may be stably repeated.

Also, M more preferably includes at least one type of element selected from the group of Fe, Co, Ni, Al, and Ga in addition to a transition element of the above-mentioned Group 1. This is because when these elements are used instead of some of the elements in the Group 1, parent body structure is more stably maintained, thus switching can be more stably repeated.

Other material has, for example, the spinel structure expressed by $A_xM_yX_4$ ($0.1 \leq x \leq 2.2$, $1.5 \leq y \leq 2$). Here, A and M are the same element, which is a transition element having a d-orbit incompletely filled with electrons, and A is a cation having a valency of 2, and M is a cation having a valency of 3 or more and 4 or less. X includes at least any element selected from the group consisting of O (oxygen) and N (nitrogen). A and M are preferably at least one type of element selected from the group of Mn, Fe, and Co because for such A and M, a spinel structure can be easily formed.

Other material has, for example, the delafossite structure expressed by $A_xM_yX_2$ ($0.1 \leq x \leq 1.1$, $0.9 \leq y \leq 1.1$). A and M are elements different from each other, and at least either one of the elements is a transition element having a d-orbit incompletely filled with electrons. X includes at least any element selected from the group consisting of O (oxygen) and N (nitrogen). A and M have different valencies, and are each in a cationic state.

A is at least one type of element selected from the group of Li, Na, Be, Mg, Ca, Cu, Ag, Au, Pt, Pd, Rh, Hg, and Tl.

Also, A is more preferably at least one type of element selected from the group of Mg, Mn, Fe, Co, Ni, Cu, Ag, and Zn. This is because when these elements are used, the ionic radius for maintaining the crystal structure becomes optimal, and the ion mobility can also be sufficiently secured. Also, controlling the coordination number of the element to be 2 becomes easy.

Also, A is preferably at least one type of element selected from the group of Cu and Ag. This is because when these elements are used, a delafossite structure can be easily formed.

M is at least one type of element selected from the group of Al, Ga, Sc, In, Y, La, Pr, Nd, Sm, Eu, Gd, Tb, Dy, Ho, Er, Tm, Tb, Lu, Ti, Ge, Sn, V, Cr, Mn, Fe, Co, Ni, Nb, Ta, Mo, W, Ru, Rh, and Pd.

Also, M is more preferably at least one type of element selected from the group of Y, Sc, V, Cr, Mn, Fe, Co, Ni, Al, and Ga. This is because when these elements are used, controlling the electronic state in the crystal becomes easy.

Also, M is more preferably at least one type of element selected from the group of Fe, Co, and Al. This is because when these elements are used, a delafossite structure can be easily formed.

Other material has, for example, the wolframite structure expressed by $A_xM_yX_4$ ($0.5 \leq x \leq 1.1$, $0.7 \leq y \leq 1.1$). A and M are elements different from each other, and at least either one of the elements is a transition element having a d-orbit incompletely filled with electrons. X includes at least any element selected from the group consisting of O (oxygen) and N (nitrogen). A and M have different valencies, and are each in a cationic state.

A is at least one type of element selected from the group of Na, K, Rb, Be, Mg, Ca, Sr, Ba, Al, Ga, Ti, V, Cr, Mn, Fe, Co, Ni, Cu, Zn, Si, P, S, Se, Ge, Ag, Au, Cd, Sn, Sb, Pt, Pd, Hg, Tl, Pb, and Bi.

Also, A is preferably at least one type of element selected from the group of Ti, V, Mn, Fe, Co, and Ni. This is because when these elements are used, the ionic radius for maintaining the crystal structure becomes optimal, and the ion mobility can also be sufficiently secured. Also, controlling the valency of the ion to be 2 becomes easy.

Also, A is more preferably at least one type of element selected from the group of Mn, Fe, Co, and Ni. This is because when these elements are used, resistance change can be easily made.

M is at least one type of element selected from the group of V, Nb, Ta, Cr, Mn, Mo, and W.

Also, M is more preferably at least one type of element selected from the group of Cr, Mo, and W. This is because when these elements are used, a wolframite structure can be easily formed.

Other material has, for example, the ilmenite structure expressed by $A_xM_yX_3$ ($0.55 \leq x \leq 1.1$, $0.9 \leq y \leq 1$). A and M are elements different from each other, and at least either one of the elements is a transition element having a d-orbit incompletely filled with electrons. X includes at least any element selected from the group consisting of O (oxygen) and N (nitrogen). A and M have different valencies, and are each in a cationic state.

A is at least one type of element selected from the group of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

Also, A is more preferably at least one type of element selected from the group of Mg, Mn, Fe, Co, Ni, and Zn. This is because when these elements are used, the ionic radius for maintaining the crystal structure becomes optimal, and the ion mobility can also be sufficiently secured. Also, controlling the valency of the ion to be 2 becomes easy.

Also, A is more preferably at least one type of element selected from the group of Fe and Ni. This is because when these elements are used, an ilmenite structure can be easily formed.

M is at least one type of element selected from the group of Al, Ga, Ti, Ge, Sn, V, Cr, Mn, Fe, Co, Ni, Nb, Ta, Mo, W, Re, Ru, and Rh.

Also, M is more preferably at least one type of element selected from the group of Ti, Zr, Hf, V, Nb, Ta, Cr, Mn, Fe, Co, and Ni. This is because when these elements are used, controlling the electronic state in the crystal becomes easy.

Also, M is preferably at least one type of element selected from the group of Ti, Zr, Hf, and V. This is because when these elements are used, an ilmenite structure can be easily formed.

With regard to the spinel structure expressed by $A_xM_yX_4$ ($0.1 \leq x \leq 2.2$, $1.5 \leq y \leq 2$), the delafossite structure expressed by $A_xM_yX_2$ ($0.1 \leq x \leq 1.1$, $0.9 \leq y \leq 1.1$), the wolframite structure expressed by $A_xM_yX_4$ ($0.5 \leq x \leq 1.1$, $0.7 \leq y \leq 1.1$), the ilmenite structure expressed by $A_xM_yX_3$ ($0.5 \leq x \leq 1.1$, $0.9 \leq y \leq 1$), and molar ratio x to y, the lower limit of each numerical value range is set to maintain the crystal structure, and the upper limit thereof is set to control the electronic state in the crystal.

Also, as described above, in order to cause diffusion of the A ion with ease by applying a voltage, a layer of the A ion elements may be arranged in the direction connecting the electrodes. To achieve this, in the spinel, the ilmenite and the delafossite structures, the c-axis of the crystal is preferably arranged to be parallel to its film surface. In the wolframite structure, the a-axis of the crystal is preferably arranged to be parallel to its film surface.

By using the foregoing recording layer as a desired orientation, a recording density of the order of Pbpsi (peta bit per square inch) can be achieved, and also low power consumption can be achieved.

According to the material having the structure described above, two types of cation elements A and M are selected so that the A ion easily diffuses in the first compound, and the M ion does not diffuse in the first compound in FIGS. 4A and 4B. In this case, it becomes possible to easily control the movement of the A ion in order for the M ion which does not diffuse to maintain the crystal structure of the first compound. Thus, by using the first compound having such structure, the resistance value of the recording layer 12 of the information recording and reproducing device can be easily changed.

Now, a high resistance state herein is defined to be reset (initial) state, and a low resistance state is defined to be set state. However, this is for the purpose of convenience, and according to the selection of material and the manufacturing method employed, reverse case may be defined, that is, a low resistance state may be defined to be reset (initial) state, and a high resistance state may be defined to be set state. Such case is also included in the scope of the embodiment.

When a voltage is applied to the recording layer 12 to cause a potential gradient therein, some of the A ions move within the crystal. In the embodiment, information is recorded by setting the initial state of the recording layer 12 to be insulator state (high resistance state phase), and causing a phase change on the recording layer 12 by the potential gradient to give conductivity to the recording layer 12 (low resistance state phase).

First, for example, a state is established, in which electric potential of the electrode layer 13 is relatively lower than that of the electrode layer 11. Suppose that the electrode layer 11 has a fixed potential (for example, earth potential), a negative potential may be applied to the electrode layer 13.

At this point, some of the A ions in the recording layer 12 move to the electrode layer 13 (cathode) side, and the number of the A ions in the recording layer (crystal) 12 relatively decreases with respect to the X ions. The A ions which have moved to the electrode layer 13 side receive electrons from the electrode layer 13, and are deposited as A atoms which are metal, and a metal layer 14 is formed. Accordingly, in a region near the electrode layer 13, the A ions are reduced and behave like metals, thus its electrical resistance is significantly decreased.

Alternatively, for example in the case where there are vacant sites that may be occupied by the A ions in the crystal structure of the recording layer 12 like a spinel structure, the A ions which have moved to the electrode layer 13 side may occupy the vacant sites. Also in this case, in order to satisfy local charge neutrality condition, the A ions receive electrons from the electrode layer 13, and behave like metals.

Inside the recording layer 12, the X ions are in excess, and consequently the valencies of remaining A or M ions in the recording layer 12 are increased. If A or M ions are selected so as to decrease the electrical resistance when their valencies are increased, the electrical resistance inside the metal layer 14 as well as the recording layer 12 is decreased due to the movement of the A ions. Thus, a phase is changed to a low resistance state phase across the entire recording layer. That is, recording of information (set operation) is completed.

Information reproducing can be easily performed, for example, by applying a voltage pulse to the recording layer 12 and detecting a resistance value thereof. The amplitude of the voltage pulse is assumed to be minute so as not to cause movement of the A ions.

The process described above is a type of electrolysis, and it may be understood that oxidizing agent is generated by electrochemical oxidization on the electrode layer (anode) 11 side, and reducing agent is generated by electrochemical reduction on the electrode layer (cathode) 13 side.

Thus, in order to restore a low resistance state phase to a high resistance state phase, for example, Joule heating of the recording layer 12 may be performed by high current pulses to promote the oxidation-reduction reaction of the recording layer 12. That is, due to the Joule heat by the high current pulse, the A ions return into more thermally stable crystal structure 12, and the initial high resistance state phase appears (reset operation).

Alternatively, the reset operation may be performed also by applying a voltage pulse in the reversed direction from that at the time of set operation. That is, assuming the electrode layer 11 is a fixed potential (for example, earth potential) in the same manner as at the time of setting, a positive potential may be applied to the electrode layer 13. Then, after the A atoms in the neighborhood of the electrode layer 13 release electrons to the electrode layer 13 to become A ions, the A ions return into the crystal structure 12 due to a potential gradient therein. Accordingly, some of the A ions whose valencies have been increased have decreased valencies down to the values same as those at the initial state, thus the phase changes to the initial high resistance state phase.

In order to put this operation in practical use, it must be verified that the reset operation is not caused at a room temperature (securing sufficiently long retention time) and the power consumption by the reset operation is sufficiently small.

The former requirement may be fulfilled by reducing the coordination number of the A ion (ideally to 2 or less), or setting its valency to 2 or more, or increasing the valency of the M ion (ideally to 3 or more).

If the A ion has a valency of 1 like Li-ion, sufficient transfer resistance of the ion may not be obtained in a set state, whereby the A ion element immediately returns from the metal layer 14 into the recording layer 12. In other words, sufficiently long retention time may not be obtained. Otherwise if the A ion has a valency of 3 or more, the voltage for the set operation is increased, thus collapse of the crystal may be caused. Thus, it is preferable to keep the valency of the A ion to 2 for the information recording and reproducing device.

Also, the latter requirement may be fulfilled by reducing the valency of the A ion to 2 or less to avoid collapse of the crystal as well as optimizing the ionic radius of the A ion to allow the A ion to move in the recording layer (crystal) 12, and thus by using a structure in which moving paths exist. For such recording layer 12, the elements and the crystal structure described above may be employed.

In the case where a cation with a small coordination number is used for the A ion like the delafossite structure (the coordination number of the A ion is 2 in the case of the delafossite structure), the Coulomb repulsion can be decreased by setting the valency of the A ion to +1. Thereby, the A ions are easily diffused, and the power consumption of the reset operation can be reduced. Also, since the coordination number is small, the state after the ion diffusion can be stably maintained.

Next, optimal values of mixture ratio of the atoms are described.

In the case where there are vacant sites that may be occupied by the A ions, or the A ions are able to occupy the sites which are originally supposed to be occupied by the M ions, the mixture ratio of the A ions may be somewhat arbitrary. Also in the case where there is an excess/deficit of the X ions, the mixture ratio of the A ions or the M ions differs from that of the constant ratio composition. Thus, the mixture ratio of the A ions, and the M ions has a certain range. Actually, the mixture ratio of the A ions may be optimized so that the resistance in each state or the diffusion factor of the A ions takes the optimal value.

The lower limits of the mixture ratios of the A ions and the M ions are set so that the first compound having a desired crystal structure may be easily produced. When the total amount of the ions that occupy the sites of the M ions is too small, it becomes difficult to stably maintain the structure after the A ions are removed.

As described above, according to the embodiment, the cations can be easily diffused by using the above mentioned materials for the recording layer 12, thus the power consumption required for a resistance change can be reduced and thermal stability can be improved. In addition, since resistance change can be made by utilizing only the diffusion of the cation elements in the crystal structure, an information recording and reproducing device whose operational characteristics are easily controlled and which has reduced variation in the performance characteristics can be achieved.

Also, since the inside of the crystal structure and the peripheral portion of the crystal grains have different ion mobilities, it is preferable for the recording layer to have a polycrystalline or single crystalline state in order to make the record erasing characteristics uniform in different locations by utilizing the movement of diffusion ions in the crystal structure. When the recording layer is in a polycrystalline state, considering the ease of film formation, the sizes of the crystal grains in the direction of the cross section of the recording film preferably have a distribution with a single peak and have an average of 3 nm or more. The average of the crystal grain sizes is more preferably 5 nm or more because such average makes the film formation easier, and is even more preferably 10 nm or more because such average allows the record erasing characteristics in different locations to be more uniform.

Since oxidizing agent is produced on the electrode layer (anode) 11 side after a set operation, material resistant to oxidation (for example, electrically conductive nitride, electrically conductive oxide, and the like) is preferably used for the electrode layer 11.

Also, it is preferable to use material having no ionic conductivity for the electrode layer 11.

Such materials include the following listed below, and it can be safely said that among all, $LaNiO_3$ is the most desirable material judging from the viewpoint of the overall performance considering electrical conductivity and the like.

MN

M is at least one type of element selected from the group of Ti, Zr, Hf, V, Nb, and Ta. N is nitrogen.

$MO_x$

M is at least one type of element selected from the group of Ti, V, Cr, Mn, Fe, Co, Ni, Cu, Zr, Nb, Mo, Ru, Rh, Pd, Ag, Hf, Ta, W, Re, Ir, Os, and Pt. The molar ratio x satisfies $1 \leq x \leq 4$.

$AMO_3$

A is at least one type of element selected from the group of La, K, Ca, Sr, Ba, and Ln (lanthanoid).

M is at least one type of element selected from the group of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one type of element selected from the group of K, Ca, Sr, Ba, and Ln (lanthanoid).

M is at least one type of element selected from the group of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Also, since reducing agent is produced on the protective layer (cathode) 13 side after a set operation, it is desirable that the protective layer (electrode layer) 13 has a function to suppress the reaction of the recording layer 12 with the atmosphere.

The electrode layer 13 may be operated as a protective layer which protects the recording layer 12, or another protective layer may be provided instead of the electrode layer 13. In this case, the protective layer may be an insulator, or an electrical conductor.

Also, in order to efficiently heat the recording layer 12 at reset operation, a heater layer (made of material having a resistivity of $10^{-5}$ Ωcm or more) may be provided on the cathode side, or the electrode layer 13 side herein.

The electrode layer 13 has the low resistivity portion 13a at an inner area within the main surface, and the high resistivity portion 13b at an outer area therewithin. Also, the electrode layer 11 has a uniform resistivity within its main surface. Thus, the characteristics described above are obtained also in this specific example. That is, recording of information is properly performed and reduction of the power consumption is achieved.

Next, another example (a fourth specific example) of the recording portion is described with reference to FIG. 5A, FIG. 5B, FIG. 6A, and FIG. 6B.

Figure 5:
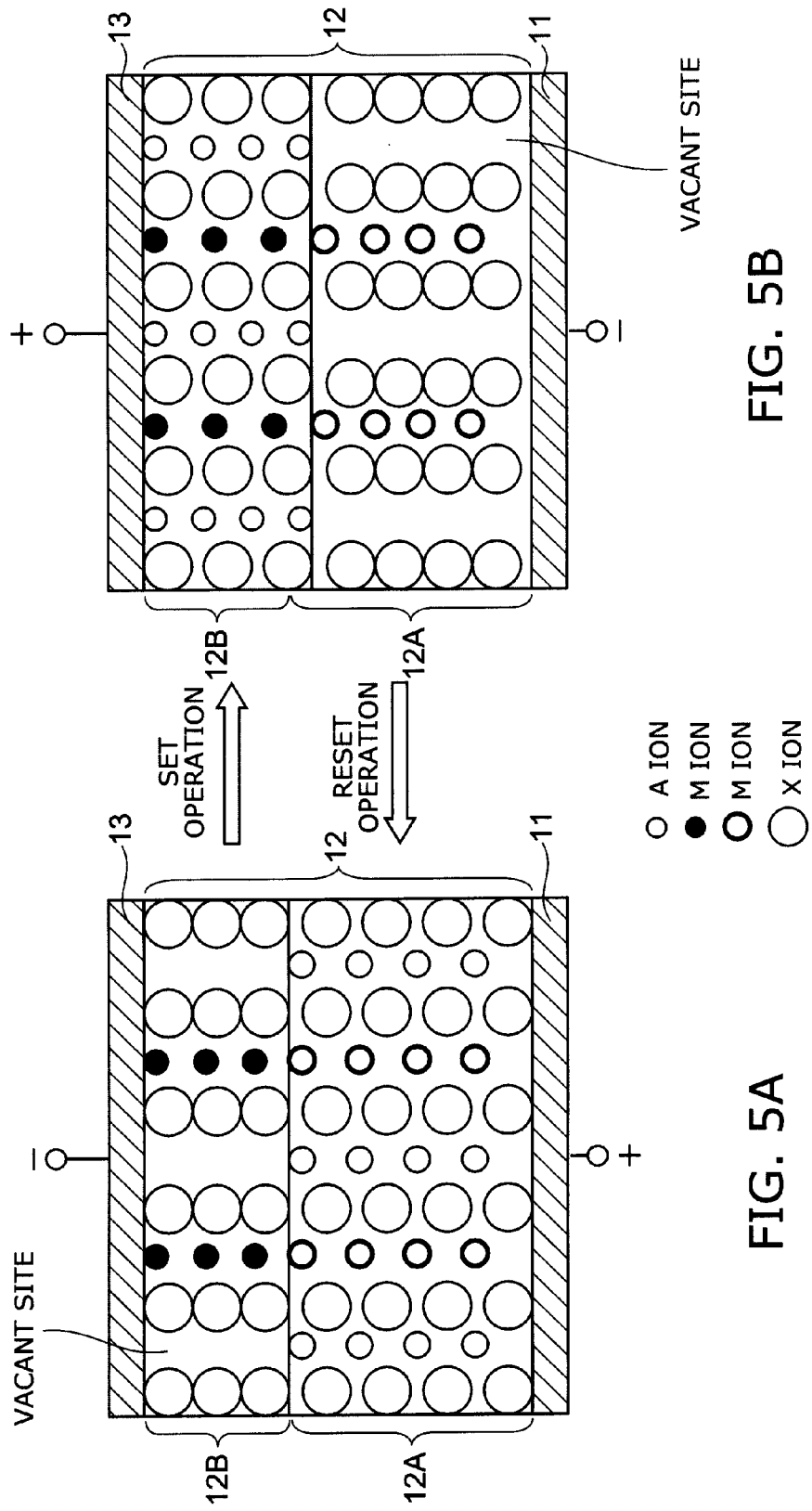
FIGS. 5A and 5B are conceptual diagrams for describing operations of recording and reproducing information in a fourth specific example.

FIGS. 5A and 5B are conceptual diagrams for describing operations of recording and reproducing information in the fourth specific example.

This recording portion also has a structure in which the recording layer 12 is sandwiched from both sides between the electrode layers 11 and 13.

The recording layer 12 includes a first compound layer 12A which is placed on the electrode layer 11 side and is expressed by $A_xM1_yX1_z$, and a second compound layer 12B which is placed on the electrode layer 13 side, and has at least one type of transition element and vacant sites in which the A ion elements of the first compound may be stored.

In the recording portion shown in FIGS. 5A and 5B, a small open circle in the first compound layer 12A denotes an A ion (for example, a diffusion ion), a small open circle with thick line denotes an M1 ion (for example, a parent ion), and a large open circle denotes an X1 ion (for example, a negative ion). Also, in the recording portion shown in FIGS. 5A and 5B, a small filled circle in the second compound layer 12B denotes an M2 ion (for example, a parent ion), and a large open circle denotes an X2 ion (for example, a negative ion).

The second compound includes, for example, the compounds expressed by the following chemical formulas where $\phi$ denotes a vacant site in which the A ions are stored. A portion of the vacant sites may be pre-occupied by other ions in order to facilitate film formation of the second compound.

$\phi_2M2X2_2$

M2 is at least one type of element selected from the group of Ti, Ge, Sn, V, Cr, Mn, Fe, Co, Ni, Nb, Ta, Mo, W, Re, Ru, and Rh.

X2 is at least one type of element selected from the group of O, S, Se, N, Cl, Br, and I. The molar ratio x satisfies $0.3 \leq x \leq 1$.

$\phi_xM2X2_3$

M2 is at least one type of element selected from the group of Ti, Ge, Sn, V, Cr, Mn, Fe, Co, Ni, Nb, Ta, Mo, W, Re, Ru, and Rh.

X2 is at least one type of element selected from the group of O, S, Se, N, Cl, Br, and I. The molar ratio x satisfies $1 \leq x \leq 2$.

$\phi_xM2X2_4$

M2 is at least one type of element selected from the group of Ti, Ge, Sn, V, Cr, Mn, Fe, Co, Ni, Nb, Ta, Mo, W, Re, Ru, and Rh.

X2 is at least one type of element selected from the group of O, S, Se, N, Cl, Br, and I. The molar ratio x satisfies $1 \leq x \leq 2$.

$\phi_2M2PO_z$

M2 is at least one type of element selected from the group of Ti, Ge, Sn, V, Cr, Mn, Fe, Co, Ni, Nb, Ta, Mo, W, Re, Ru, and Rh.

P is a phosphorus element and O is an oxygen element. The molar ratios x, z satisfy $0.3 \leq x \leq 3$ and $4 \leq z \leq 6$.

$\phi_xM2O_5$

M2 is at least one type of element selected from the group of V, Cr, Mn, Fe, Co, Ni, Nb, Ta, Mo, W, Re, Ru, and Rh. O is an oxygen element. The molar ratio x satisfies $0.3 \leq x \leq 2$.

The second compound preferably have a structure including at least either one selected from the group consisting of the hollandite structure, ramsdellite structure, the anatase structure, the brookite structure, the pyrolusite structure, $ReO_3$ structure, $MoO_{1.5}PO_4$ structure, $TiO_{0.5}PO_4$ structure, $FePO_4$ structure, $\beta MnO_2$ structure, $\gamma MnO_2$ structure, $\lambda MnO_2$ structure, the spinel structure, and the ilmenite structure. Especially, it is most desirable for the second compound to have an ilmenite structure same as that of the first compound.

Also, the Fermi level of the electrons of the first compound layer 12A is made lower than that of the electrons of the second compound layer 12B. This is one of the desirable conditions to provide reversibility to the states of the recording layer 12. Here, both Fermi levels are values measured from the vacuum level.

In this manner, by providing the second compound layer 12B adjacent to the first compound layer 12A, the second compound layer 12B including the second compound that has vacant sites in which the A ions of the first compound layer 12A are stored, diffused A ion elements tend to be stable in their existence. By using such combination of materials for the recording layer to facilitate ion transfer between the first compound layer 12A and the second compound layer 12B, the power consumption required for a resistance change can be reduced, and thermal stability can be improved. Also, by using such combination of materials for the recording layer, a recording density of the order of Pbpsi (peta bit per square inch) can be achieved, and also low power consumption can be achieved.

Figure 6:
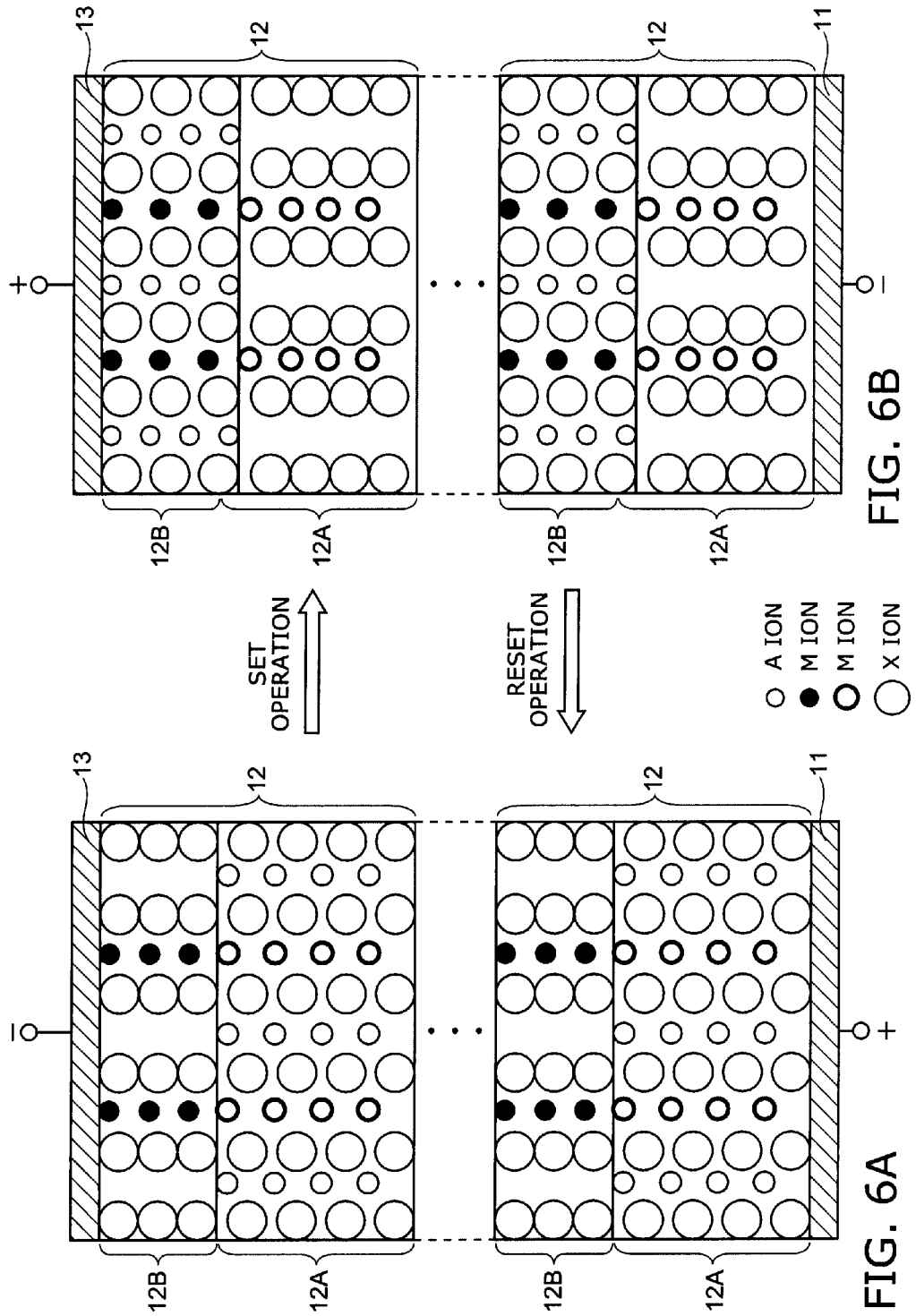
FIGS. 6A and 6B are schematic views showing a specific example in which a first compound and a second compound contained in the recording layer are stacked.

As illustrated in FIGS. 6A and 6B, each of the first compound layer 12A and the second compound layer 12B which are contained in the recording layer 12 may be configured by alternately stacking multiple layers including two or more layers.

In such recording portion, when electric potential is provided to the electrode layers 11 and 13 to generate a potential gradient in the recording layer 12 so that the first compound layer 12A becomes the anode, and the second compound layer 12B becomes the cathode, some of the A ion elements in the first compound layer 12A containing the first compound move through the crystal to enter into the second compound layer 12B on the cathode side.

Since there are vacant sites for the A ions in the crystal of the second compound layer 12B, the A ions which have moved from the first compound layer 12A containing the first compound stay in these vacant sites.

Thus, in the second compound layer 12B, some of the A ions or the M2 ions have reduced valency, while in the first compound layer 12A, the A ions or the M1 ions have increased valency. Thus, at least either of the A ion and the M1 ion is a transition element having a d-orbital incompletely filled with electrons so that its valency may be easily changed.

That is, assuming that the first compound layer 12A and the second compound layer 12B are in a high resistance state (insulator) in the initial state (reset state), some of the A ions in the first compound layer 12A move into the second compound layer 12B to generate conductive carriers in the crystals of the first compound layer 12A and the second compound layer 12B so that both layers have electrical conductivity.

In this manner, since the electrical resistance value of the recording layer 12 is reduced by providing current/voltage pulses to the recording layer 12, set operation (recording) is achieved.

At this point, concurrently electrons also move from the first compound layer 12A to the second compound layer 12B, and the total energy of the recording layer 12 is increased because the Fermi level of the electrons of the second compound layer 12B is higher than that of the electrons of the first compound layer 12A.

Also, even after the set operation is completed, such a high energy state continues, thus the recording layer 12 may naturally change its state from a set state (low resistance state) to a reset state (high resistance state).

However, such possibility is eliminated by using the recording layer 12 according to an example of the embodiment. That is, a set state may be maintained continuously.

This is because so-called ion transfer resistance is in effect. As described above, it is preferable for the information recording and reproducing device to have reduced coordination number of the A ion (ideally 2 or less), or have the A ion with valency of 2.

Now, since oxidizing agent is produced on the anode side after a set operation, also in this case, it is desirable to use material resistant to oxidation and having no ionic conductivity (for example, electrically conductive oxide) for the electrode layer 11. The preferred examples are as described above.

For the reset operation (erasing), the recording layer 12 may be heated to promote the phenomenon of returning the A ions stored in vacant sites of the above-mentioned second compound layer 12B to the first compound layer 12A.

Specifically, utilizing the Joule heat generated by supplying high current pulses to the recording layer 12 and the residual heat, the state of the recording layer 12 can be restored to the original high resistance state (insulator). Since the recording layer 12 has a low resistance, a high current flows even with a low potential difference.

In this manner, since the electrical resistance value of the recording layer 12 is increased by supplying high current pulses to the recording layer 12, the reset operation (erasing) is achieved. Alternatively, the reset operation may be performed by applying an electric field in the reversed direction from that at the time of set operation.

Here, in order to achieve low power consumption, it is essential to optimize the ionic radius of the A ion to allow the A ion to move in the crystal without collapsing the crystal, and use a structure in which moving paths exist.

In the case where the above-mentioned materials and crystal structure are used for the second compound, such conditions may be satisfied and the materials and crystal structure are effective in achieving low power consumption.

Also, in compounds of the spinel structure expressed by $A_xM_yX_4$ ($0.1 \leq x \leq 2.2$, $1.5 \leq y \leq 2$), the delafossite structure expressed by $A_xM_yX_2$ ($0.1 \leq x \leq 1.1$, $0.9 \leq y \leq 1.1$), the wolframite structure expressed by $A_xM_yX_4$ ($0.5 \leq x \leq 1.1$, $0.7 \leq y \leq 1.1$), and the ilmenite structure expressed by $A_xM_yX_3$ ($0.5 \leq X \leq 1.1$, $0.9 \leq y \leq 1$) that have a structure like the recording portion shown in FIGS. 4A and 4B, movement of the A ions is easily caused. Compounds having these structures are preferably used for the first compound.

Especially, it is preferable that the first compound layer 12A is orientated so that the moving paths are arranged in the direction connecting the electrodes because movement of the A ions in the first compound layer 12A is made easy. Also, it is preferable that the lattice constant of the first compound and the lattice constant of the second compound are the same because film formation is made possible by controlling the orientation easily even if material having vacant sites and difficult to form a film is used.

Next, a preferred range of film thickness of the second compound layer 12B is described.

In order to obtain the characteristics of storing the A ion into vacant sites, the second compound layer 12B preferably has a film thickness of 1 nm or more.

If the number of vacant sites of the second compound layer 12B becomes greater than the number of the A ions in the first compound layer 12A, the resistance change characteristics of the second compound layer 12B becomes small. The number of vacant sites in the second compound layer 12B is preferably not more than the number of the A ions in the first compound layer 12A in the same cross section.

Since the density of the A ions in the first compound layer 12A is generally the same as that of the vacant sites in the second compound layer 12B, the film thickness of the second compound layer 12B is preferably at the similar level as that of the first compound layer 12A or less.

On the cathode side, a heater layer (material having a resistivity of approximately $10^{-5}$ Ωcm or more) for further promoting reset operation may be generally provided.

For a probe memory, reduced material is deposited on the cathode side, thus a surface protective layer is preferably provided to prevent the material from reacting with the atmosphere.

It is also possible to use one material having both functions for the heater layer and the surface protective layer. For example, semiconductors such as an amorphous carbon, a diamond like carbon, and $SnO_2$ have a heater function as well as a surface protection function.

Reproducing can be easily performed by passing current pulses to the recording layer 12, and detecting the resistance value thereof.

It is assumed that each current pulse is set to a value small enough not to cause the a resistance change of the material used for the recording layer 12.

The electrode layer 13 has the low resistivity portion 13a at an inner area within the main surface, and the high resistivity portion 13b at an outer area therewithin. Also, the electrode layer 11 has a uniform resistivity within its main surface. Thus, the characteristics described above are obtained also in this specific example. That is, recording of information is properly performed and reduction of the power consumption is achieved.

Next, another example (a fifth specific example) of the recording portion is described with reference to FIGS. 7A to 7C.

Figure 7:
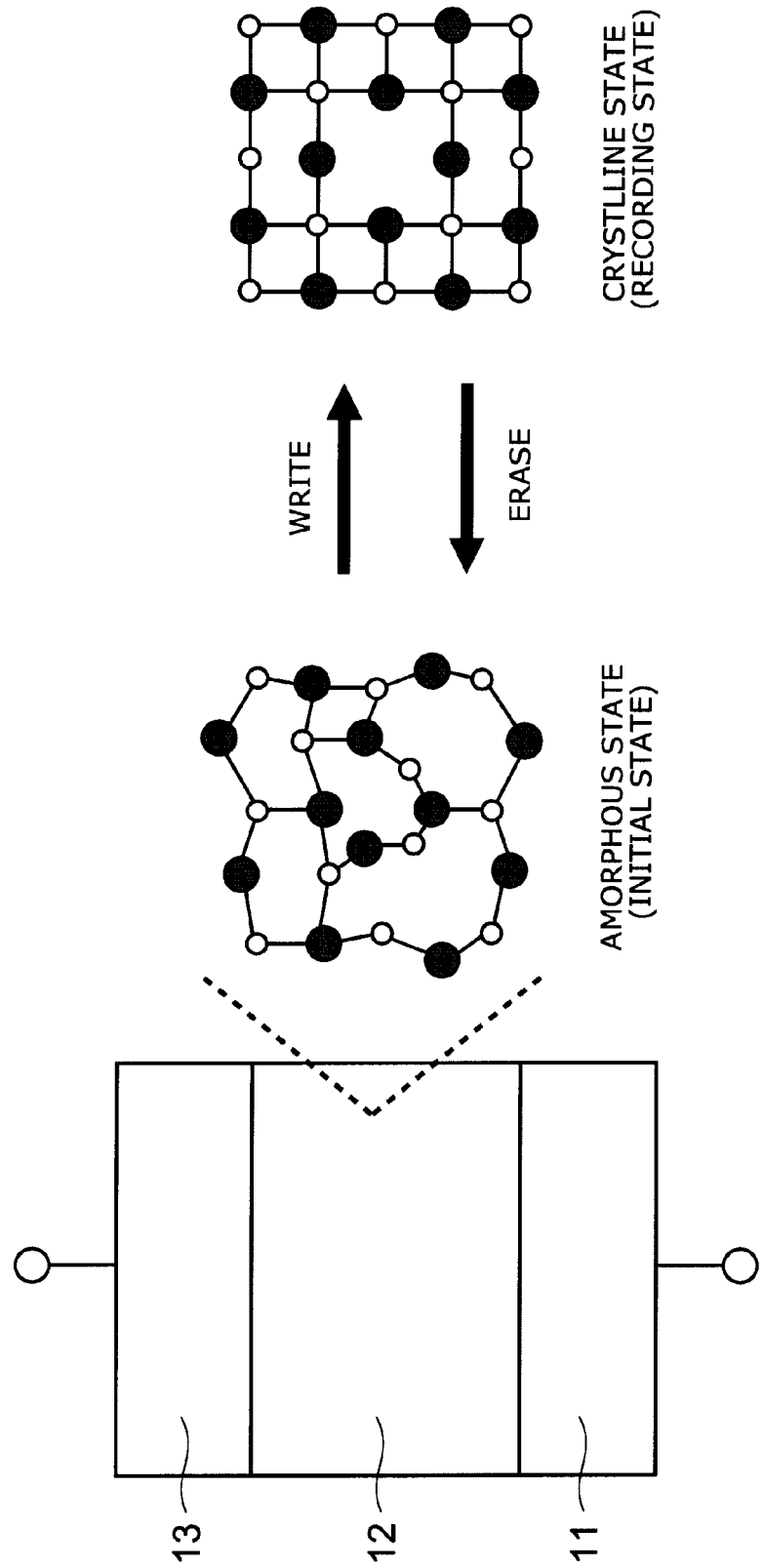
FIGS. 7A to 7C are conceptual diagrams for describing operations of recording and reproducing information in a fifth specific example.

FIGS. 7A to 7C are conceptual diagrams for describing operations of recording and reproducing information in the fifth specific example.

As shown in FIG. 7A, the recording portion of this specific example also has a structure in which the recording layer 12 is sandwiched from both sides between the electrode layers 11 and 13. The recording layer 12 is a phase change layer containing a material which changes between a crystalline state and an amorphous state by applying a voltage. Such material includes chalcogenide based material as a specific example. The chalcogenide is a general term for a compound containing 16 group elements, such as Se and Te, and the term originates from chalcogen which refers to 16 group elements. Specific examples of material include compounds containing Se or Te, and more particularly, include $Ge_2Sb_2Te_5$, GeSbTe, SbTe, AsSbTe, SeSbTe, AgInSbTe, and the like.

In this application, "crystal" does not mean only a perfect crystal, but includes a state of a single crystal and a polycrystalline crystal containing a defect. On the other hand, "amorphous" does not mean only completely disordered atomic arrangement, but includes a periodical structure of a short range, and a disordered matrix including minute crystal grains.

Nitrogen may be introduced to all or a part of the above-mentioned materials. By introducing nitrogen, a phase change temperature is increased, thus a phase change is not likely to occur. Thus, the crystalline state or the amorphous state is stabilized. Accordingly, recorded information is not likely to be erased and nonvolatility can be secured more properly.

Next, a mechanism of recording, erasing, and reproducing operations of the recording portion according to this specific example is described.

FIG. 7B is a schematic diagram showing a structure of an amorphous state of chalcogenide which may serve as material for the recording layer 12, and the specific example is $Ge_2Sb_2Te_5$. In this case, this compound has a structure based on various rings such as four-membered ring, six-membered ring, and eight-membered ring. FIG. 7C is a schematic diagram showing a structure of the crystalline state of $Ge_2Sb_2Te_5$. In this case, this compound has a structure based on a ring of four membered-ring, six membered-ring, and eight membered-ring.

The chalcogenide such as $Ge_2Sb_2Te_5$ used for the recording layer 12, when heated, changes its phase, and varies between the crystalline state of low resistance, and the amorphous state of high resistance. In the specific examples shown in FIGS. 7A to 7C, the amorphous state (FIG. 7B) is an initial state, and when the phase is changed to the crystalline state (FIG. 7C), write operation is performed. Conversely, when the phase is changed from the crystalline state (FIG. 7C) to the amorphous state (FIG. 7B), written information is erased. The system may be configured to have an initial state as the crystalline state (FIG. 7C), and write operation is performed when the phase is changed to the amorphous state (FIG. 7B).

Recording (writing) information in the recording layer 12 is performed by applying a voltage to the recording layer 12 to pass high current pulses thereto. By the Joule heat generated at this point, the recording layer 12 is heated up to the crystallization temperature or more. This temperature is maintained for a certain period of time, for example, for less than 1 microsecond. Subsequently, the recording layer 12 is cooled slowly, and the phase is changed to the crystalline state. Thereby, information is written to the recording layer 12.

Erasing information in the recording layer 12 is performed by passing high current pulses thereto and using the Joule heat generated at this point. By this Joule heat, the recording layer 12 is heated up to or over the melting point (melting point is 633° C. in the case of $Ge_2Sb_2Te_5$). Subsequently, the recording layer 12 is rapidly cooled, for example, for a time period less than 100 nano seconds, and the phase is changed to the amorphous state. Thereby, the information is erased.

Reproducing information in the recording layer 12 is performed by applying a voltage to the recording layer 12 to pass current pulses thereto, and detecting the resistance value. It is assumed that each current pulse is set to an amplitude small enough not to cause a phase change of the material used for the recording layer 12.

(Manufacturing Method of the Information Recording and Reproducing Device)

Next, a manufacturing method for a crosspoint type information recording and reproducing device according to the specific example 1 is described with reference to FIGS. 8 to 16.

First, an example of a manufacturing method (a first example of a manufacturing method) is described with reference to FIGS. 8 to 11. In the example of manufacturing method, material relatively resistant to oxidation is used for the electrode layer 11. That is, the materials for the electrode layer 13 and the electrode layer 11 are different.

Figure 8:
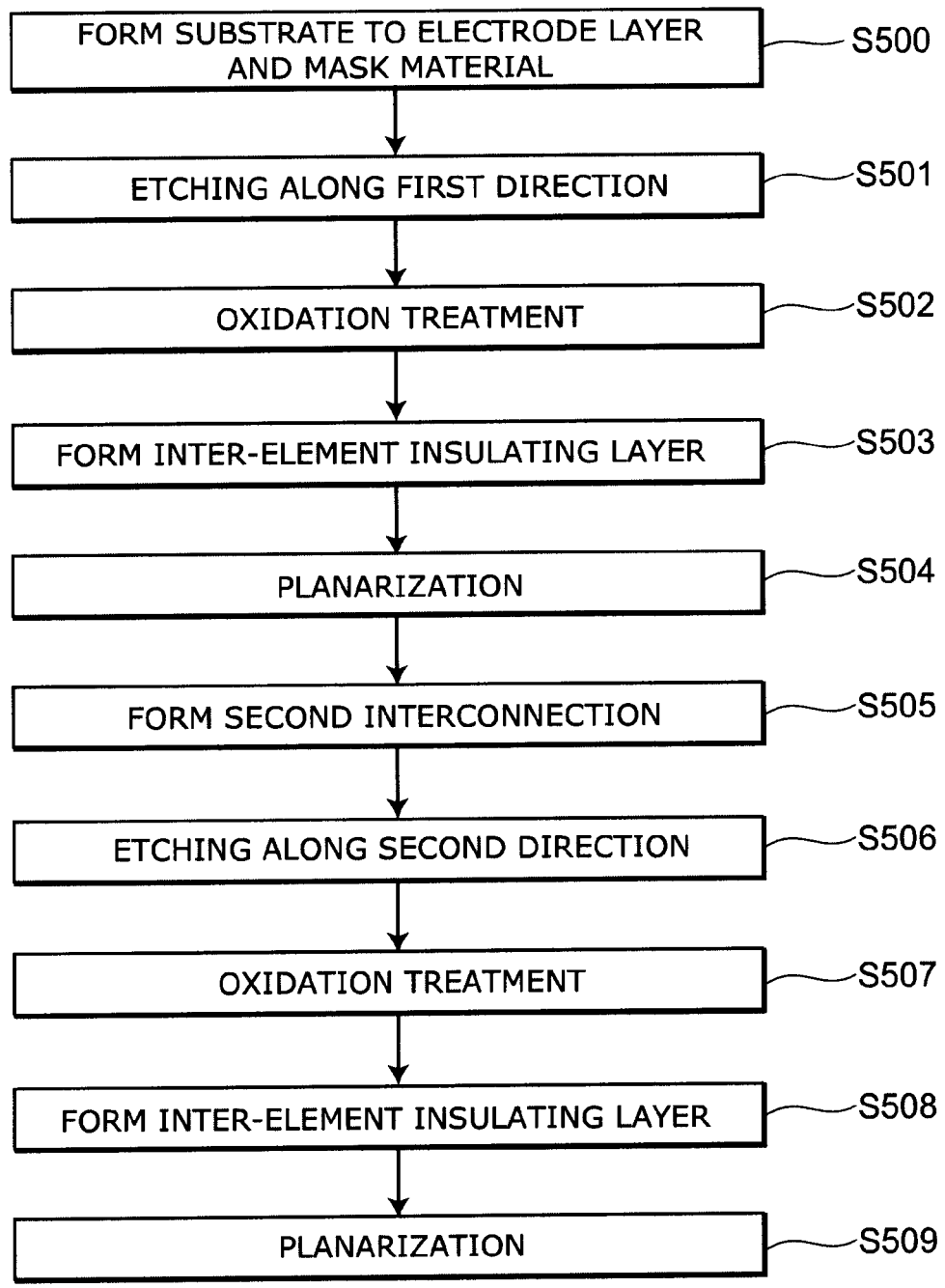
FIG. 8 is a flow diagram showing a first example of manufacturing method.

FIG. 8 is a flow diagram for showing the first example of manufacturing method. FIGS. 9A to 9C and FIGS. 10A to 10C are schematic process cross-sectional views for showing the first example of manufacturing method. In the following, description is given with reference to FIGS. 9A to 9C and FIGS. 10A to 10C.

Figure 9A:
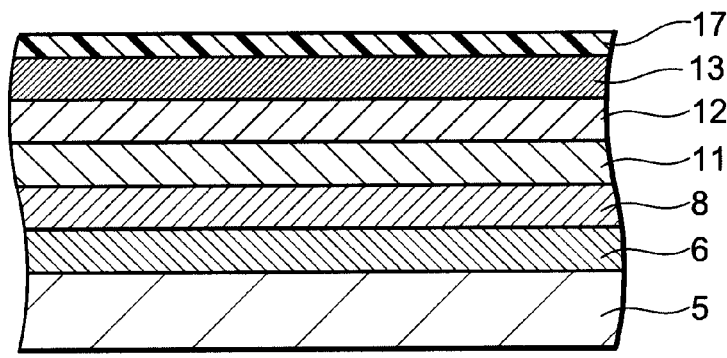
FIG. 9A to FIG. 10C are schematic process cross-sectional views showing the first example of manufacturing method.

First, as shown in FIG. 9A, a Si substrate protected by e.g., a thermal oxide film is planarized by using e.g., CMP (Chemical Mechanical Polishing) to form a substrate 5.

On the substrate 5, a conductive material film serving as a first interconnection 6 (word line) is deposited. For this conductive material, a metal such as W, Ta, Al, Cu, or an alloy of these, a metal silicide, a nitride and a carbide such as TiN, WC, or a highly doped silicon layer may be used.

The rectifying element 8 is deposited on the first interconnection 6. For the rectifying element 8, for example, a diode is used. In this case, a semiconductor layer such as Si, Ge, GaAs, and the like is provided. For the semiconductor layer, for example, a polycrystalline silicon layer is used and also an amorphous layer may be used. For example, after providing a highly doped semiconductor layer (for example, a p-type semiconductor layer), a semiconductor layer (for example, an n-type semiconductor layer) low-doped with dopant with opposite characteristics to the above (for example, an n-type dopant) is provided, so that a diode layer is formed.

The electrode layer 11 is deposited on the rectifying element 8. For material of the electrode layer 11, conductor relatively resistant to oxidation is used. For example, materials described above related to the first specific example may be used.

The recording layer 12 is deposited on the electrode layer 11. For the recording layer 12, various materials may be used as described above; however, here, the recording layer 12 described above related to the third specific example is used. Specifically, as the recording layer 12, for example, a film of $ZnCo_2O_4$ having the spinel structure is deposited. As a deposition method, for example, RF (radio frequency) magnetron sputtering is performed in an atmosphere of temperature at 300 to 600° C., 95% of Ar (argon) and 5% of $O_2$ (oxygen) by using raw material (target) whose composition has been adjusted so as to deposit $ZnCo_2O_4$ so that $ZnCo_2O_4$ with a thickness of approximately 10 nm is formed.

In the case where the electrode layer 11 has large crystal grains, and the ratio of the lattice constant of the electrode layer 11 to that of the first compound contained in the first compound layer 12A in the recording layer 12 is close to an integer, the first compound layer 12A which is orientated and has large crystal grains is easily obtained. For example, in the case where (110) oriented TiN is used for the electrode layer 11, the ratio of the lattice constant of the electrode layer 11 to that of (110) oriented spinel structure is approximately integer, thus (110) oriented spinel structure is easily obtained as the recording layer 12.

Subsequently, the electrode layer 13 is deposited on the recording layer 12. For the material of the electrode layer 13, an electrical conductor (for example, TiN, HfN, and the like) relatively easily oxidized, and having characteristics in which resistivity is increased when oxidized is used.

Subsequently, a mask material 17 is deposited on the electrode layer 13. For a material of the mask material 17, for example, precious metal such as Pt may be used.

Figure 9B:
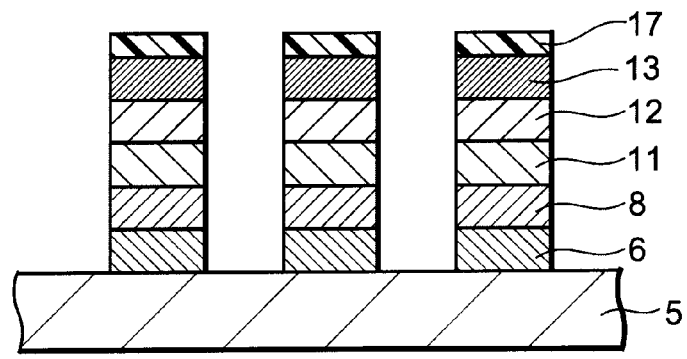

Subsequently, as shown in FIG. 9B, etching is performed along a first direction (X direction), for example, by RIE (Reactive Ion Etching) using a pattern of predetermined dimensions. Etching is performed to the depth of the interface between the substrate 5 and the first interconnection 6. In this manner, the first interconnection 6, the rectifying element 8, the electrode layer 11, the recording layer 12, and the electrode layer 13 are patterned.

Figure 9C:
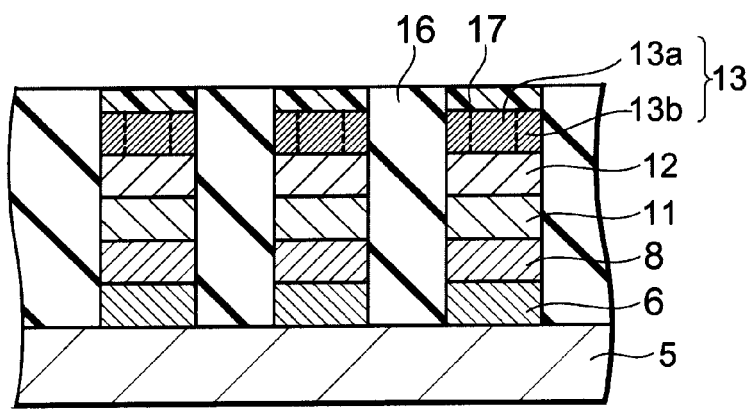

Subsequently, oxidation treatment is applied to the workpiece. Thereby, the vicinity of the lateral side of the electrode layer 13 is oxidized. Consequently, as shown in FIG. 9(c), the electrode layer 13 has a structure including the low resistivity portion 13a with a relatively low resistivity at an inner area within the main surface, and the high resistivity portion 13b with a relatively high resistivity at an outer area therewithin when viewed from the X direction.

When material which is difficult to be processed is used for the electrode layer 11 (for example, metal nitride such as TaN), after depositing of the substrate 5 to the deposing of the mask material 17 is performed, etching is performed to the depth to reach the interface between the electrode layer 11 and the recording layer 12. Subsequently, oxidation treatment to form the high resistivity portion 13b can be applied to this workpiece. Accordingly, metal nitride such as TaN, which is the material of the electrode layer 11, is also oxidized. It is expected that these metal nitride, once oxidized, are easy to be processed. Subsequently, etching of the electrode layer 11, the rectifying element 8, and the first interconnection 6 may be performed.

Subsequently, an insulating material is deposited on the space created by the etching using e.g., CVD (Chemical Vapor Deposition) to form an inter-element insulating layer 16.

Figure 10A:
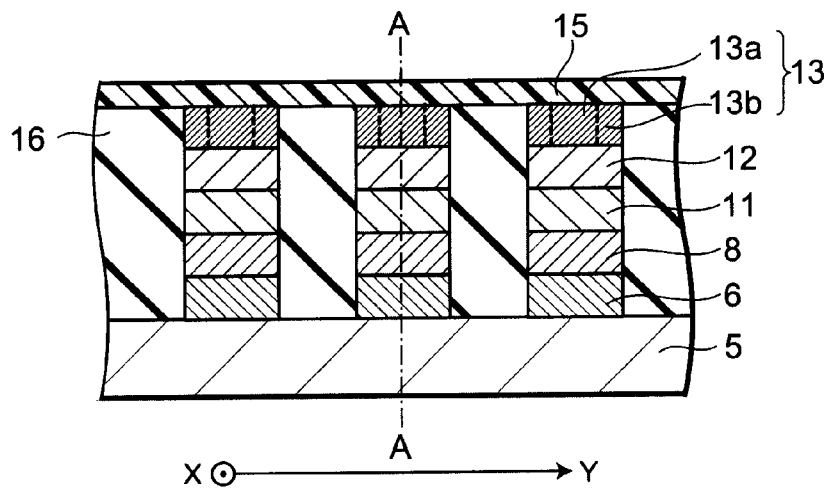

Next, as shown with FIG. 10A, the workpiece is planarized, for example, by CMP so that the electrode layer 13 is exposed.

Next, a conductive material film serving as a second interconnection 15 (bit line) is deposited on this workpiece. For this conductive material, a metal such as W, Ta, Al, Cu, or an alloy of these, a metal silicide, a nitride and a carbide such as TiN, WC, or a highly doped silicon layer may be used.

Figure 10B:
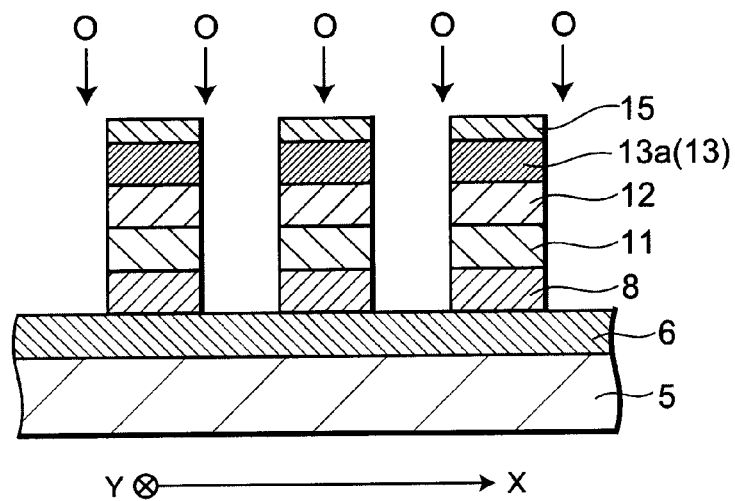

Next, description is given with reference to FIG. 10B. FIG. 10B corresponds to the cross-sectional view taken along the A-A line of FIG. 10A.

As shown in FIG. 10B, etching is performed along a second direction (Y direction), for example, by RIE using a pattern of predetermined dimensions. Etching is performed to the depth to reach the interface between the first interconnection 6 and the rectifying element 8. In this manner, the rectifying element 8, the electrode layer 11, the recording layer 12, the electrode layer 13, and the second interconnection 15 are patterned. When a material which is difficult to be processed is used for the electrode layer 11 (for example, metal nitride such as TaN) is used, etching is performed to the depth to reach the interface between the electrode layer 11 and the recording layer 12, and subsequently, oxidation treatment may be applied to this workpiece. It is expected that the electrode layer 11 is then easy to be processed. Subsequently, etching of the electrode layer 11 and the rectifying element 8 may be performed.

Figure 10C:
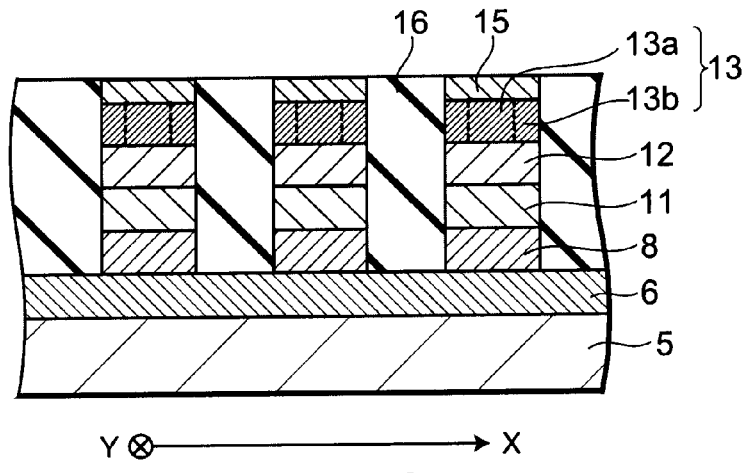

Next, oxidation treatment is applied to the workpiece. Accordingly, the vicinity of the lateral side of the electrode layer 13 is oxidized. Consequently, as shown in FIG. 10C, the electrode layer 13 has a structure including the low resistivity portion 13a with a relatively low resistivity at an inner area within the main surface, and the high resistivity portion 13b with a relatively high resistivity at an outer area therewithin when viewed from the Y direction.

Subsequently, an insulating material is deposited on the space created by the etching using e.g., CVD to form an inter-element insulating layer 16. Accordingly, the main part of the crosspoint type information recording and reproducing device according to the specific example 1 is formed.

Figure 11:
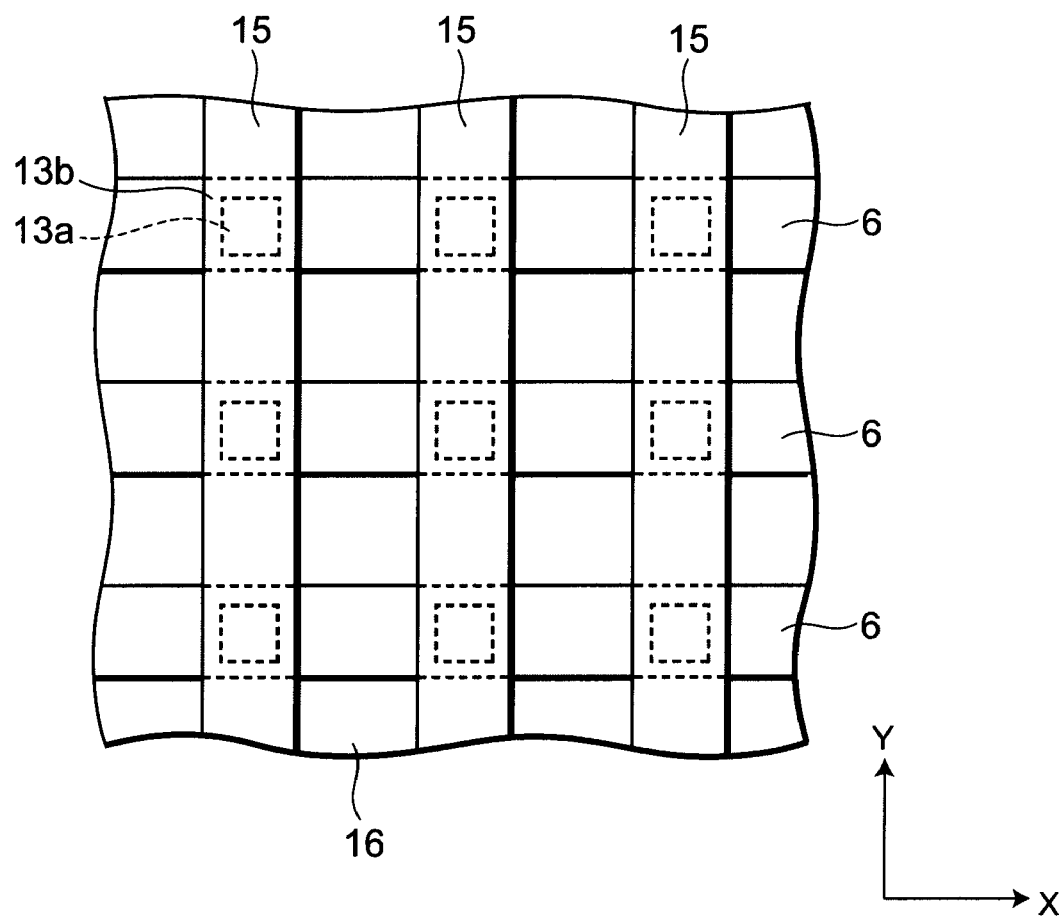
FIG. 11 is a plan view of the information recording and reproducing device produced by the first example of manufacturing method.

FIG. 11 is a plan view of the information recording and reproducing device produced by the first example of manufacturing method. As shown in FIG. 11, in this information recording and reproducing device, a recording portion is provided at the crossing portion (crosspoint) between the first interconnection 6 and the second interconnection 15. This is so-called a crosspoint type cell array structure.

The electrode layer 13 has a structure including the low resistivity portion 13a with a relatively low resistivity at an inner area within the main surface, and the high resistivity portion 13b with a relatively high resistivity at an outer area therewithin when viewed from the X and Y directions. Also, the electrode layer 11 has a uniform resistivity within its main surface. Accordingly, the characteristics described above are obtained. That is, recording of information is properly performed and reduction of the power consumption is achieved.

Next, another example of a manufacturing method (a second example of a manufacturing method) is described with reference to FIGS. 12 to 16. In this example of manufacturing method, the electrode layer 11 may be a material relatively easy to oxidation or a material relatively resistant to oxidation. Especially, the materials for the electrode layer 13 and the electrode layer 11 may be the same.

Figure 12:
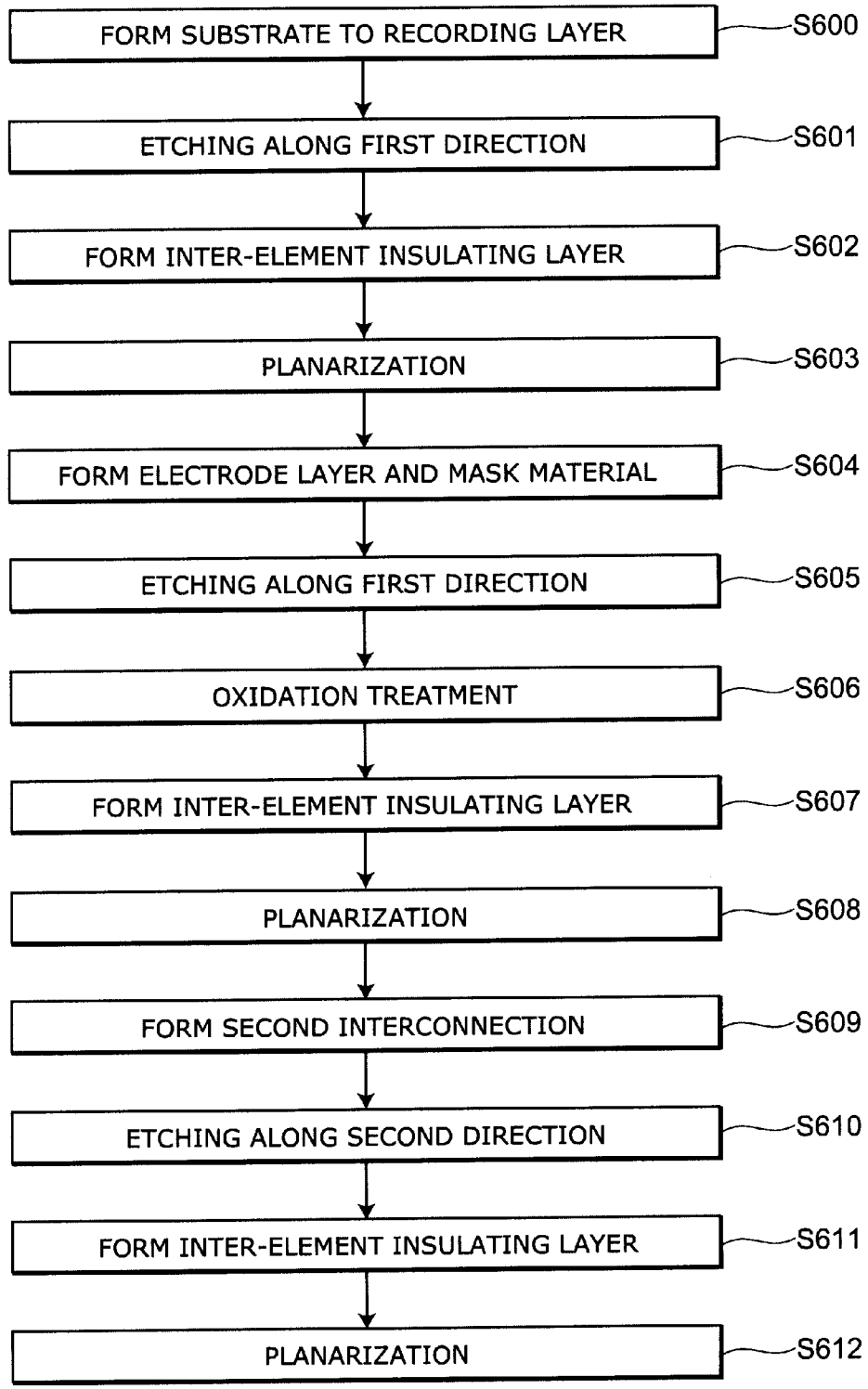
FIG. 12 is a flow diagram showing a second example of manufacturing method.

FIG. 12 is a flow diagram for showing the second example of manufacturing method. FIGS. 13A to 13C, FIGS. 14A to 14C, and FIGS. 15A to 15C are schematic process cross-sectional views for showing the second example of manufacturing method. In the following, description is given with reference to FIGS. 13A to 13C, FIGS. 14A to 14C, and FIGS. 15A to 15C.

Figure 13A:
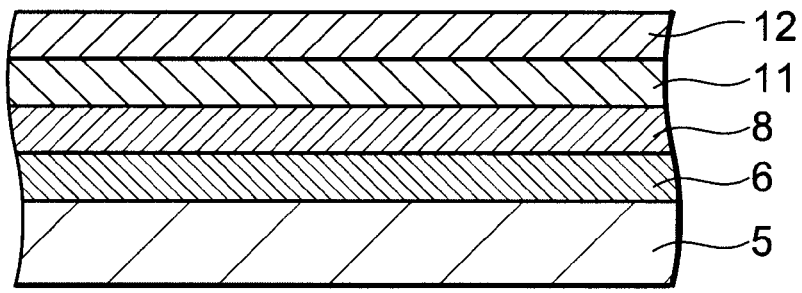
FIG. 13A to FIG. 15C are schematic process cross-sectional views showing the second example of manufacturing method.

First, as shown in FIG. 13A, a Si substrate protected by e.g., a thermal oxide film is planarized by using e.g., CMP to form the substrate 5. On the substrate 5, a conductive material film serving as the first interconnection 6 (word line) is deposited. For the material thereof, the one mentioned in the first example of manufacturing method may be used.

The rectifying element 8 is deposited on the first interconnection 6. For the material thereof, the one mentioned in the first example of manufacturing method may be used.

The electrode layer 11 is deposited on the rectifying element 8. For the material of the electrode layer 11, any material that provides electrical connection to the recording layer 12 may be used with no specific limitation. A material relatively easily oxidized or a material relatively resistant to oxidation may be used. Here, similarly to the electrode layer 13, an electrical conductor (for example, TiN, HfN, and the like), which is relatively easily oxidized and has characteristics that the resistivity increases when oxidized, is used.

The recording layer 12 is deposited on the electrode layer 11. For the material thereof, the one mentioned in the first example of manufacturing method may be used.

Figure 13B:
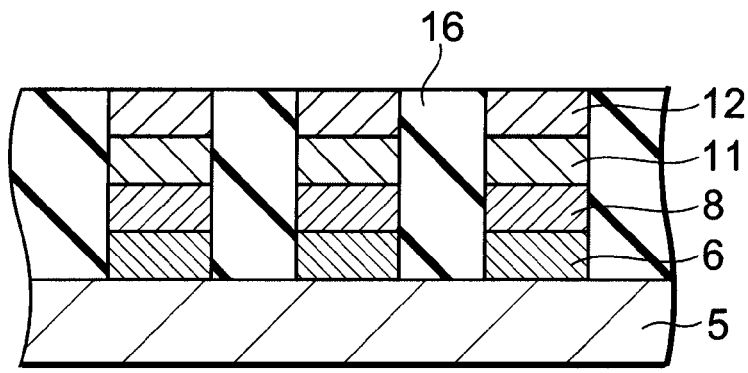

Subsequently, as shown in FIG. 13B, etching is performed along the first direction (X direction), for example, by RIE using a pattern of predetermined dimensions. Etching is performed to the depth to reach the interface between the substrate 5 and the first interconnection 6. In this manner, the first interconnection 6, the rectifying element 8, the electrode layer 11, and the recording layer 12 are patterned. When a material which is difficult to be processed is used for the electrode layer 11 (for example, metal nitride such as TaN), etching is performed to the depth of the interface between the electrode layer 11 and the recording layer 12, and subsequently, oxidation treatment can be applied to this workpiece. It is expected that the electrode layer 11 is then easy to be processed. Subsequently, etching of the electrode layer 11, the rectifying element 8, and the first interconnection 6 can be performed.

Subsequently, an insulating material is deposited on the space created by the etching using e.g., CVD to form the inter-element insulating layer 16.

Figure 13C:
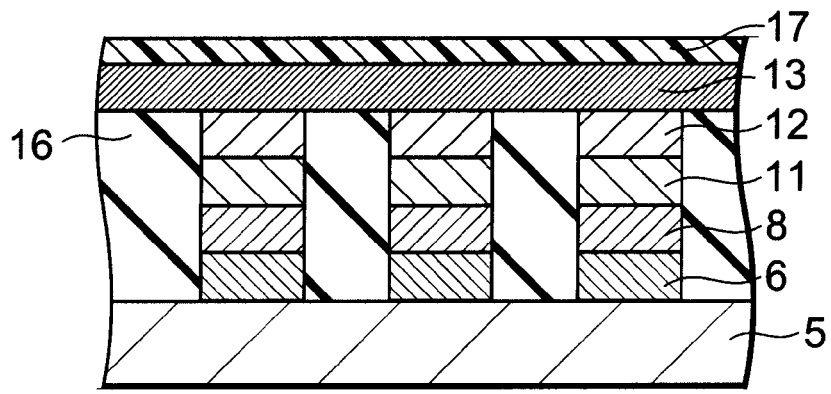

Next, as shown in FIG. 13C, the electrode layer 13 and the mask material 17 are deposited on this workpiece. For the material of the electrode layer 13, an electrical conductor relatively easy to be oxidized, and having characteristics that resistivity increases when oxidized (for example, TiN, HfN, and the like) is used. The materials for the electrode layer 11 and the electrode layer 13 may be the same. For the material of the mask material 17, the one mentioned in the first example of manufacturing method may be used.

Figure 14A:
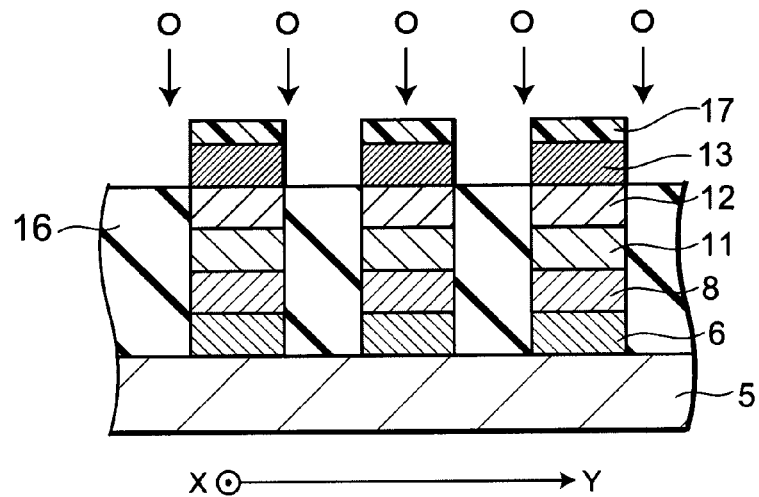
Figure 14B:
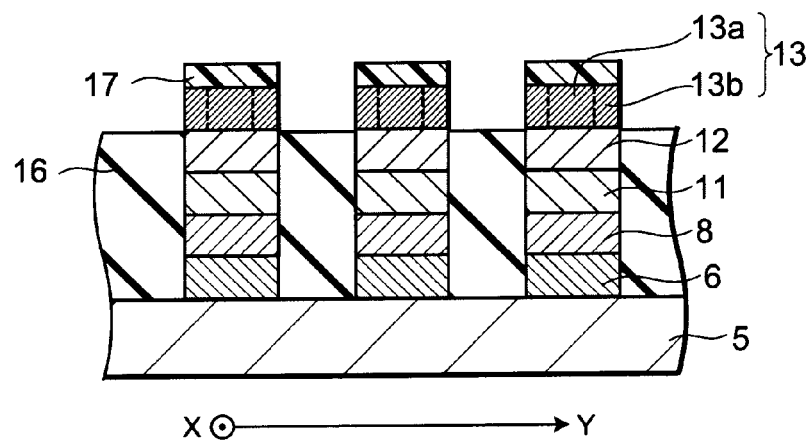

Subsequently, as shown in FIG. 14A, oxidation treatment is applied to this workpiece. Accordingly, the vicinity of the lateral side of the electrode layer 13 is oxidized. Consequently, as shown in FIG. 14B, the electrode layer 13 has a structure including the low resistivity portion 13a with a relatively low resistivity at an inner area within the main surface, and the high resistivity portion 13b with a relatively high resistivity at an outer area therewithin when viewed from the X direction.

Figure 14C:
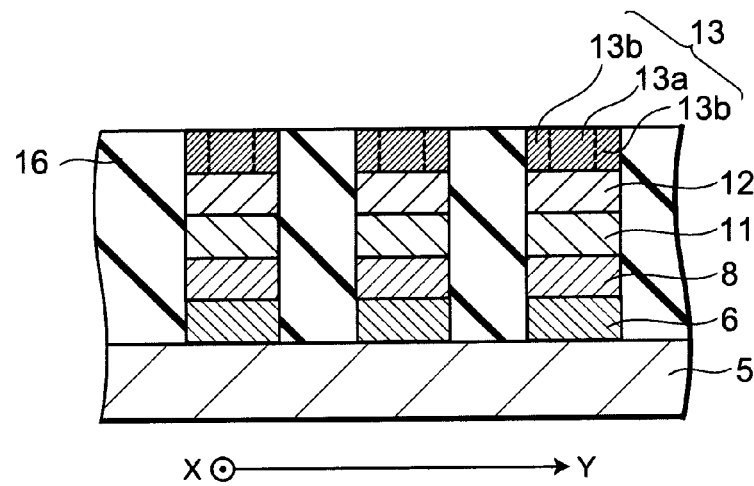

Subsequently, as shown in FIG. 14C, an insulating material is deposited on the space created by the etching using e.g., CVD to form the inter-element insulating layer 16. Next, the workpiece is planarized, for example, by CMP so that the electrode layer 13 is exposed.

Figure 15A:
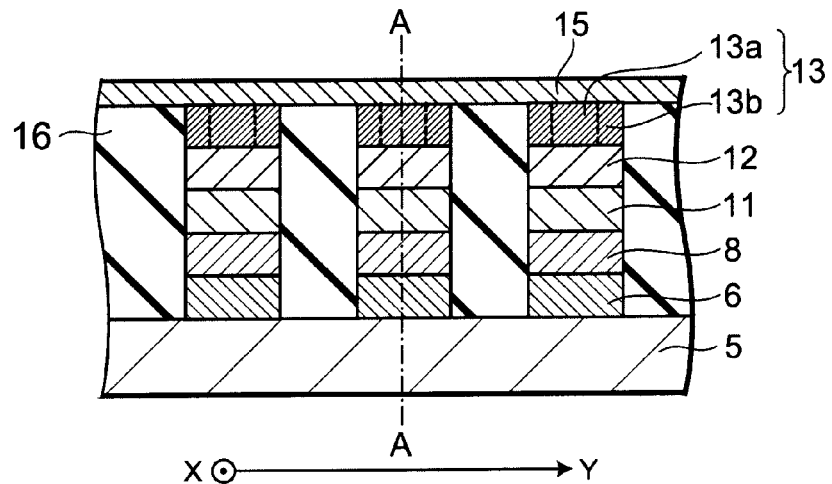

Next, as shown in FIG. 15A, a conductive material film serving as the second interconnection 15 (bit line) is deposited on this workpiece. For the material thereof, the one mentioned in the first example of manufacturing method may be used.

Figure 15B:
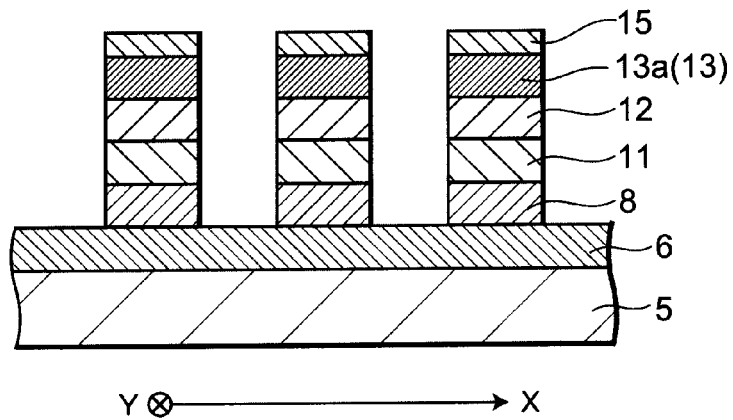

Next, description is given with reference to FIG. 15B. FIG. 15B corresponds to the cross-sectional view taken along the A-A line of FIG. 15A.

As shown in FIG. 15B, etching is performed along a second direction (Y direction), for example, by RIE using a pattern of predetermined dimensions. Etching is performed to the depth to reach the interface between the first interconnection 6 and the rectifying element 8. In this manner, the rectifying element 8, the electrode layer 11, the recording layer 12, the electrode layer 13, and the second interconnection 15 are patterned. When a material which is difficult to be processed is used for the electrode layer 11 (for example, metal nitride such as TaN), etching is performed to the depth to reach the interface between the electrode layer 11 and the recording layer 12, and subsequently, oxidation treatment may be applied to this workpiece. It is expected that the electrode layer 11 is then easy to be processed. Subsequently, etching of the electrode layer 11 and the rectifying element 8 may be performed.

Figure 15C:
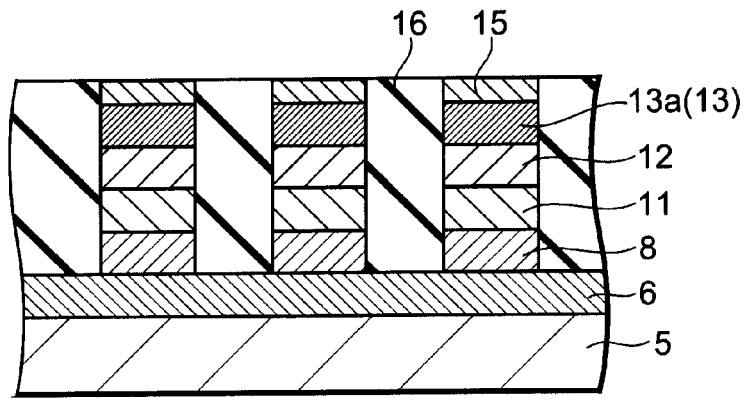

Next, as shown in FIG. 15C, an insulating material is deposited on the space created by the etching using e.g., CVD to form the inter-element insulating layer 16. Accordingly, the main part of the crosspoint type information recording and reproducing device according to the specific example 1 is formed.

If the alignment accuracy for the workpiece processing is low at the time of the first etching process described above related to FIG. 13B, and at the time of the second etching process described above related to FIG. 14A, effective size of the rectifying element 8 is decreased. Accordingly, electrical characteristics to cause a resistance change of the recording layer 12 may be varied. However, since the information recording and reproducing device is designed to supply current through the low resistivity portion 13a of the electrode layer 13 to the recording layer 12, a margin for alignment at the time of processing is provided by the width of the high resistivity portion 13b of the electrode layer 13.

Alternatively, to avoid this situation, the width of the electrode layer 11 in its main surface direction may be made different from the width of the electrode layer 13 in its main surface direction. For example, the width of the electrode layer 11 may be increased. In this case, the quantity of electric charge that flows to the recording layer 12 may be properly secured.

Figure 16:
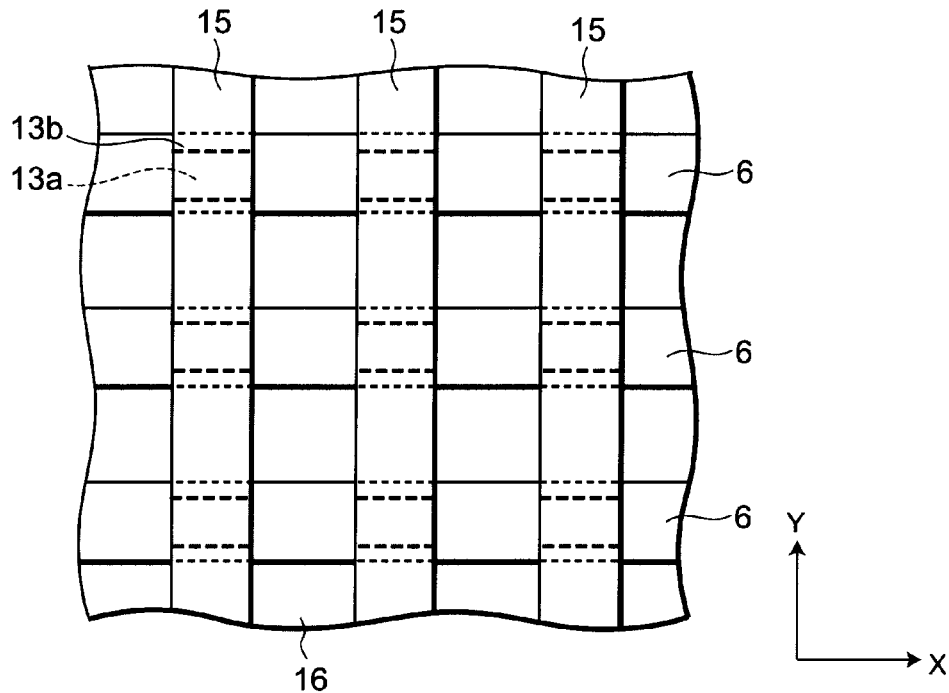
FIG. 16 is a plan view of an information recording and reproducing device produced by the second example of manufacturing method.

FIG. 16 is a plan view of an information recording and reproducing device produced by the second example of manufacturing method. As shown in FIG. 16, also in this information recording and reproducing device, a recording portion is provided at the crossing portion (crosspoint) between the first interconnection 6 and the second interconnection 15.

Also, the electrode layer 13 has a structure including the low resistivity portion 13a with a relatively low resistivity at an inner area within the main surface, and the high resistivity portion 13b with a relatively high resistivity at an outer area therewithin when viewed from the X direction. Also, the electrode layer 11 has a uniform resistivity within its main surface.

Here, unlike the information recording and reproducing device produced by the first example of manufacturing method, in the information recording and reproducing device produced by the second example of manufacturing method, the electrode layer 13 has a distribution of resistivity within its main surface when viewed from the X direction. Even in this case, the power consumption may be reduced.

On the other hand, the recording layer 12 is in contact with the electrode layer 11 having a uniform low resistance in the main surface, on the rectifying element 8 side. Thus, the recording layer 12 may secure appropriate electric current. Thereby, at the time of operation, the recording layer 12 is capable of recording information properly by changing its resistance as needed.

Thus, also with the information recording and reproducing device produced by the second example of manufacturing method, the characteristics of the embodiment described above are obtained. That is, recording of information is properly performed and reduction of the power consumption is achieved.

Next, other configurations of the embodiment are described with reference to FIGS. 17 and 18.

Figure 17:
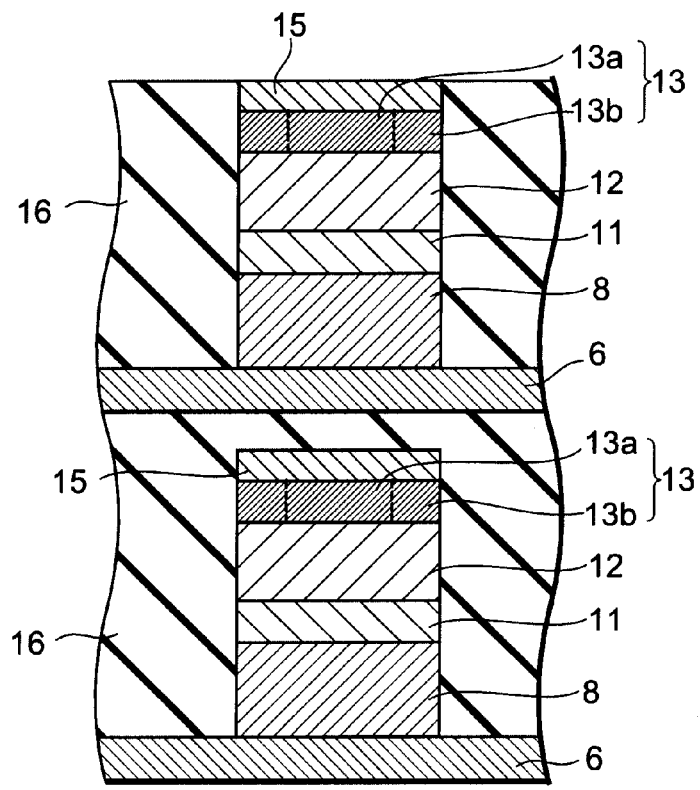
FIG. 17 is a schematic cross-sectional view showing another configuration example (the sixth specific example) of the embodiment.

FIG. 17 is a schematic cross-sectional view showing another configuration example (the sixth specific example) of the embodiment. The information recording and reproducing device according to this specific example has a configuration in which the information recording and reproducing device according to the first specific example is stacked in two layers. Respective components (the electrode layers, the recording layers, the rectifying elements, etc.) of the first and the second layers have the same vertical relationship. And also three or more layers may be stacked.

Figure 18:
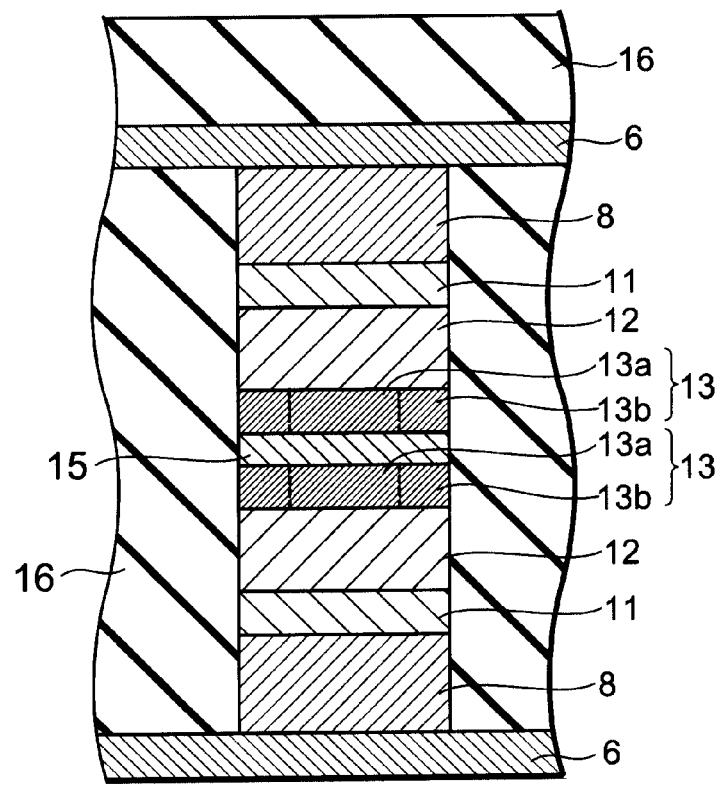
FIG. 18 is a schematic cross-sectional view showing still another configuration example (a seventh specific example) of the embodiment.

FIG. 18 is a schematic cross-sectional view showing still another configuration example (a seventh specific example) of the embodiment. The information recording and reproducing device according to this specific example also has a configuration in which the information recording and reproducing device according to the first specific example is stacked in two layers. However, respective components of the first and the second layers have vertical relationships reversed with each other, and the device has a vertically symmetric configuration with the second interconnection 15 (bit line) at the center. Also, the first and second layers share the second interconnection 15. And also, three or more layers may be stacked. In this case, the first interconnection 6 and the second interconnection 15 are alternately shared by two layers vertically adjacent to each other.

These information recording and reproducing devices may be produced by, for example, applying the first example or the second example of manufacturing method multiple times. When the first interconnection 6 or the second interconnection is shared, a part of the process to form these interconnections is reduced.

Next, another configuration of the embodiment is described with reference to FIGS. 19 and 20.

Figure 19:
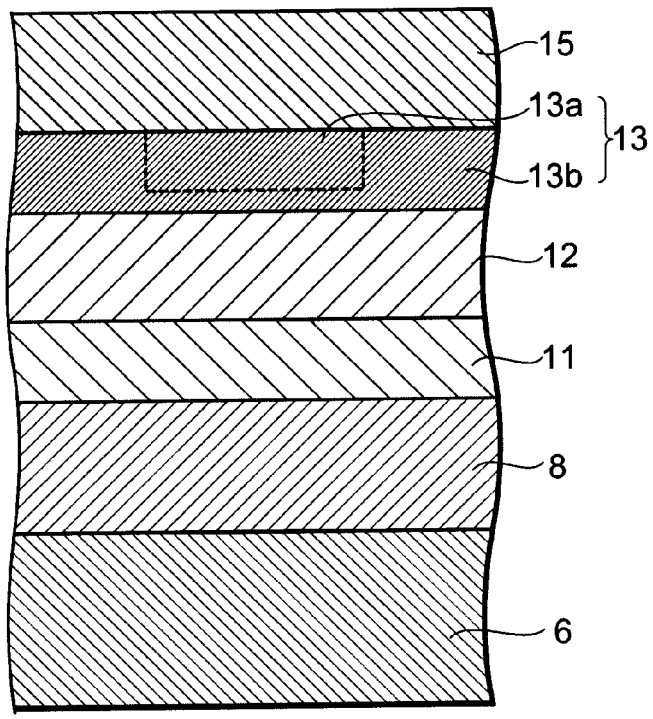
FIG. 19 is a schematic cross-sectional view showing still another configuration example (an eighth specific example) of the embodiment.

FIG. 19 is a schematic cross-sectional view showing still another configuration example (an eighth specific example)

of the embodiment. The information recording and reproducing device according to this specific example is also the information recording and reproducing device according to the first specific example; however, for its recording portion, the recording portion according to the third or fourth specific example is used. That is, when these recording portions are used, the characteristics unique to the specific example are obtained. In these recordings portions, when an electric field is applied, diffusion ion elements in the recording layer 12 (the A ion elements) move, and thereby, the resistance of the recording layer 12 is changed so that recording is performed.

Also in this specific example, the electrode layer 13 has the low resistivity portion 13a at an inner area within the main surface, and the high resistivity portion 13b at an outer area therewithin. Also, the electrode layer 11 has a uniform resistivity within its main surface. Thus, the characteristics described above are obtained also in this specific example. That is, recording of information is properly performed and reduction of the power consumption is achieved.

Also, in this specific example, the electrode layer 13 has an oxide layer (high resistivity portion 13b) in the vicinity of the interface with the recording layer 12, the oxide layer (high resistivity portion 13b) being formed with material capable of storing diffusion ion elements (the A ion elements). Thus, in this specific example, movement of diffusion ion elements is made much easier, and excellent switching characteristics are obtained.

Here, the high resistivity portion 13b provided at an outer area of the main surface, and the oxide layer (high resistivity portion 13b) provided in the vicinity of the interface with the recording layer 12 of the electrode layer 13 may be made of the same material. For such material, for example, $TiO_x$ ($0 \leq x \leq 2$) may be used. This material has a high resistivity and characteristics capable of storing diffusion ion elements (the A ion elements). In order to provide these areas (the outer area of the main surface of the electrode layer 13, and the area at the vicinity of the interface with the recording layer 12) with $TiO_x$ ($0 \leq x \leq 2$) layer, for example, a technique in which TiN is used for the material of the electrode layer 13 (the low resistivity portion 13a), and the surface of the electrode layer 13 is oxidized at the time of manufacturing may be employed, and the detail of the technique is described later.

Alternatively, in the case where the recording layer 12 is composed of an oxide, the oxide layer (high resistivity layer 13b) may be formed by moving oxygen atoms from the recording layer 12 to the electrode layer 13 at the interface between the recording layer 12 and the electrode layer 13.

Next, the fact that an oxide layer (ion storage area) is preferably provided at either one of the electrode layer 13 and the electrode layer 11 is described with reference to FIG. 20.

Figure 20:
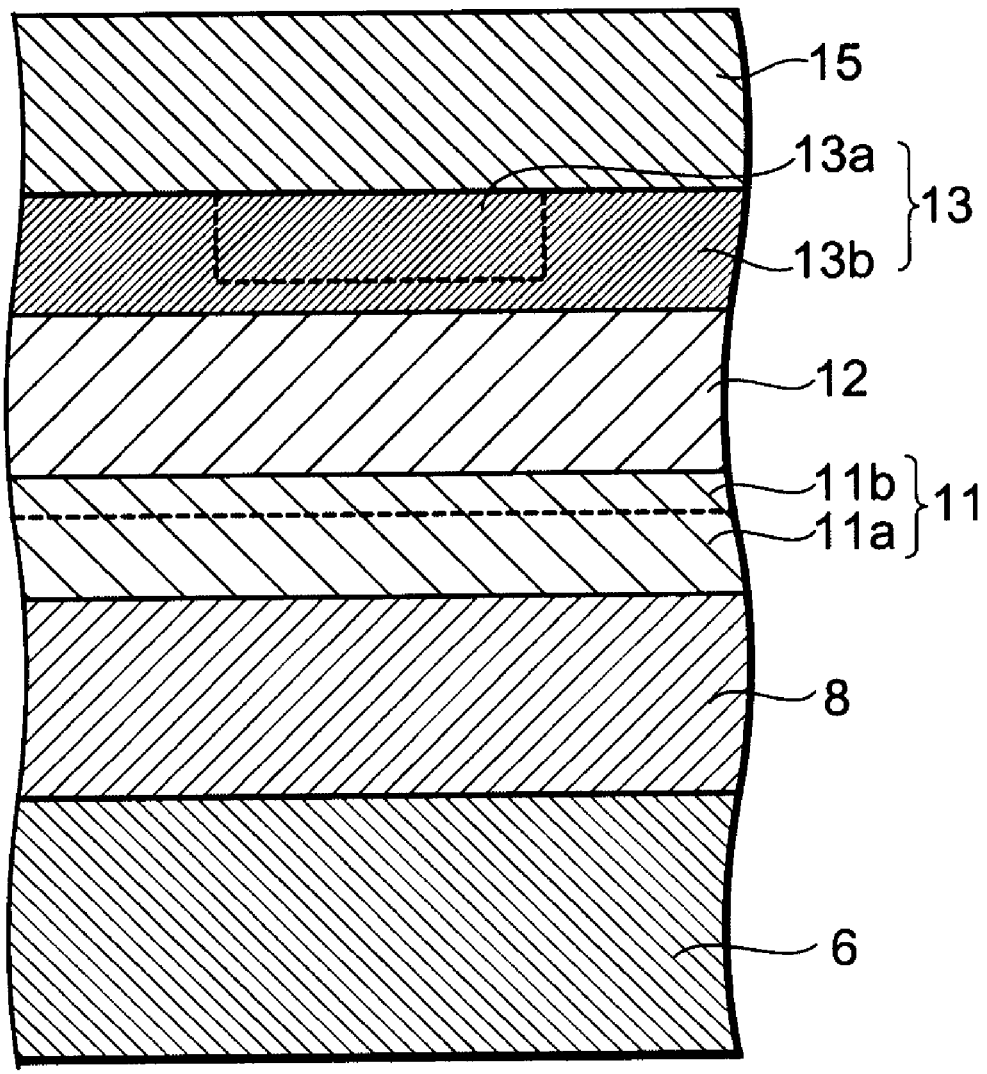
FIG. 20 is a schematic cross-sectional view of an information recording and reproducing device according to a comparative example contrasted with the eighth specific example.

FIG. 20 is a schematic cross-sectional view of an information recording and reproducing device according to a comparative example contrasted with the eighth specific example. In this device, the oxide layer (high resistivity layer 13b) is provided in the vicinity of the interface of the electrode layer 13 with the recording layer 12, and an oxide layer (high resistivity portion 11b) is further provided in the vicinity of the interface of the electrode layer 11 with the recording layer 12. As an example, the case where TiN is used for the material of both the electrode layer 11 and the electrode layer 13 is considered.

In the case where a TiN layer and a Ti oxide layer are stacked, switching may be triggered by a relatively small voltage according to the polarity of applied voltage. Specifically, when the Ti oxide layer is negatively charged, the resistance value is decreased, and conversely when the Ti oxide layer is positively charged, the resistance value is increased.

Thus, in a memory cell with the structure shown in FIG. 20, for example, if a voltage is applied to make the recording layer 12 have a low resistance state, i.e., to make the second interconnection 15 serve as the cathode, the resistance values of the electrode layers 13 and 11 change as follows. For the electrode layer 13, its resistance value is increased because in this layer, the oxide layer (high resistivity portion 13b), which is a Ti oxide layer ($TiO_x$ ($0 \leq x \leq 2$) layer), is on the anode side, and the low resistivity portion 13a, which is a TiN layer, is on the cathode side. On the other hand, as for the electrode layer 11, its resistance value is decreased because in this layer, the oxide layer (high resistivity portion 11b), which is a Ti oxide layer ($TiO_x$ ($0 \leq x \leq 2$) layer), is on the cathode side, and the low resistivity portion 11a, which is a TiN layer, is on the anode side. In the case where a reversed voltage is applied, reversed phenomenon (the electrode layer 13 is in a low resistance state, and the electrode layer 11 is in a high resistance state) occurs.

In this manner, if both the electrode layer 13 and the electrode layer 11 have respective oxide layers at their interfaces with the recording layer 12, switching contrary to what is intended may be performed by either of these layers. Therefore, the oxide layer (ion storage area) is preferably provided only at either one of the electrode layer 13 and the electrode layer 11. Specifically, the oxide layer is preferably provided only at the electrode layer serving as the anode when a voltage is applied so that the recording layer 12 in a low resistance state.

Next, an example of a manufacturing method (a third example of a manufacturing method) for a crosspoint type information recording and reproducing device according to the specific example 1 is described with reference to FIGS. 21 to 26. In this example of manufacturing method, the electrode layer 11 may be a material relatively easily oxidatized or a material relatively resistant to oxidation. Especially, the materials for the electrode layer 13 and the electrode layer 11 may be the same.

Figure 21:
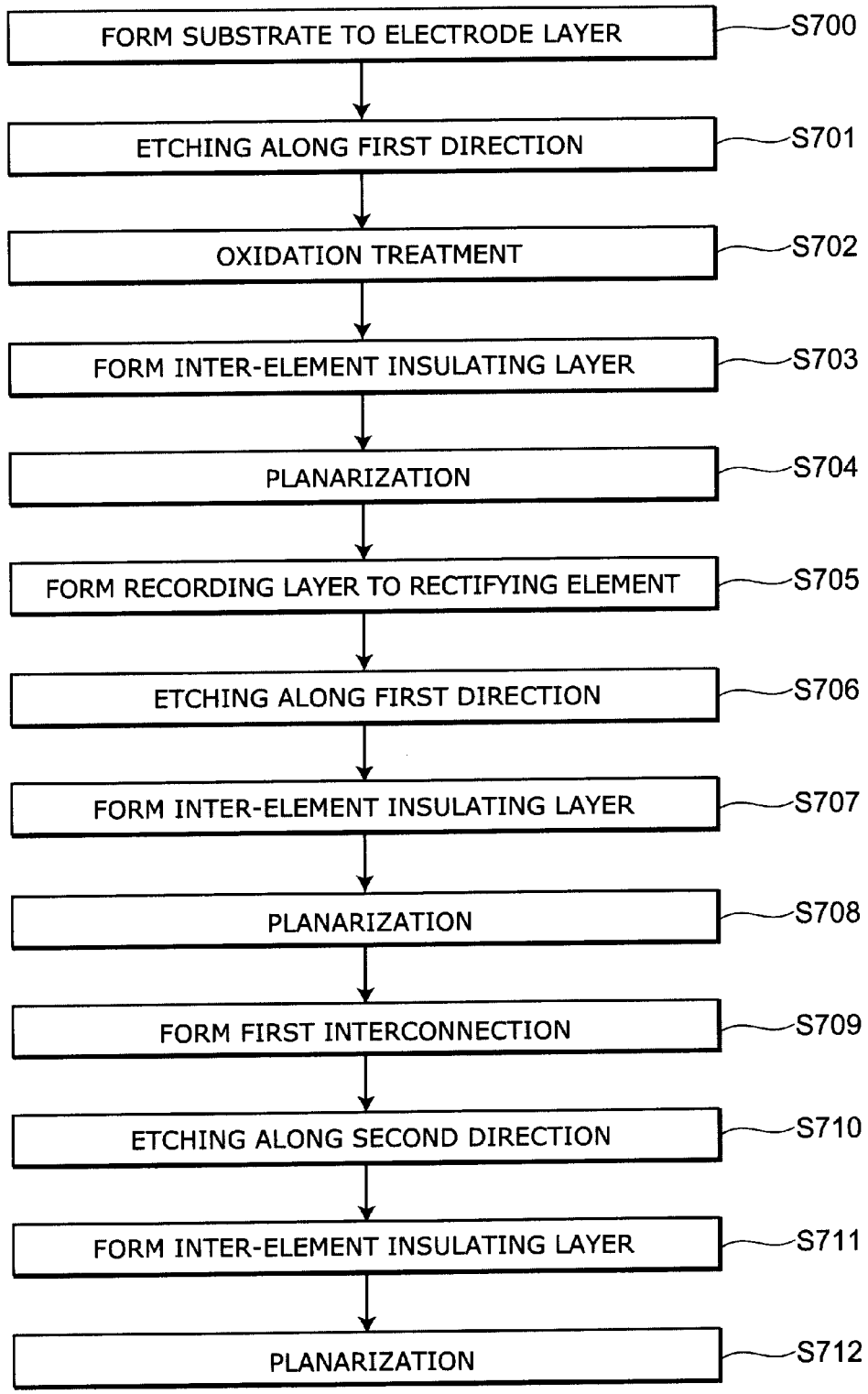
FIG. 21 is a flow diagram showing a third example of manufacturing method.

FIG. 21 is a flow diagram for showing the third example of manufacturing method. FIGS. 22(a) to 22(d), FIGS. 23(a) to 23(c), FIGS. 24(a) to 24(c), and FIG. 25 are schematic process cross-sectional views for showing the third example of manufacturing method. In the following, description is given with reference to FIGS. 22A to 22D, FIGS. 23A to 23C, FIGS. 24A to 24C, and FIG. 25.

Figure 22A:
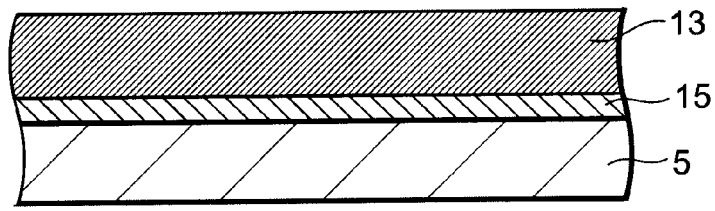
FIG. 22A to FIG. 24C, and FIG. 25 are schematic process cross-sectional views showing the third example of manufacturing method.
Figure 22B:
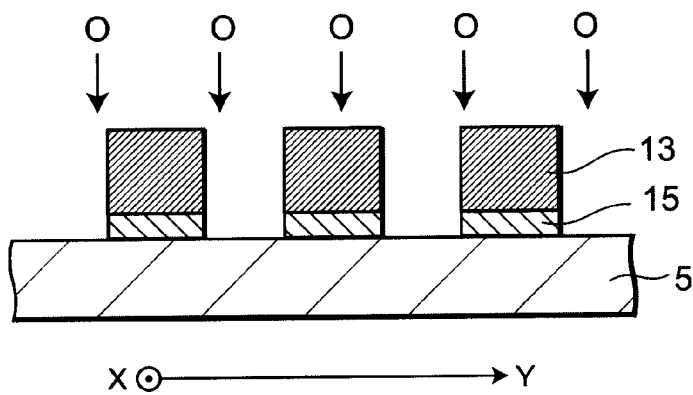

First, as shown in FIG. 22A, the substrate 5, the second interconnection 15, and the electrode layer 13 are deposited in this order. For the material of those, those mentioned in the first example of manufacturing method may be used. Subsequently, as shown in FIG. 22B, etching is performed along the first direction (X direction), for example, by RIE using a pattern of predetermined dimensions. Etching is performed to the depth to reach the interface between the substrate 5 and the second interconnection 15. In this manner, the second interconnection 15 and the electrode layer 13 are patterned.

Figure 22C:
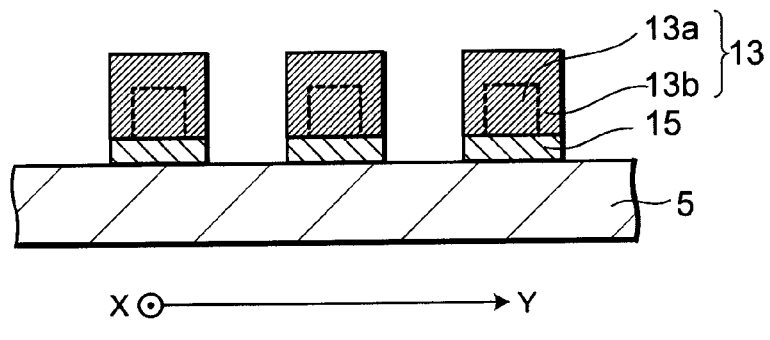

Next, oxidation treatment is applied to this workpiece. Accordingly, the vicinity of the surface of the electrode layer 13 is oxidized. Consequently, as shown in FIG. 22C, the electrode layer 13 has a structure including the low resistivity portion 13a at an inner area within the main surface, and the high resistivity portion 13b at an outer area therewithin.

Figure 22D:
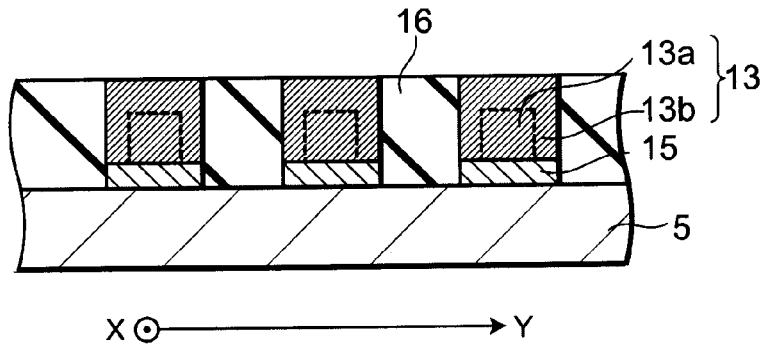

Subsequently, as shown in FIG. 22D, an insulating material is deposited on the space created by the etching using e.g., CVD to form the inter-element insulating layer 16. Next, the workpiece is planarized, for example, by CMP. Here, this planarization processing is performed so that the low resistivity portion 13a is not exposed. Consequently, the electrode layer 13 has a structure including the low resistivity portion 13a with a relatively low resistivity at an inner area within the main surface, and the high resistivity portion 13b with a relatively high resistivity at an outer area therewithin when viewed from the X direction, and further including an oxide layer (high resistivity portion 13b) in the vicinity of the interface with the recording layer 12.

Figure 23A:
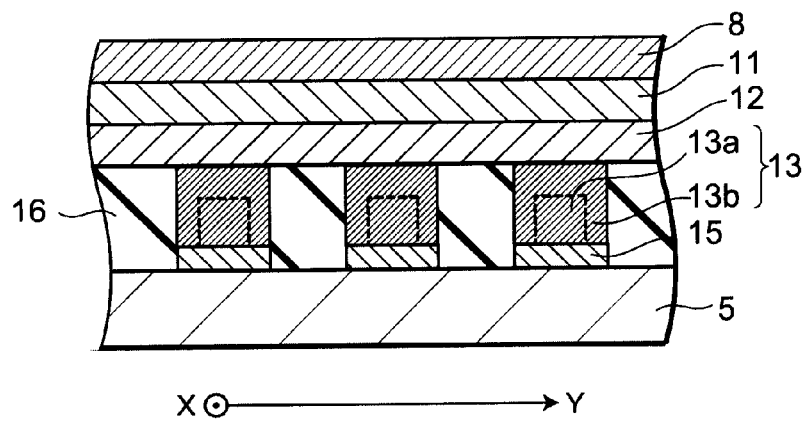

Subsequently, as shown in FIG. 23A, the recording layer 12, the electrode layer 11, and the rectifying element 8 are deposited on this workpiece. For the material of those, those mentioned in the first example or the second example of manufacturing method may be used. The electrode layer 11 may be a material relatively easily oxidized or a material relatively resistant to oxidation.

Figure 23B:
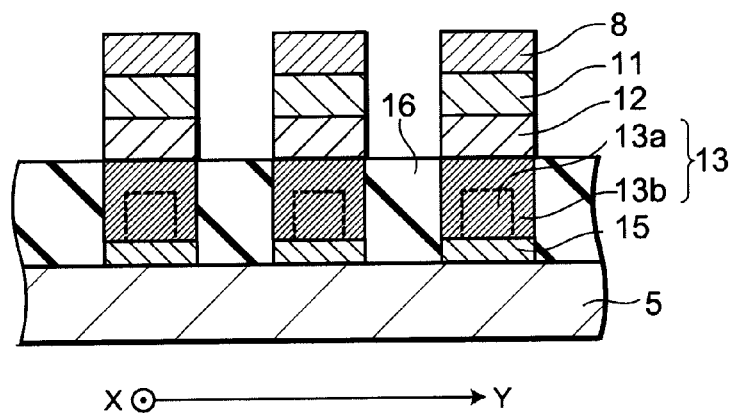

Subsequently, as shown in FIG. 23B, etching is performed along the first direction (X direction), for example, by RIE using a pattern of predetermined dimensions. Etching is performed to the depth to reach the interface between the electrode layer 13 and the recording layer 12. In this manner, the recording layer 12, the electrode layer 11, and the rectifying element 8 are patterned. When a material which is difficult to be processed is used for the electrode layer 11 (for example, metal nitride such as TaN), etching is performed to the depth to reach the interface between the electrode layer 11 and the rectifying element 8, and subsequently, oxidation treatment may be applied to this workpiece. It is expected that the electrode layer 11 is then easy to be processed. Subsequently, etching of the electrode layer 11 and the recording layer 12 may be performed.

Figure 23C:
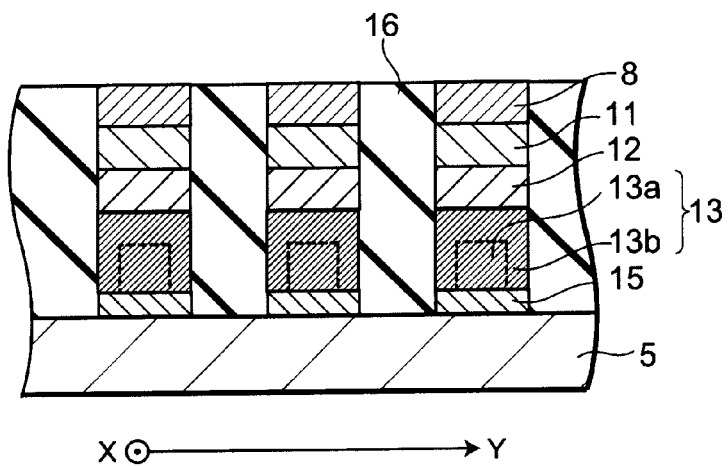

Subsequently, as shown in FIG. 23C, an insulating material is deposited on the space created by the etching using e.g., CVD to form the inter-element insulating layer 16. Next, the workpiece is planarized, for example, by CMP.

Figure 24A:
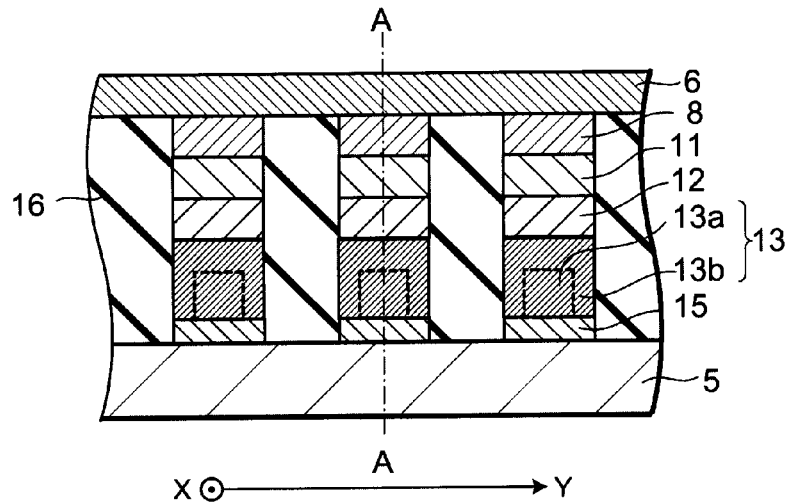

Subsequently, as shown in FIG. 24A, a film serving as the first interconnection 6 is deposited on this workpiece. For the material thereof, the one mentioned in the first example of manufacturing method may be used.

Figure 24B:
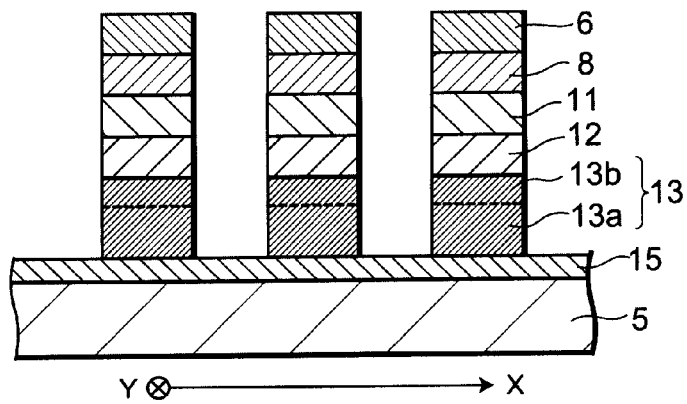

Next, description is given with reference to FIG. 24B. FIG. 24B corresponds to the cross-sectional view taken along the A-A line of FIG. 24A.

As shown in FIG. 24B, etching is performed along the second direction (Y direction), for example, by RIE using a pattern of predetermined dimensions. Etching is performed to the depth to reach the interface between the second interconnection 15 and the electrode layer 13. In this manner, the electrode layer 13, the recording layer 12, the electrode layer 11, the rectifying element 8, and the first interconnection 6 are patterned. When a material which is difficult to be processed is used for the electrode layer 11 (for example, metal nitride such as TaN), etching is performed to the depth to reach the interface between the electrode layer 11 and the rectifying element 8, and subsequently, oxidation treatment may be applied to this workpiece. It is expected that the electrode layer 11 is then easy to be processed. Subsequently, etching of the electrode layer 11, the rectifying element 8, and the first interconnection 6 may be performed.

Figure 24C:
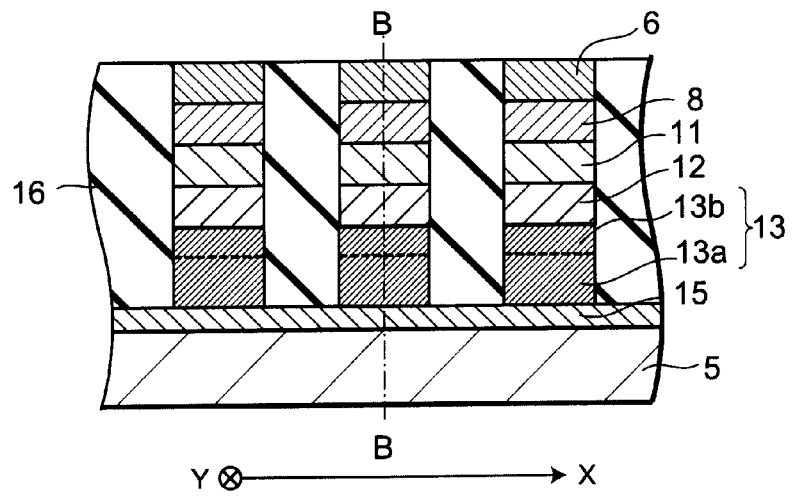
Figure 25:
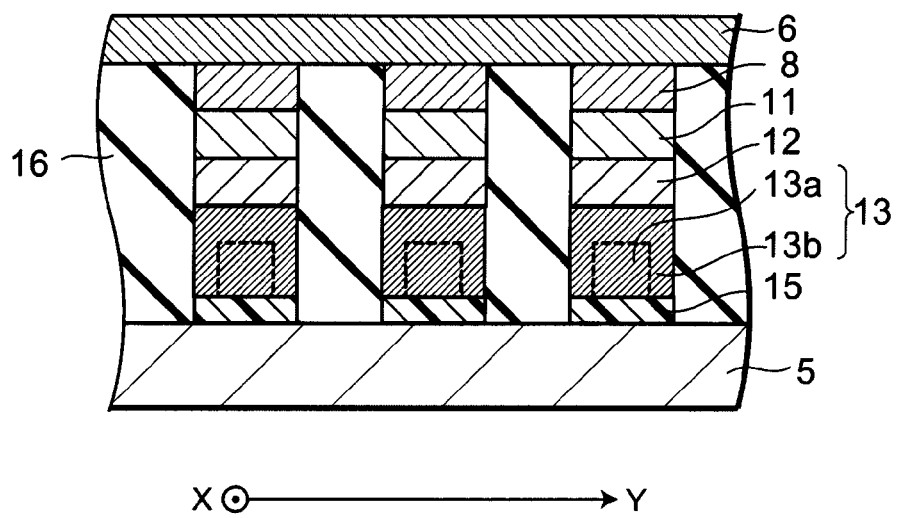

Subsequently, as shown in FIG. 24C, an insulating material is deposited on the space created by the etching using e.g., CVD to form the inter-element insulating layer 16. Next, the workpiece is planarized, for example, by CMP. Accordingly, the main part of the crosspoint type information recording and reproducing device according to the eight specific example is formed. FIG. 25 corresponds to the cross-sectional view taken along the B-B line of FIG. 24C.

Similarly to the second example of manufacturing method, it is preferable to perform alignment with high accuracy for processing workpiece at the time of the first etching process described above related to FIG. 22B, and at the time of the second etching process described above related to FIG. 23B. For this treatment, the detail is as described above related to the second example of manufacturing method.

Figure 26:
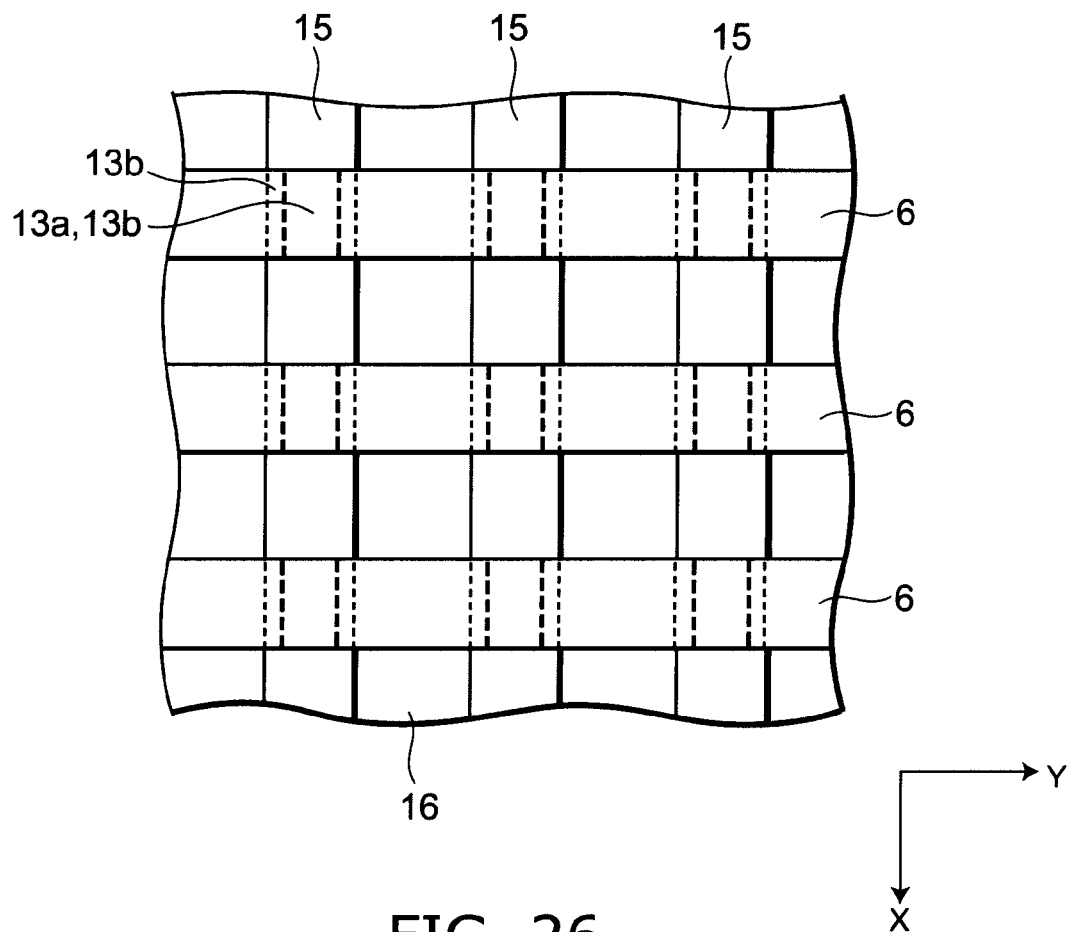
FIG. 26 is a plan view of the information recording and reproducing device produced by the third example of manufacturing method.

FIG. 26 is a plan view of the information recording and reproducing device produced by the third example of manufacturing method. As shown in FIG. 26, also in this information recording and reproducing device, a recording portion is provided at the crossing portion (crosspoint) between the first interconnection 6 and the second interconnection 15.

Also, the electrode layer 13 has a structure including the low resistivity portion 13a with a relatively low resistivity at an inner area within the main surface, and the high resistivity portion 13b with a relatively high resistivity at an outer area therewithin when viewed from the X direction, and further including the oxide layer (high resistivity portion 13b) in the vicinity of the interface with the recording layer 12. Also, the electrode layer 11 has a uniform resistivity within its main surface.

Here, similarly to that produced by the second example of manufacturing method, the information recording and reproducing device produced by the third example of manufacturing method has a distribution of resistivity within the main surface when viewed from one direction (the X direction); still, even in this case, the characteristics of the embodiment may be obtained as described above related to the second example of manufacturing method.

The characteristics described above are obtained by the information recording and reproducing device produced in the third example of manufacturing method. That is, recording of information is properly performed and reduction of the power consumption is achieved, while movement of diffusion ion elements (the A ion elements) in the recording layer 12 is made easy, and stable operational characteristics are achieved.

Moreover, if the workpiece is planarized so that the low resistivity portion 13a is exposed in the planarization process described above related to FIG. 22D, the information recording and reproducing device according to the first example may be obtained.

The above is an example of a manufacturing method, and as described above, in the case where the recording layer 12 is composed of an oxide, the oxide layer (high resistivity portion 13b) may be formed by moving oxygen atoms from the recording layer 12 to the electrode layer 13 at the interface between the recording layer 12 and the electrode layer 13. In this case, in the process shown by FIG. 22A, the mask material 17 is deposited on the electrode layer 13, and subsequently, the etching process and the oxidation treatment process shown by FIG. 22B may be performed. Accordingly, the oxidization process is developed only from the lateral side of the electrode layer 13, whereby a possibility of oxidization of the entire electrode layer 13 contrary to what is intended is reduced, and formation of the low resistivity portion 13a is secured. Also, in the planarization process described above related to FIG. 22D, area to be polished is reduced.

Next, other configurations of the embodiment are described with reference to FIGS. 27 and 28.

Figure 27:
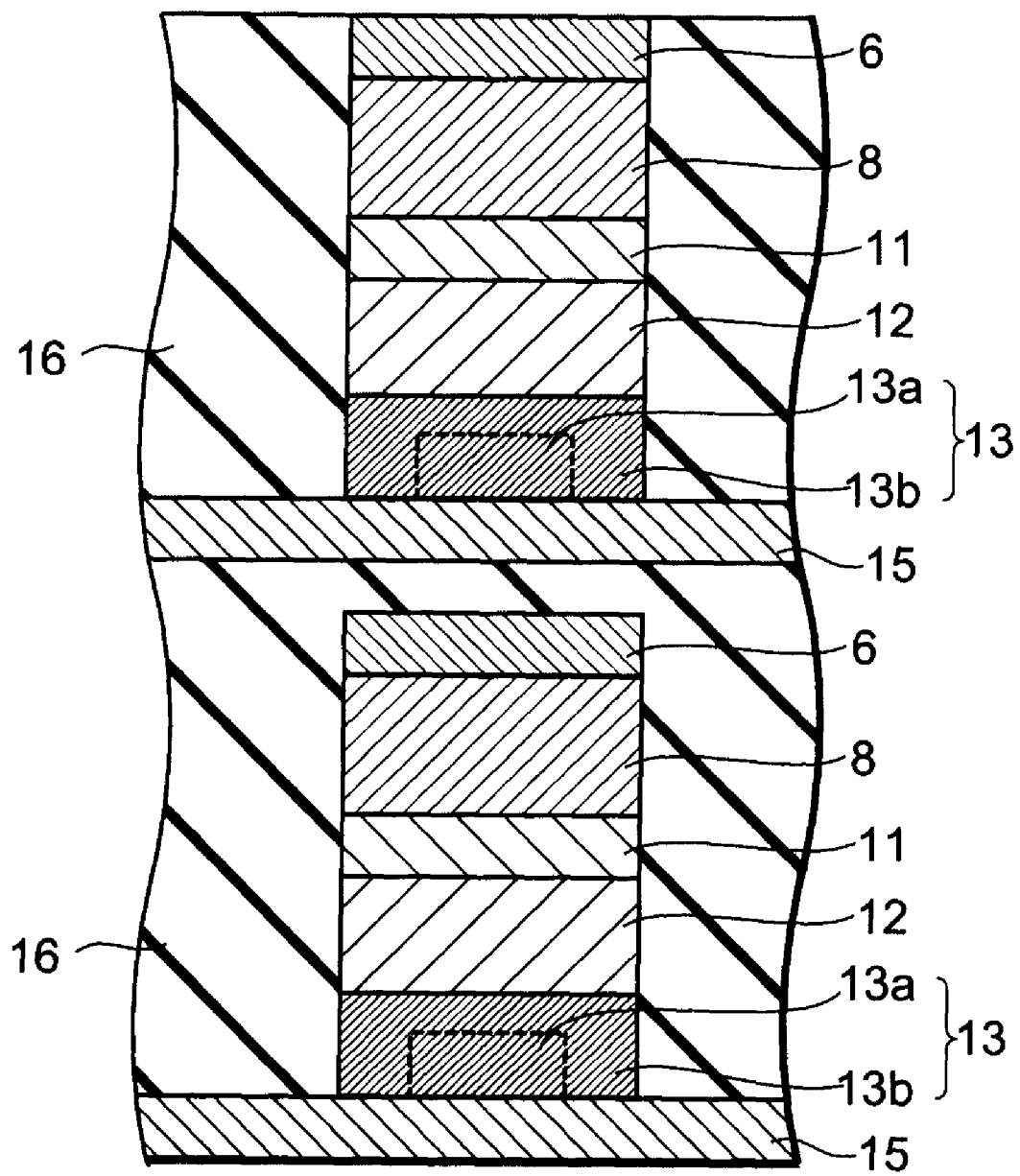
FIG. 27 is a schematic cross-sectional view showing an example (a ninth example) of another configuration of the embodiment.

FIG. 27 is a schematic cross-sectional view showing an example (a ninth example) of another configuration of the embodiment. The information recording and reproducing device according to this specific example has a configuration in which the information recording and reproducing device according to the eighth specific example is stacked in two layers. However, the configuration has reversed vertical relationship compared to the one in the schematic cross-sectional view shown in FIG. 19

Respective components of the first and the second layers have the same vertical relationship. And also, three or more layers may be stacked.

Figure 28:
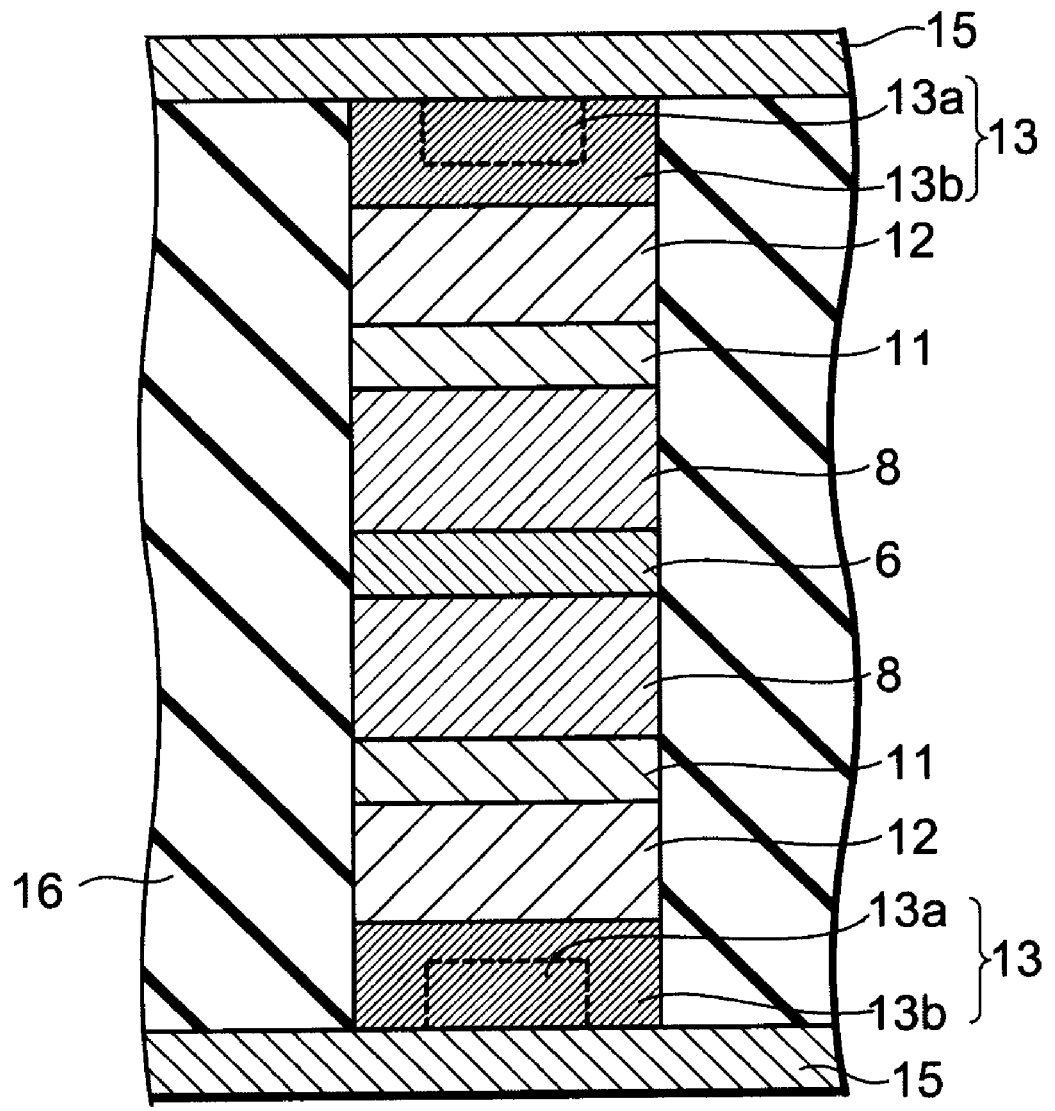
FIG. 28 is a schematic cross-sectional view showing still another configuration example (a tenth specific example) of the embodiment.

FIG. 28 is a schematic cross-sectional view showing still another configuration example (a tenth specific example) of the embodiment. The information recording and reproducing device according to this specific example also has a configuration in which the information recording and reproducing device according to the eighth specific example is stacked in two layers. However, respective components of the first and the second layers have vertical relationships reversed from each other, and the device has a vertically symmetric configuration with the first interconnection 6 at the center. Also, the first and second layers share the first interconnection 6. And also, three or more layers may be stacked. In this case, the first interconnection 6 and the second interconnection 15 are alternately shared by two layers vertically adjacent to each other.

These information recording and reproducing devices may be produced by, for example, applying the third example of manufacturing method multiple times. When the first interconnection 6 or the second interconnection 15 is shared, a part of the process to form these interconnections is reduced.

In the following, an application example of an information recording and reproducing device according to the embodiment is described.

The following three cases of application of the recording portion according to the embodiment is described: the case of application to a semiconductor memory; the case of application to a probe memory; and the case of application to a flash memory.

(Semiconductor Memory)

First, an information recording and reproducing device combined with a semiconductor device is described.

Figure 29:
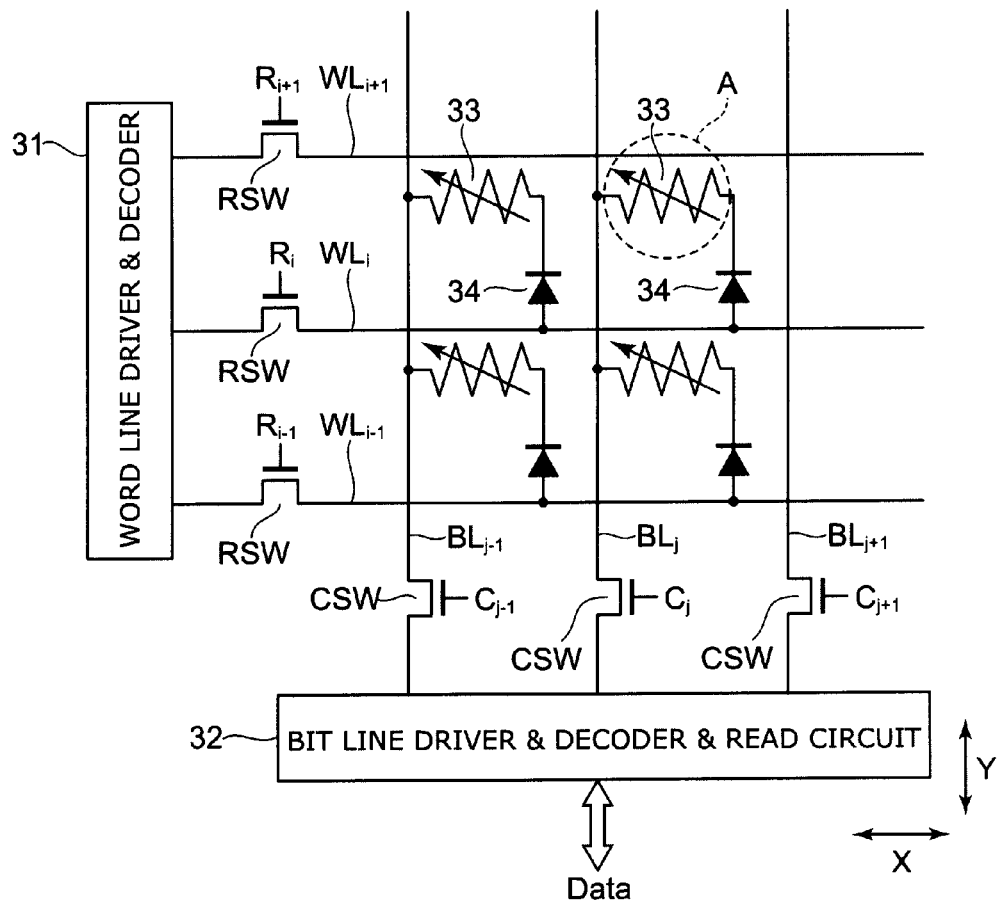
FIG. 29 is a schematic diagram showing a crosspoint type semiconductor memory including a recording portion of the embodiment.

FIG. 29 is a schematic diagram showing a crosspoint type semiconductor memory including a recording portion of the embodiment.

The word lines $WL_{i-1}$, $WL_i$, and $WL_{i+1}$ extend in the direction of X, and the bit lines $BL_{j-1}$, $BL_j$, and $BL_{j+1}$ extend in the direction of Y.

One ends of the word lines $WL_{i-1}$, $WL_i$, $WL_{i+1}$ are connected to a word line driver & decoder 31 through a MOS transistor RSW as a selection switch, and one ends of the bit lines $BL_{j-1}$, $BL_j$, and $BL_{j+1}$ are connected to a bit line driver & decoder & read circuit 32 through a MOS transistor CSW as a selection switch.

Selection signals $R_{i-1}$, $R_i$, $R_{i+1}$ to select one word line (row) are inputted to the gate of the MOS transistor RSW, and selection signals $C_{i-1}$, $C_i$, $C_{i+1}$ to select one bit line (column) are inputted to the gate of the MOS transistor CSW.

Memory cells 33 are placed at the respective intersecting portions between the word lines $WL_{i-1}$, $WL_i$, $WL_{i+1}$ and the bit lines $BL_{j-1}$, $BL_j$, $BL_{j+1}$. This is so-called crosspoint type cell array structure.

Each memory cell 33 is provided with a diode 34 for suppressing sneak current at the time of recording and reproducing.

Figure 30:
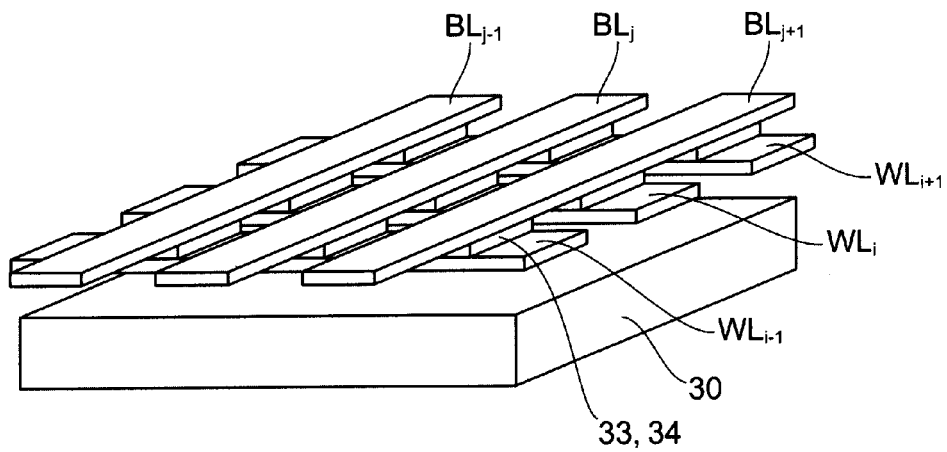
FIG. 30 is a schematic view showing the structure of a memory cell array portion of the semiconductor memory shown in FIG. 29.

FIG. 30 is a schematic view showing the structure of the memory cell array portion of the semiconductor memory shown in FIG. 29.

On the semiconductor chip 30, the word lines $WL_{i-1}$, $WL_i$, $WL_{i+1}$ and the bit lines $BL_{j-1}$, $BL_j$, $BL_{j+1}$ are arranged, and the memory cells 33 and the diodes 34 are placed at the respective intersecting portions of these interconnection. And also, a barrier layer, which is not shown, may be provided between the diodes 34 and the word lines ($WL_i$, etc.).

One feature of such crosspoint type cell array structure is its advantage of high integration because a MOS transistor is not needed to be individually connected to each memory cell 33. For example, as shown in FIGS. 31 and 32, the memory cells 33 may be stacked to form a memory cell array in 3-D structure.

The memory cell 33 having the recording layer of the embodiment is configured by, for example, a stacked structure (recording layer, electrode layer, protective layer, peak layer, etc.) as shown in FIG. 1 and FIG. 3. One memory cell 33 stores 1 bit data. Also, the diodes 34 are arranged between the word line WLi and the memory cells 33. And also, as described above, a barrier layer, which is not shown, may be provided between the diodes 34 and the word lines ($WL_i$, etc.).

Figure 31:
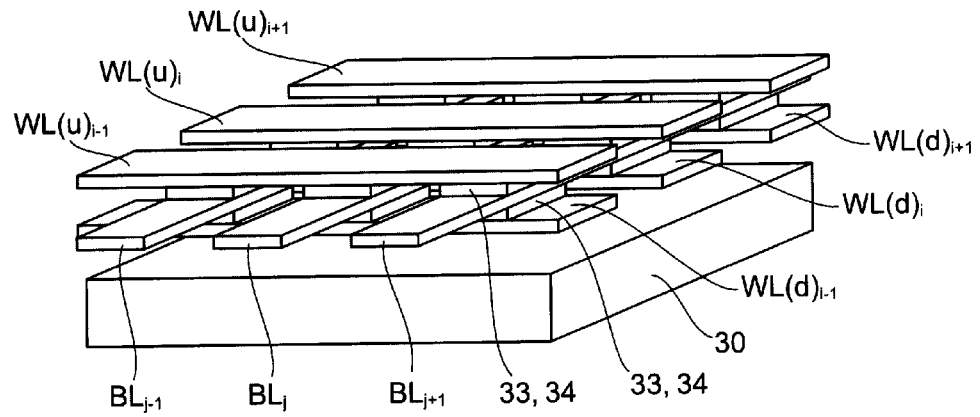
FIG. 31 and FIG. 32 are schematic views showing other specific examples of memory cell array.
Figure 32:
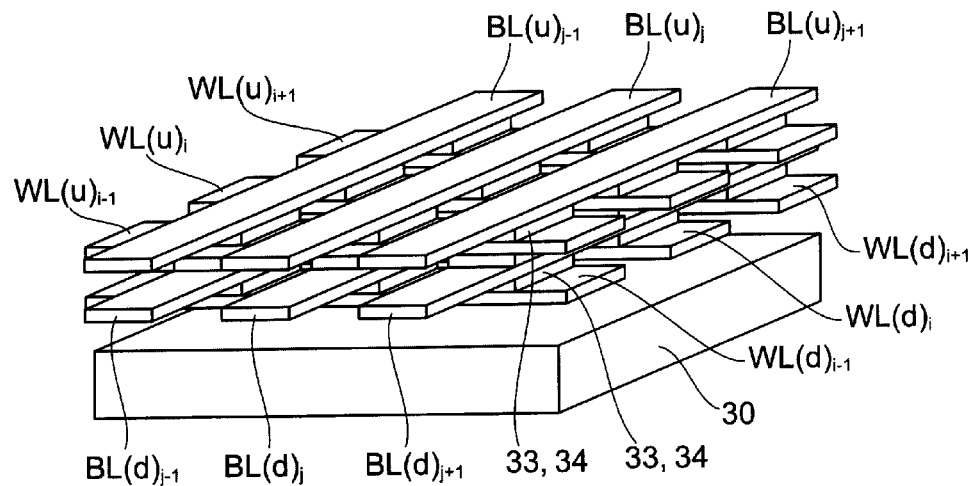

FIG. 31 and FIG. 32 are schematic views showing other specific examples of memory cell array.

In the specific example shown in FIG. 31, the word lines $WL_{i-1}$, $WL_i$, $WL_{i+1}$ extending in the X direction are provided above and below the bit lines $BL_{j-1}$, $BL_j$, $BL_{j+1}$ extending in the Y direction, respectively. And the memory cells 33 and 34 are disposed at respective crosspoints between these bit and word lines. That is, the configuration allows each bit line to be shared by its above and below memory cells. And also, a barrier layer, which is not shown, may be provided between the diodes 34 and the word lines ($WL(d)_i$, etc.), and between the diodes 34 and the bit lines ($BL_j$ etc.).

In the specific example shown in FIG. 32, the device has a configuration in which the word lines $WL_{i-1}$, $WL_i$, $WL_{i+1}$ extending in the X direction and the bit lines $BL_{j-1}$, $BL_j$, $BL_{j+1}$ extending in the Y direction are alternately stacked. And the memory cells 33 and 34 are disposed at respective crosspoints between these bit and word lines. That is, the configuration allows each bit line and word line to be shared by its above and below memory cells. And also, a barrier layer, which is not shown, may be provided between the diodes 34 and the word lines ($WL(d)_i$, etc.), or between the diodes 34 and the bit lines ($BL(d)_j$), and between the diodes 34 and the word lines ($WL(u)_i$, etc.)

By employing the stacked structure illustrated in FIG. 31 and FIG. 32, recording density may be increased.

Thus, the information recording and reproducing device includes a first information recording and reproducing section; and a second information recording and reproducing section being stacked with the first information recording and reproducing section. The first information recording and reproducing section includes a first stacked body. The first stacked body includes a first layer; a second layer; and a first recording layer. The first layer, the second layer, and the first recording layer are stacked in a stacking direction from the first information recording and reproducing section to the second information recording and reproducing section. The first recording layer is provided between the first layer and the second layer. The first recording layer is capable of reversibly transitioning between a first state and a second state with a resistance higher than a resistance in the first state by a current supplied to the first recording layer via the first layer and the second layer. One of the first layer and the second layer includes a first resistivity distribution layer provided within a plane perpendicular to the stacking direction. The first resistivity distribution layer includes a first low resistivity portion and a first high resistivity portion. A resistivity of the first high resistivity portion is higher than a resistivity of the first low resistivity portion. The first low resistivity portion contains a transition element identical to a transition element contained in the first high resistivity portion. The first high resistivity portion containing a transition element identical to a transition element contained in the first low resistivity portion. The second information recording and reproducing section includes a second stacked body. The second stacked body includes: a third layer; a fourth layer; and a second recording layer. The third layer, the fourth layer, and the second recording layer are stacked in the stacking direction. The second recording layer is provided between the third layer and the fourth layer. The second recording layer is capable of reversibly transitioning between a third state and a fourth state with a resistance higher than a resistance in the third state by a current supplied to the second recording layer via the third layer and the fourth layer. One of the third layer and the fourth layer includes a second resistivity distribution layer provided within a plane perpendicular to the stacking direction. The second resistivity distribution layer includes a second low resistivity portion and a second high resistivity portion. A resistivity of the second high resistivity portion is higher than a resistivity of the second low resistivity portion. The second low resistivity portion contains a transition element identical to a transition element contained in the second high resistivity portion. The second high resistivity portion contains a transition element identical to a transition element contained in the second low resistivity portion.

A stacking order of the first layer, the first recording layer, and the second layer in the first stacked body may be identical to a stacking order of the third layer, the second recording layer, and the fourth layer in the second stacked body. The first layer may include the first resistivity distribution layer and the third layer may include the second resistivity distribution layer. For example, a material of the third layer may be identical to a material of the first layer and a thickness of the third layer may be identical to a thickness of the first layer. Further, a material of the fourth layer may be identical to a material of the second layer and a thickness of the fourth layer may be identical to a thickness of the second. Using the same material and thickness, productivity of the information recording and reproducing device can be improved.

Alternatively, a stacking order of the first layer, the first recording layer, and the second layer in the first stacked body may be opposite to a stacking order of the third layer, the second recording layer, and the fourth layer in the second stacked body. The first layer may include the first resistivity distribution layer and the third layer may include the second resistivity distribution layer. For example, a material of the third layer may be identical to a material of the first layer and a thickness of the third layer may be identical to a thickness of the first layer. Further, a material of the fourth layer may be identical to a material of the second layer and a thickness of the fourth layer may be identical to a thickness of the second. Using the same material and thickness, productivity of the information recording and reproducing device can be improved.

Next, recording and reproducing operations of a semiconductor memory using the recording layer of the embodiment are described with reference to FIG. 29 and FIG. 30.

Here, the memory cell 33 surrounded by the dotted line A in FIG. 29 is selected, and the case where recording and reproducing operations are performed on the memory cell is described.

(In the Case Where the Recording Layer Described Above Related to the Third Specific Example is Used)

Recording (set operation) is performed by applying a voltage to the selected memory cell 33 to generate a potential gradient in the memory cell 33 so as to pass current pulses. Thus, for example, a state in which the electric potential of the word line $WL_i$ is relatively lower than that of the bit line $BL_j$ is set. If the bit line $BL_j$ is at a fixed potential (for example, earth potential), a negative potential may be applied to the word line $WL_i$.

At this point, in the selected memory cell 33 surrounded by the dotted line A, some of the A1 ions move to the word line (cathode) $WL_i$ so that the number of the A ions in the crystal is made relatively lower than that of the X ions. Also, the A ions which have moved to the word line $WL_i$ receive electrons therefrom, and are deposited as metal.

In the selected memory cell 33 surrounded by the dotted line A, the A ions are in excess, and consequently the valencies of the A or M ions in the crystal are increased. That is, the selected memory cell 33 surrounded by the dotted line A is made to have electrical conductivity by injection of carriers due to a phase change. Thus, the recording (set operation) is completed.

It is desirable that at the time of recording, non-selected word lines $WL_{i-1}$ and $WL_{i+1}$, and non-selected bit lines $BL_{j-1}$ and $BL_{j+1}$, are all biased to the same electric potential.

Also, at the time of standby before recording, it is desirable that all of the word lines $WL_{i-1}$, $WL_i$, $WL_{i+1}$, and the bit lines $BL_{j-1}$, $BL_j$, $BL_{j+1}$ are pre-charged.

Also, current pulses for recording may be generated by setting a state in which electric potential of the word line $WL_i$ is relatively higher than that of the bit line $BL_j$.

Reproducing is performed by passing current pulses into the selected memory cell 33 surrounded by the dotted line A, and detecting the resistance values of the memory cell 33. It is assumed that each current pulse is set to a value small enough to not cause a resistance change of the memory cell 33.

For example, read currents (current pulses) generated by a readout circuit are passed from the bit line $BL_j$ to the memory cell 33 surrounded by the dotted line A, and the resistance value of the memory cell 33 is measured by the read circuit. If the above-described new material is employed, the ratio of resistance values between reset/set states may be secured to be $10^3$ or more.

Erasing (reset) operation is performed by Joule heating the selected memory cell 33 surrounded by the dotted line A with high current pulses and promoting the oxidation-reduction reaction in the memory cell 33.

(In the Case Where the Recording Layer Described Above Related to the Fourth Specific Example is Used)

Recording operation (set operation) is performed by applying a voltage to the selected memory cell 33 to generate a potential gradient in the memory cell 33 so as to pass current pulses. Thus, for example, the electric potential of the word line $WL_i$ is set relatively lower than that of the bit line $BL_j$. If the bit line $BL_j$ is at a fixed potential (for example, earth potential), a negative potential may be applied to the word line $WL_i$.

At this point, some of the A ions in the first compound layer 12A move to the vacant sites of the second compound layer 12B in the selected memory cell 33 surrounded by the dotted line A. Thus, in the second compound layer 12B, the A ions or the M2 ions have reduced valency, while in the first compound layer 12A, the A ions or the M1 ions have increased valency. Consequently, conductive carriers are generated in the crystal of the first compound layer 12A and the second compound layer 12B so that both compound layers have electrical conductivity.

Thus, set operation (recording) is completed.

It is desirable that at the time of recording, non-selected word lines $WL_{i-1}$ and $WL_{i+1}$, and non-selected bit lines $BL_{j-1}$ and $BL_{j+1}$, are all biased to the same electric potential.

Also, at the time of standby before recording, it is desirable that all of the word lines $WL_{i-1}$, $WL_i$, $WL_{i+1}$, and the bit lines $BL_{j-1}$, $BL_j$, $BL_{j+1}$ are pre-charged.

Current pulses may be generated by setting a state in which electric potential of the word line $WL_i$ is relatively higher than that of the bit line $BL_j$.

Reproducing operation is performed by passing current pulses into the selected memory cell 33 surrounded by the dotted line A, and detecting the resistance values of the memory cell 33. It is assumed that each current pulse is set to a value small enough not to cause a resistance change of the material used for the memory cell 33. For example, read currents (current pulses) generated by a readout circuit are passed from the bit line $BL_j$ to the memory cell 33 surrounded by the dotted line A, and the resistance value of the memory cell 33 is measured by the read circuit. If the above-described new material is employed, the ratio of resistance values between reset/set states may be secured to be $10^3$ or more.

For reset (erasing) operation, by utilizing the Joule heat generated by passing high current pulses to the selected memory cell 33 surrounded by the dotted line A as well as utilizing the residual heat, actions of the A ion elements returning from vacant sites in the second compound layer 12B into the first compound layer 12A should be promoted.

As described above, according to the semiconductor memory of the embodiment, higher recording density and lower power consumption than those of present-day hard disk or flash memory can be achieved.

By using the configurations of the embodiment for the electrode layers, the above-described characteristics are achieved. That is, recording of information is properly performed and reduction of the power consumption is achieved. Also, when the configurations of the eighth to eleventh specific examples are used for the electrode layers, movement of diffusion ion elements (the A ion elements) in the recording layer 12 is made easy, and stable operational characteristics are achieved.

(Probe Memory)

Next, the case where the device is applied to a probe memory is described.

Figure 33:
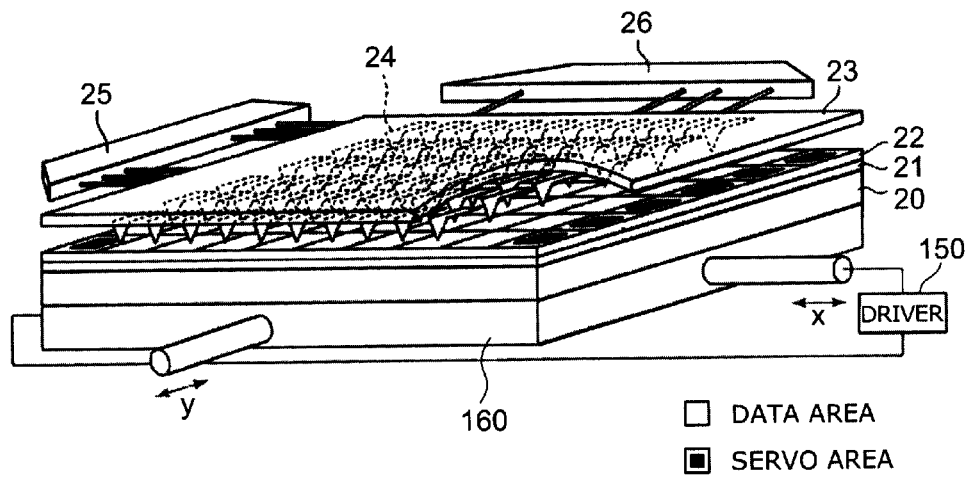
FIG. 33 and FIG. 34 are schematic views showing a probe memory according to the embodiment.
Figure 34:
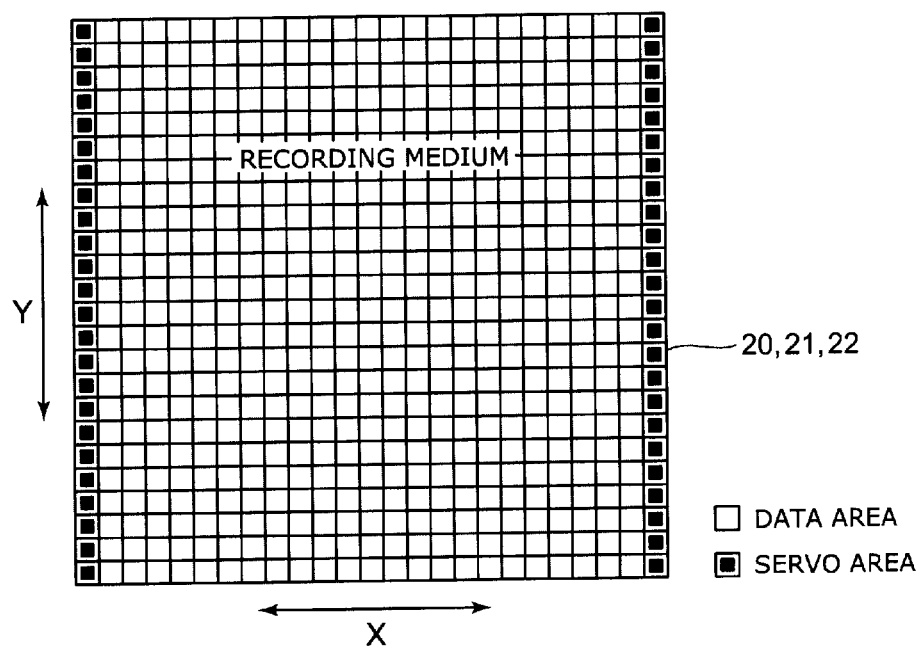

FIG. 33 and FIG. 34 are schematic views showing a probe memory according to the embodiment.

On an XY scanner 160, a recording medium provided with a recording portion of the embodiment is arranged. A probe array is arranged so as to be opposed to the recording medium.

The probe array includes a substrate 23, and multiple probes (heads) 24 arranged in an array form on one surface side of the substrate 23. Each of the multiple probes 24 is constituted by, for example, a cantilever, and is driven by multiplexer drivers 25 and 26.

The multiple probes 24 each may be operated individually by using a microactuator in the substrate 23; however, here, an example where access to data area of the recording medium is performed by operating all the microactuators in the same manner is described.

First, multiplexer drivers 25 and 26 are used to move all the probes 24 back and forth in the X direction with a constant cycle to read location information in the Y direction from a servo area of the recording medium. The location information in the Y direction is transferred to a driver 150.

The driver 150 drives the XY scanner 160 based on the location information to move the recording medium in the Y direction and performs positioning between the recording medium and each probe.

When the positioning is completed, data read or write is performed continuously and simultaneously to all of the probes 24 on the data area.

Data read and write are performed continuously because the probes 24 move back and forth in the X direction. Also, the data read and write are performed line-by-line for the data area by sequentially changing the location of the recording medium in the Y direction.

Alternatively, the recording medium may be moved back and forth in the X direction with a constant cycle to read location information from the recording medium, and the probes 24 may be moved in the Y direction.

The recording medium includes, for example, a substrate 20, an electrode layer 21 on the substrate 20, and a recording layer 22 on the electrode layer 21.

The recording layer 22 has multiple data areas, and servo areas placed on both ends of respective multiple data areas in the X direction. The multiple data areas occupy the main part of the recording layer 22.

A servo burst signal is recorded in the servo area. The servo burst signal indicates location information in the Y direction in each data area.

In addition to these pieces of information, an address area where address information is recorded, and a preamble area for synchronization are placed in the recording layer 22.

The data and the servo burst signal are recorded on the recording layer 22 as a recording bit (electrical resistance change). Information of "1", "0" for each recording bit is read by detecting electrical resistance of the recording layer 22.

In this example, one probe (head) is provided for one data area, and one probe is provided for one servo area.

The data area is formed with multiple tracks. A track of the data area is identified by an address signal read from the address area. The servo burst signal that is read from the servo area is for moving the probe 24 to the center of a track and for preventing errors in reading the recording bit.

Here, head position control technology for HDD may be utilized by associating the X and Y directions with down track and track directions, respectively.

Next, recording and reproducing operations of this probe memory are described.

Figure 35:
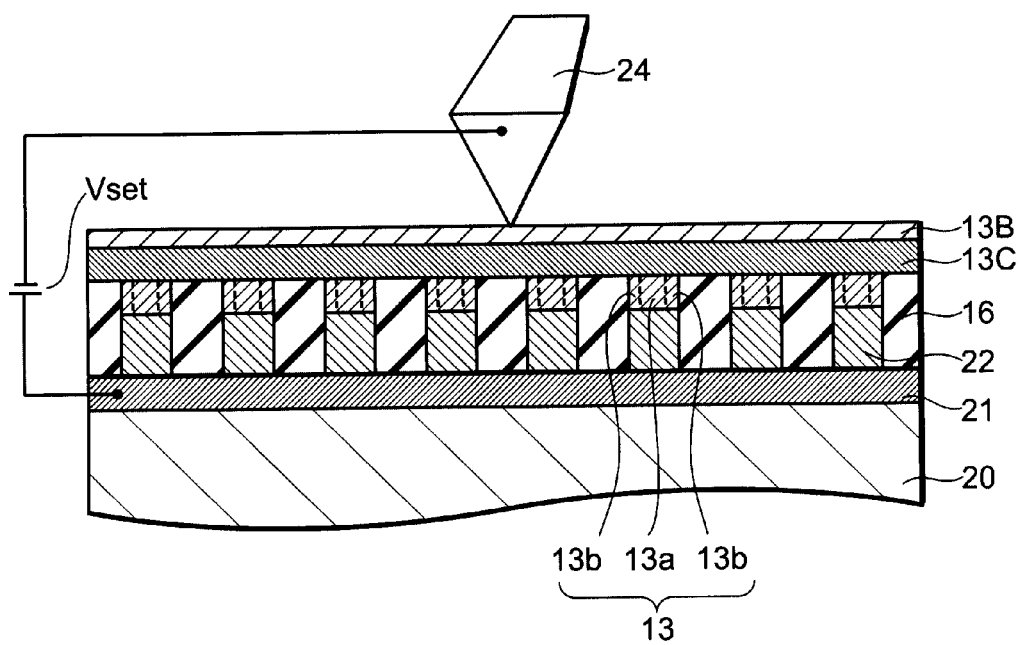
FIG. 35 is a conceptual diagram for describing a state at the time of recording (set operation)

FIG. 35 is a conceptual diagram for describing a state at the time of recording (set operation).

The recording medium includes an electrode layer 21 provided on a substrate (for example, semiconductor chip) 20, a recording layer 22 and an electrode layer 13 in multiple cell form provided on the electrode layer 21, an inter-element insulating layer 16 deposited between multiple cells, a contact electrode layer 13C provided on the electrode layer 13 and the inter-element insulating layer, and a protective layer 13B provided on the contact electrode layer 13C. The protective layer 13B is formed of, for example, thin insulator.

Here, the electrode layer 13 has a distribution of resistivity in its main surface. Here, the electrode layer 13 has the low resistivity portion 13a at an inner area within the main surface, and the high resistivity portion 13b at an outer area therewithin. By having such configuration, the electrode layer 13 establishes the function to constrict the electric current in the recording element, thus the characteristics of reduced power consumption is obtained. Also, when the configurations of the eighth to eleventh specific examples are used for the electrode layer 13, movement of diffusion ion elements (the A ion elements) in the recording layer 22 is made easy, and stable operational characteristics are achieved.

Recording operation is performed by applying a voltage to the recording layer 22 surface to generate a potential gradient in the recording layer 22. Specifically, current/voltage pulses may be applied to the recording layer 22.

Reproducing is performed by passing current pulses into the recording layer 22, and detecting the resistance values thereof. It is assumed that each current pulse is set to a value small enough not to cause a resistance change of the material used for the recording layer 22.

For example, read currents (current pulses) generated by sense amplifier S/A are passed from the probe 24 to the recording layer 22, and the resistance value of the recording layer 22 is measured by the sense amplifier S/A.

Also, in reproducing, continuous reproduction is made possible by scanning the recording medium by the probe 24.

Erasing (reset) operation is performed by Joule heating the recording layer 22 with high current pulses and promoting the oxidation-reduction reaction in the recording layer 22. Alternatively, pulses that give an electric potential difference in the reversed direction from that at the time of set operation may be applied.

Erasing operation may be performed for each cell of the recording layer 22, or for multiple cells of the recording layer 22.

According to the probe memory of the embodiment, higher recording density and lower power consumption than those of present-day hard disk or flash memory may be achieved.

(Flash Memory)

The embodiment may also be applied to a flash memory.

FIG. 36 is a schematic cross-sectional view showing a memory cell of the flash memory.

The memory cell of the flash memory is constituted by MIS (meta-insulator-semiconductor) transistors.

Diffusion layers 42 are formed on the surface area of a semiconductor substrate 41. A gate insulating layer 43 is formed on a channel region between the diffusion layers 42. On the gate insulating layer 43, a recording portion 44 (recording layer, and above and below electrode layers) of the embodiment is formed. A control gate electrode 45 is formed on the recording portion 44.

The semiconductor substrate 41 may be a well region, and the semiconductor substrate 41 and the diffusion layer 42 have conductivities that are opposite to each other. The control gate electrode 45 serves as a word line, and is composed of, for example, conductive polysilicon.

The operations are described with reference to FIG. 36.

Set (write) operation is performed by supplying an electric potential V1 to the control gate electrode 45, and supplying an electric potential V2 to the semiconductor substrate 41.

The difference between the electric potentials V1 and V2 is set large enough for the recording portion 44 to undergo a phase or resistance change; however, its direction is not specifically limited.

That is, either V1>V2 or V1<V2 may be applicable.

For example, suppose that the recording portion 44 is an insulator (i.e., the resistance is large) in an initial state (reset state), this state is equivalent to substantially thicker gate insulating layer 43, thus the threshold of the memory cell (MIS transistor) is increased.

Under this state, if electric potentials V1 and V2 are applied to change the recording portion 44 to electric conductor (i.e., the resistance is small), this state is equivalent to substantially thinner gate insulating layer 43, thus the threshold of the memory cell (MIS transistor) is decreased.

Although the electric potential V2 has been applied to the semiconductor substrate 41, alternatively, the electric potential V2 may be transferred from the diffusion layer 42 to the channel region of the memory cell.

Reset (erasing) operation is performed by supplying an electric potential V1' to the control gate electrode 45, supplying an electric potential V3 to one side of the diffusion layer 42, and supplying an electric potential V4 (<V3) to the other side of the diffusion layer 42.

The electric potential V1' is set to a value exceeding the threshold of the memory cell in set state.

At this point, the memory cell is turned ON, and electrons flow from the other side to the one side of the diffusion layer 42, while hot electrons are generated. Since the hot electrons are injected into the recording portion 44 through the gate insulating layer 43, the temperature of the recording portion 44 is increased.

Accordingly, the recording portion 44 changes from conductor (i.e., the resistance is small) to insulator (i.e., the resistance is large), and the resulting state is equivalent to substantially thicker gate insulating layer 43, thus the threshold of the memory cell (MIS transistor) is increased.

In this manner, the threshold of the memory cell may be changed by an operation similar to flash memory, thus the information recording and reproducing device according to the example of the embodiment may be put into practical use using the technology of flash memory.

(NAND Type Flash Memory)

Figure 37:
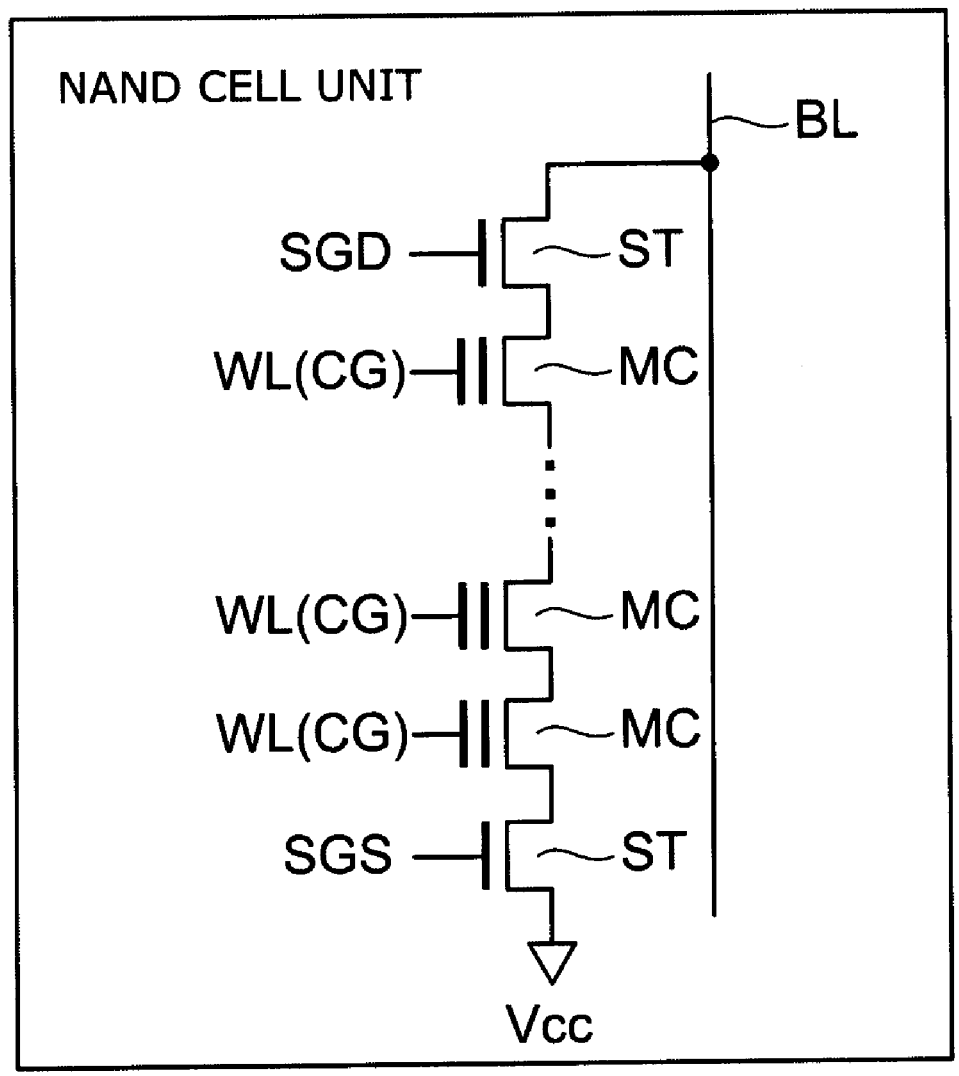
FIG. 37 is a circuit diagram of a NAND cell unit.

FIG. 37 is a circuit diagram of a NAND cell unit.

Figure 38:
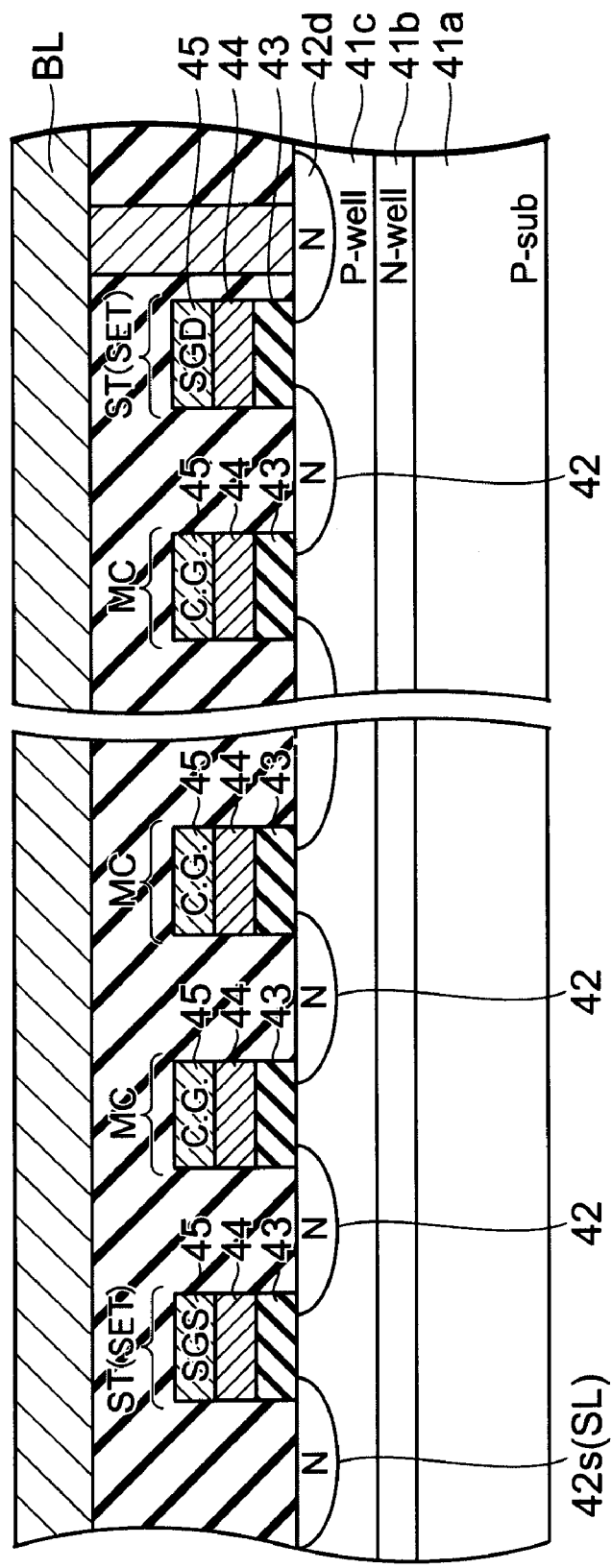
FIG. 38 is a schematic diagram showing a structure of a NAND cell unit according to the embodiment.

FIG. 38 is a schematic diagram showing a structure of a NAND cell unit according to the embodiment.

In a p-type semiconductor substrate 41a, an n-type well region 41b and a p-type well region 41c are formed. A NAND cell unit according to an example of the embodiment is formed in the p-type well region 41c.

The NAND cell unit is configured by a NAND string including multiple memory cells MC connected in series, and a total of two select gate transistors ST that are connected to respective ends of the NAND string.

The memory cell MC and the select gate transistor ST have the same structure. Specifically, these are configured by an n-type diffusion layer 42, a gate insulating layer 43 on a channel region between the n-type diffusion layers 42, a recording portion 44 (recording layer and above and below electrode layers) on the gate insulating layer 43, and a control gate electrode 45 on the recording portion 44.

A state (insulator/conductor) of the recording portion 44 of the memory cell MC may be changed by the above-described operations. However, the recording portion 44 of the select gate transistor ST is fixed to the set state, i.e., conductor (i.e., the resistance is small). One of the select gate transistors ST is connected to the source line SL, and the other one is connected to the bit line BL.

It is assumed that all the memory cells in the NAND cell unit are set to reset state (i.e., the resistance is large) before a set (write) operation.

Set (write) operation is performed from a memory cell MC on the source line SL to a memory cell on the bit line BL one by one sequentially.

V1 (positive potential) is applied as a write potential to a selected word line (control gate electrode) WL, and Vpass is applied to a non-selected word line WL as a transfer potential (electric potential to turn on the memory cell MC).

The select gate transistor ST on the source line SL is turned off, the select gate transistor ST on the bit line BL is turned on, and program data is transferred to the channel region of the memory cell MC selected from the bit line BL.

For example, when the program data is "1", write-protect electric potential (for example, electric potential of the same order as V1) is transferred to the channel region of the selected memory cell MC so that the resistance value of the recording portion 44 of the selected memory cell MC is not changed from a high state to a low state.

When the program data is "0", V2 (<V1) is transferred to the channel region of the selected memory cell MC so that the resistance value of the recording portion 44 of the selected memory cell MC is changed from a high state to a low state.

In reset (erasing) operation, V1' is applied to, for example, all of the word lines (control gate electrode) WL to turn on all the memory cells MC in the NAND cell unit. Also, two select gate transistors ST are turned on, V3 is applied to the bit line BL, and V4 (<V3) is applied to the source line SL.

At this point, since hot electrons are injected into the recording portion 44 of all the memory cells MC in the NAND cell unit, reset operation is performed for all the memory cells MC in the NAND cell unit in one process.

Read operation is performed by supplying read electric potential (positive potential) to a selected word line (control gate electrode) WL, and supplying an electric potential to a non-selected word line (control gate electrode) WL, the electrical potential being at a level capable of turning on the memory cell MC regardless of whether its data is "0" or "1."

Also, two select gate transistors ST are turned on, and read current is supplied to the NAND string.

When read electric potential is applied to the selected memory cell MC, the memory cell MC is turned on or off according to the value of data stored in the memory cell MC, thus, data may be read, for example, by detecting the change of read current.

Figure 39:
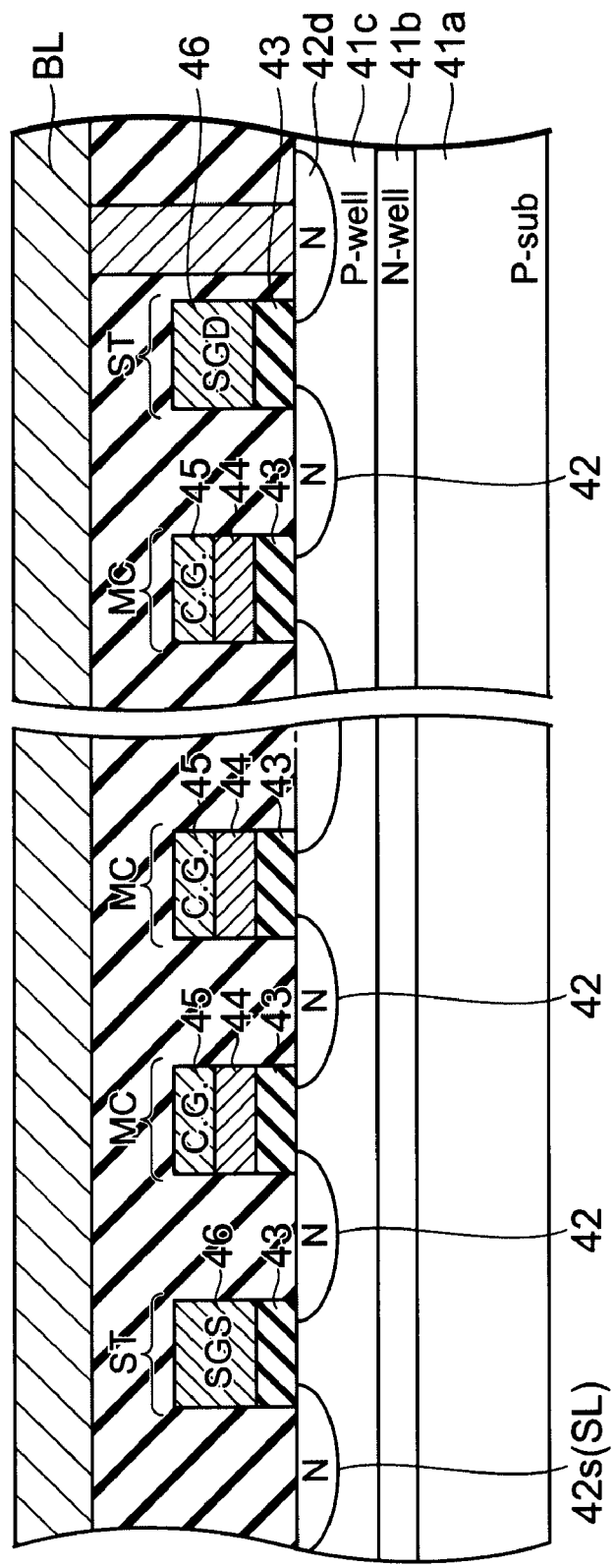
FIG. 39 is a schematic view showing a specific example based on a normal MIS transistor.

The structure shown in FIG. 38 indicates that the select gate transistor ST has the same structure as that of the memory cell MC; however, for example, as shown in FIG. 39, the select gate transistor ST may be made as normal MIS transistor without forming a recording portion.

Figure 40:
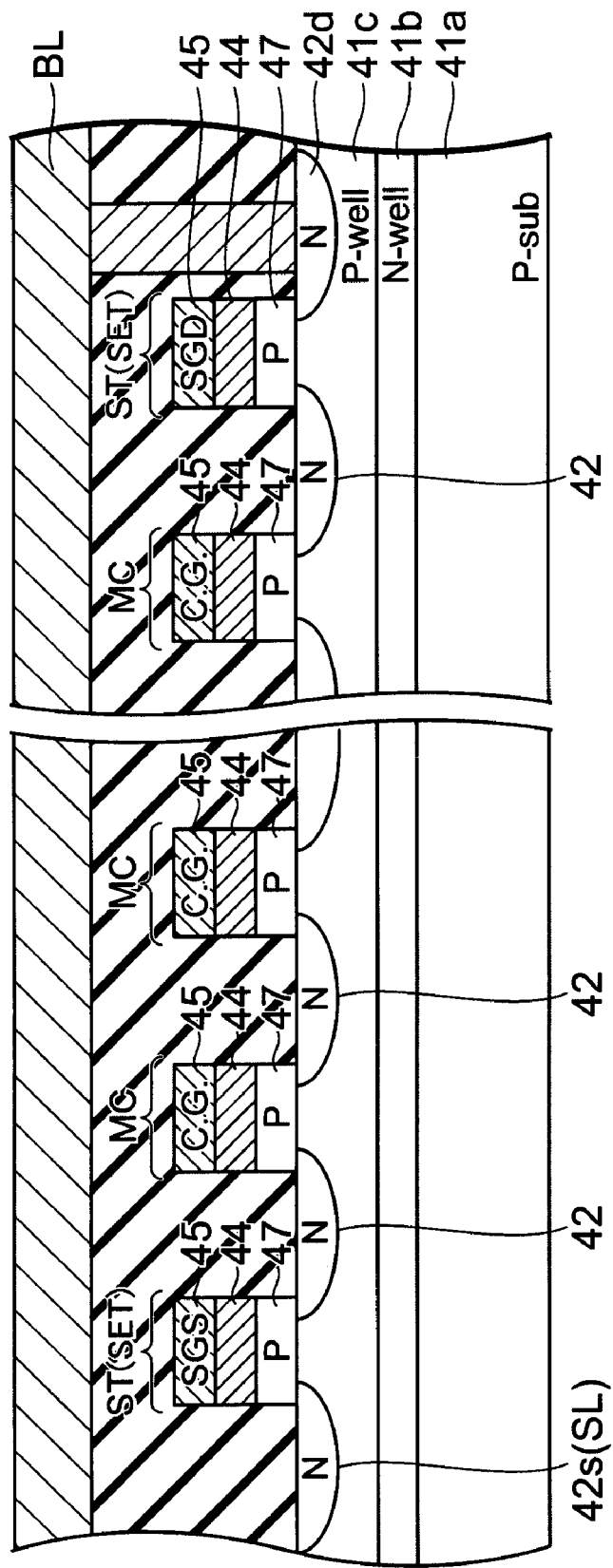
FIG. 40 is a schematic diagram showing a variation of the NAND type flash memory.

FIG. 40 is a schematic diagram showing a variation of the NAND type flash memory.

This modification has a structure in which each gate insulating layer of multiple memory cells MC included in the NAND string is replaced by a p-type semiconductor layer 47.

If the memory cells MC are highly integrated and form a fine-grained structure, the p-type semiconductor layer 47 is filled with a depletion layer in a state where no voltage is applied.

At the time of set (write), a positive write potential (for example, 3.5 V) is applied to the control gate electrode 45 of the selected memory cell MC, and a positive transfer potential (for example, 1 V) is applied to the control gate electrode 45 of a non-selected memory cell MC.

At this point, the surface of each p-type well region 41c of multiple memory cells MC in the NAND string is reversed from a p-type to an n-type to form a channel.

Here, as described above, if the select gate transistors ST on the bit line BL is turned on, and program data "O" is transferred to the channel region of the memory cell MC selected from the bit line BL, set operation can be performed.

For reset (erasure), for example, if a negative erase electric potential (for example, −3.5 V) is applied to all of the control gate electrodes 45, and earth potential (0 V) is applied to the p-type well regions 41c and the p-type semiconductor layers 47, reset operation may be performed for all the memory cells MC included in the NAND string in one process.

At the time of read, a positive read electric potential (for example, 0.5 V) is applied to the control gate electrode 45 of the selected memory cell MC, and a transfer potential (for example, 1 V) is applied to the control gate electrode 45 of a non-selected memory cell MC, the transfer potential being at a level capable of turning on the memory cell MC regardless of whether its data is "0" or "1."

It is assumed that the threshold voltage Vth "1" of the memory cell MC in "1" state is in the range of 0 V<Vth "1"<0.5 V, and the threshold voltage Vth "0" of the memory cell MC in "0" state is in the range of 0.5 V<Vth"1"<1 V.

Also, two select gate transistors ST are turned on, and the read current is supplied to the NAND string.

If such conditions are set, current amount flowing through the NAND string changes according to the value of data stored in the selected memory cell MC, thus data may be read by detecting this change.

In this modification, it is desirable that hole dope amount of the p-type semiconductor layer 47 is greater than that of the p-type well region 41c, and Fermi level of the p-type semiconductor layer 47 is deeper than that of the p-type well region 41c by approximately 0.5 V.

This is because when a positive electric potential is applied to the control gate electrode 45, conversion from p-type to n-type starts from the surface portion of the p-type well region 41c between the n-type diffusion layers 42 so that a channel may be formed.

In this manner, for example, at the time of writing, the channel of a non-selected memory cell MC is formed only at the interface between the p-type well region 41C and the p-type semiconductor layer 47, and at the time of reading, the channel of multiple memory cells MC in the NAND string is formed only at the interface between the p-type well region 41c and the p-type semiconductor layer 47.

That is, even if the recording portion 44 of the memory cell MC is a conductor (set state), the diffusion layer 42 and the control gate electrode 45 are not short-circuited.

(NOR Type Flash Memory)

Figure 41:
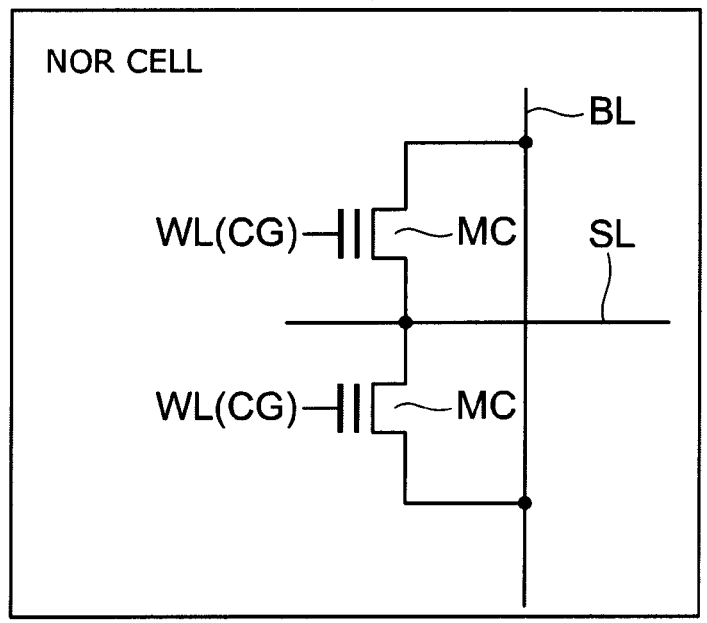
FIG. 41 is a circuit diagram of a NOR cell unit.

FIG. 41 is a circuit diagram of a NOR cell unit.

Figure 42:
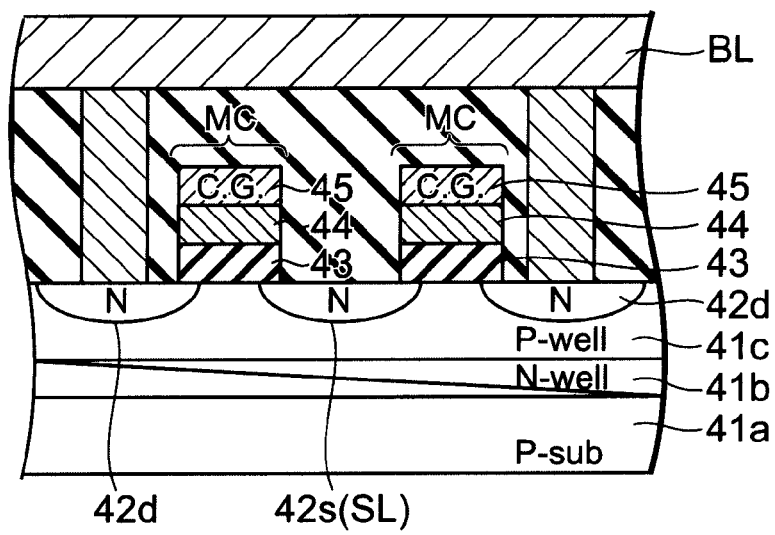
FIG. 42 is a schematic diagram showing the structure of a NOR cell unit according to the embodiment.

FIG. 42 is a schematic diagram showing the structure of a NOR cell unit according to an example of the embodiment.

An n-type well region 41b and a p-type well region 41c are formed in a p-type semiconductor substrate 41a. A NOR cell according to an example of the embodiment is formed in the p-type well region 41c.

The NOR cell is configured by one memory cell (MIS transistor) MC connected between the bit line BL and the source line SL.

The memory cell MC is configured by an n-type diffusion layer 42, a gate insulating layer 43 on a channel region between the n-type diffusion layers 42, a recording portion 44 (recording layer and above and below electrode layers) on the gate insulating layer 43, and a control gate electrode 45 on the recording portion 44. A state (insulator/conductor) of the recording portion 44 of the memory cell MC can be changed by the above-described operations.

(2 Transistor Type Flash Memory)

Figure 43:
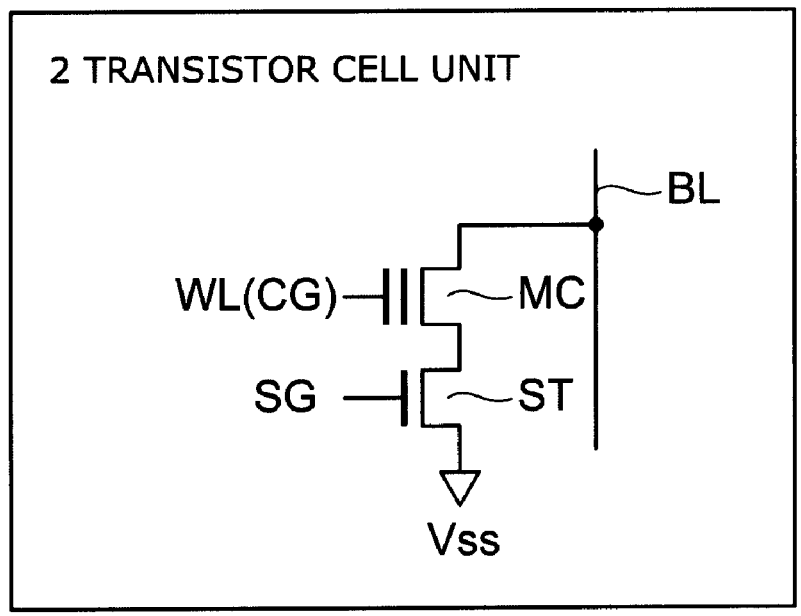
FIG. 43 is a circuit diagram of a 2 transistor type cell unit.

FIG. 43 is a circuit diagram of a 2 transistor type cell unit.

Figure 44:
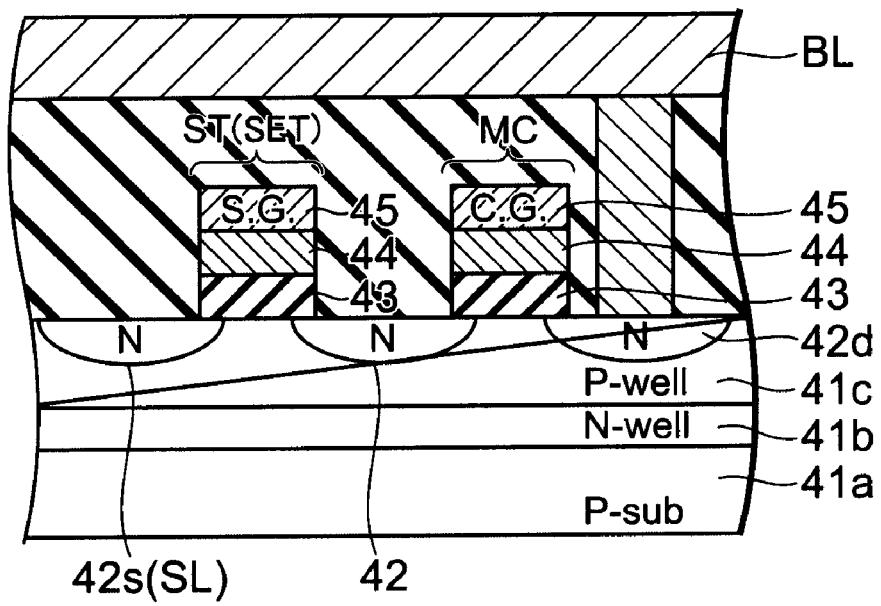
FIG. 44 is a schematic diagram showing the structure of a 2 transistor cell unit according to the embodiment.

FIG. 44 is a schematic diagram showing the structure of a 2 transistor type cell unit according to the embodiment.

The 2 transistor type cell unit has been developed recently as a new cellular structure having the characteristics of a NAND cell unit and a NOR cell.

In a p-type semiconductor substrate 41a, an n-type well region 41b and a p-type well region 41c are formed. The 2 transistor type cell unit according to the example of the embodiment is formed in the p-type well region 41c.

The 2 transistor type cell unit is configured by one memory cell MC and one select gate transistor ST connected in series.

The memory cell MC and the select gate transistor ST have the same structure. Specifically, these each include n-type diffusion layers 42, a gate insulating layer 43 on a channel region between the n-type diffusion layers 42, a recording portion 44 (recording layer and above and below electrode layers) on the gate insulating layer 43, and a control gate electrode 45 on the recording portion 44.

A state (insulator/conductor) of the recording portion 44 of the memory cell MC can be changed by the above-described operations. On the other hand, the recording portion 44 of the select gate transistor ST is fixed to the set state, i.e., conductor (i.e., the resistance is small).

The select gate transistors ST is connected to the source line SL, and the memory cell MC is connected to the bit line BL.

A state (insulator/conductor) of the recording portion 44 of the memory cell MC may be changed by the above-described operations.

Figure 45:
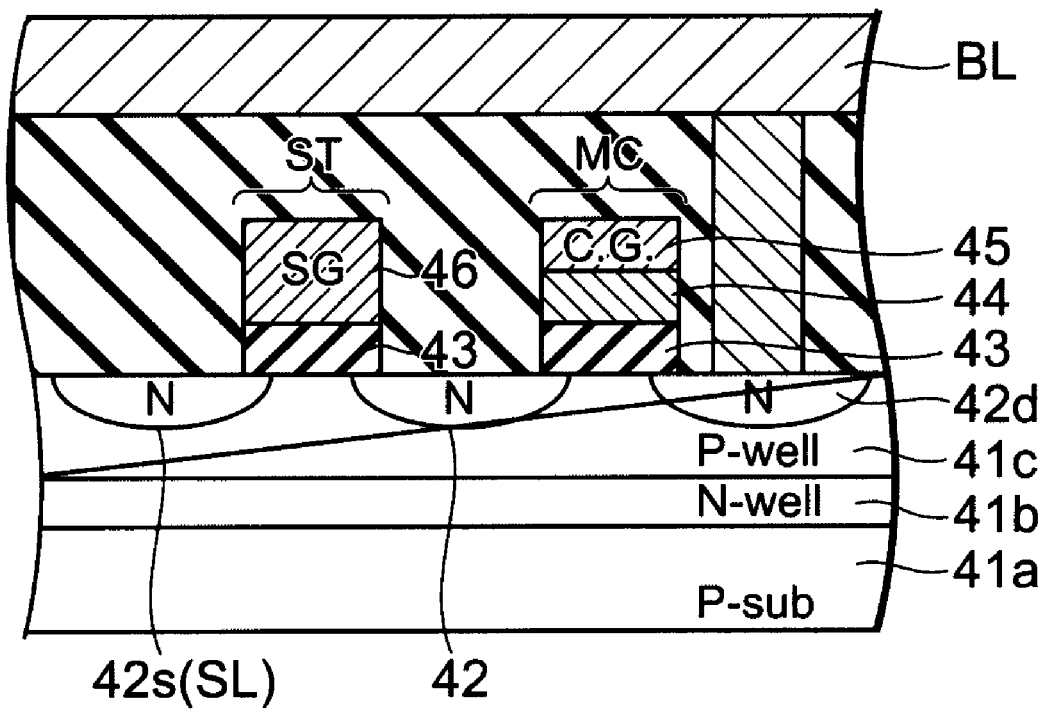
FIG. 45 is a schematic view showing an example based on a normal MIS transistor.

The structure shown in FIG. 44 indicates that the select gate transistor ST has the same structure as that of the memory cell MC; however, for example, as shown in FIG. 45, the select gate transistor ST may be made as normal MIS transistor without forming a recording portion.

In addition to the above, the materials and operations proposed by the embodiment may be applied to present-day recording media such as a hard disk or a flash memory.

By using the configurations of the embodiment for an electrode layer, reduction of the power consumption is achieved. Also, when the configurations of the eighth to eleventh specific examples are used for the electrode layer, movement of diffusion ion elements (the A ion elements) in the recording layer 12 is made easy, and stable operational characteristics are achieved.

As described above, according to the information recording and reproducing device of the embodiment, reduction of power consumption is achieved by using the configurations of the embodiment for the electrode layer. Also, recording of information is properly performed by selecting a layer having a distribution of resistivity as needed. In addition, when the configurations of the eighth to eleventh specific examples are used for the electrode layer, movement of diffusion ion elements (the A ion elements) in the recording layer 12 is made easy, and stable operational characteristics are achieved.

The examples of the embodiments are not limited to the above-described embodiments, and each component may be modified for implementation in the range without departing from the spirit of the invention. Also, in the examples of the embodiment, set and reset have been defined as an initial state immediately after film formation; however, the definition of set and reset is arbitral and is not limited to the example of the embodiment. Furthermore, by an appropriate combination of multiple components disclosed in the above-described embodiments, various inventions may be configured. For example, some components may be deleted from all the components disclosed by above-described embodiments, or components of different embodiments may be combined as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. An information recording and reproducing device comprising:
   a first layer;
   a second layer; and
   a recording layer provided between the first layer and the second layer, the recording layer being capable of reversibly transitioning between a first state and a second state with a resistance higher than a resistance in the first state by a current supplied to the recording layer via the first layer and the second layer,
   one of the first layer and the second layer including a resistivity distribution layer provided within a perpendicular plane perpendicular to a stacking direction of the first layer, the second layer, and the recording layer,
   the resistivity distribution layer including a low resistivity portion and a high resistivity portion, a resistivity of the high resistivity portion being higher than a resistivity of the low resistivity portion,
   the low resistivity portion containing a transition element identical to a transition element contained in the high resistivity portion.

2. The device according to claim 1, wherein
   the first state is a substantially crystalline state, and
   the second state is a substantially amorphous state.

3. The device according to claim 1, further comprising a rectifying element,
   the first layer or the second layer being provided between the rectifying element and the recording layer.

4. The device according to claim 3, wherein the resistivity distribution layer is not provided between the rectifying element and the recording layer.

5. The device according to claim 1, wherein the high resistivity portion is provided outside the low resistivity portion within the perpendicular plane.

6. The device according to claim 1, wherein the high resistivity portion contains an oxide.

7. The device according to claim 1, wherein the low resistivity portion contains TiN.

8. The device according to claim 1, wherein the high resistivity portion includes an oxynitride of Ti.

9. The device according to claim 1, wherein part of the first layer and the second layer, the part being not the resistivity distribution layer, is made of any material selected from the group consisting of: nitrides of Ta, Al, Ti, Zr, Hf or V; carbides of Ta, Al, Ti, Zr, Hf or V; oxides of Ir or Ru; Ru; Au; Pd; and Pt.

10. The device according to claim 9, wherein the part is made of any material selected from the group consisting of TaN, TaC, TiAlN, and TaAlN.

11. The device according to claim 10, wherein the part is made of any material selected from the group consisting of TaN and TaC.

12. The device according to claim 1, wherein the resistivity distribution layer includes an oxide at an interface with the recording layer.

13. The device according to claim 1, wherein the recording layer includes a first compound layer containing a first compound,
   the first compound being one of: a composite compound having at least two types of cation elements; and a compound having a cation element of an identical cation element capable of having one of at least two different valences,
   at least one of the cation elements included in the composite compound and the cation element included in the compound being transition elements having a d-orbital incompletely filled with electrons, a shortest distance between the adjacent cation elements being 0.32 nm or less.

14. The device according to claim 13, wherein the first compound has one of structures of a spinel structure expressed by $A_xM_yX_4$ ($0.1 \leq x \leq 2.2$, $1.5 \leq y \leq 2$), a delafossite structure expressed by $A_xM_yX_2$ ($0.1 \leq x \leq 1.1$, $0.9 \leq y \leq 1.1$), a wolframite structure expressed by $A_xM_yX_4$ ($0.5 \leq x \leq 1.1$, $0.7 \leq y \leq 1.1$), and an ilmenite structure expressed by $A_xM_yX_3$ ($0.5 \leq X \leq 1.1$, $0.9 \leq y \leq 1$).

15. The device according to claim 13, wherein the recording layer further includes a second compound layer being in contact with the first compound layer, and
the second compound layer has a vacant site capable of storing the cation.

16. An information recording and reproducing device comprising:
a first information recording and reproducing section; and
a second information recording and reproducing section being stacked with the first information recording and reproducing section,
the first information recording and reproducing section including a first stacked body,
the first stacked body including:
a first layer;
a second layer; and
a first recording layer,
the first layer, the second layer, and the first recording layer being stacked in a stacking direction from the first information recording and reproducing section to the second information recording and reproducing section,
the first recording layer being provided between the first layer and the second layer, the first recording layer being capable of reversibly transitioning between a first state and a second state with a resistance higher than a resistance in the first state by a current supplied to the first recording layer via the first layer and the second layer,
one of the first layer and the second layer including a first resistivity distribution layer provided within a plane perpendicular to the stacking direction, the first resistivity distribution layer including a first low resistivity portion and a first high resistivity portion, a resistivity of the first high resistivity portion being higher than a resistivity of the first low resistivity portion,
the first low resistivity portion containing a transition element identical to a transition element contained in the first high resistivity portion,
the second information recording and reproducing section including a second stacked body,
the second stacked body including:
a third layer;
a fourth layer; and
a second recording layer,
the third layer, the fourth layer, and the second recording layer being stacked in the stacking direction,
the second recording layer being provided between the third layer and the fourth layer, the second recording layer being capable of reversibly transitioning between a third state and a fourth state with a resistance higher than a resistance in the third state by a current supplied to the second recording layer via the third layer and the fourth layer,
one of the third layer and the fourth layer including a second resistivity distribution layer provided within a plane perpendicular to the stacking direction, the second resistivity distribution layer including a second low resistivity portion and a second high resistivity portion, a resistivity of the second high resistivity portion being higher than a resistivity of the second low resistivity portion, and the second low resistivity portion containing a transition element identical to a transition element contained in the second high resistivity portion.

17. The device according to claim 16, wherein
a stacking order of the first layer, the first recording layer, and the second layer in the first stacked body is identical to a stacking order of the third layer, the second recording layer, and the fourth layer in the second stacked body, the first layer includes the first resistivity distribution layer and the third layer includes the second resistivity distribution layer.

18. The device according to claim 16, wherein
a stacking order of the first layer, the first recording layer, and the second layer in the first stacked body is opposite to a stacking order of the third layer, the second recording layer, and the fourth layer in the second stacked body and the first layer includes the first resistivity distribution layer and the third layer includes the second resistivity distribution layer.

19. The device according to claim 16, further comprising:
a first interconnection;
a second interconnection extending in a direction intersecting with an extending direction of the first interconnection; and
a third interconnection extending in a direction intersecting with the extending direction of the second interconnection,
the first stacked body being provided between the first interconnection and the second interconnection at a portion where the first interconnection intersects with the second interconnection and being supplied with the current to be supplied to the first recording layer via the first interconnection and the second interconnection, and
the second stacked body being provided between the second interconnection and the third interconnection at a portion where the second interconnection intersects with the third interconnection intersect, and being supplied with the current to be supplied to the second recording layer via the second interconnection and the third interconnection.

20. The device according to claim 16, further comprising:
a first interconnection;
a second interconnection extending in a direction intersecting with an extending direction of the first interconnection;
a third interconnection; and
a fourth interconnection extending in a direction intersecting with an extending direction of the third interconnection,
the first stacked body being provided between the first interconnection and the second interconnection at a portion where the first interconnection intersects with the second interconnection, and being supplied with the current to be supplied to the first recording layer via the first interconnection and the second interconnection, and
the second stacked body being provided between the third interconnection and the fourth interconnection at a portion where the third interconnection intersects with the fourth interconnection, and being supplied with the current to be supplied to the second recording layer via the third interconnection and the fourth interconnection.

* * * * *